United States Patent
Yukawa et al.

(10) Patent No.: US 8,421,061 B2
(45) Date of Patent: Apr. 16, 2013

(54) MEMORY ELEMENT AND SEMICONDUCTOR DEVICE INCLUDING THE MEMORY ELEMENT

(75) Inventors: Mikio Yukawa, Atsugi (JP); Nozomu Sugisawa, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 721 days.

(21) Appl. No.: 11/713,751

(22) Filed: Mar. 5, 2007

(65) Prior Publication Data

US 2008/0017849 A1 Jan. 24, 2008

(30) Foreign Application Priority Data

Mar. 10, 2006 (JP) ................. 2006-066527

(51) Int. Cl.
*H01L 29/08* (2006.01)
*H01L 51/00* (2006.01)
(52) U.S. Cl.
USPC .......... 257/40; 257/59; 257/72; 257/E51.011; 257/E27.008
(58) Field of Classification Search ............ 257/40, 257/59, 72, E27.008, E51.001–E51.003, 257/E51.011
See application file for complete search history.

(56) References Cited

U.S. PATENT DOCUMENTS

| | | | |
|---|---|---|---|
| 3,833,894 A | 9/1974 | Aviram et al. | |
| 4,972,370 A | 11/1990 | Morimoto et al. | |
| 5,375,250 A | 12/1994 | Van Den Heuvel | |
| 5,853,905 A | 12/1998 | So et al. | |
| 6,055,180 A | 4/2000 | Gudesen et al. | |
| 6,218,677 B1 | 4/2001 | Broekaert | |
| 6,465,828 B2 | 10/2002 | Agarwal | |
| 6,552,409 B2 | 4/2003 | Taussig et al. | |
| 6,683,802 B2 | 1/2004 | Katoh | |
| 6,806,526 B2 | 10/2004 | Krieger et al. | |

(Continued)

FOREIGN PATENT DOCUMENTS

| | | |
|---|---|---|
| CA | 2 515 614 | 8/2004 |
| CN | 1481034 | 3/2004 |

(Continued)

OTHER PUBLICATIONS

International Search Report (Application No. PCT/JP2007/054485) Dated Apr. 24, 2007.

(Continued)

*Primary Examiner* — Allison P Bernstein
(74) *Attorney, Agent, or Firm* — Eric J. Robinson; Robinson Intellectual Property Law Office, P.C.

(57) ABSTRACT

It is an object of the present invention to reduce variations in behavior of each memory element. In addition, it is another object of the present invention to obtain a semiconductor device, on which the memory element is mounted, which is superior in terms of performance and reliability. A memory element of the present invention includes in its structure a first conductive layer; a semiconductor layer; an organic compound layer; and a second conductive layer, where the semiconductor layer and the organic compound layer are interposed between the first conductive layer and the second conductive layer, and the semiconductor layer is formed to be in contact with the first conductive layer and/or the second conductive layer. With such a structure, variations in behavior of each memory element are reduced.

23 Claims, 30 Drawing Sheets

U.S. PATENT DOCUMENTS

| | | | |
|---|---|---|---|
| 6,815,286 B2 | 11/2004 | Krieger et al. | |
| 6,870,183 B2 | 3/2005 | Tripsas et al. | |
| 6,947,321 B2 | 9/2005 | Tanabe | |
| 6,950,331 B2 | 9/2005 | Yang et al. | |
| 6,977,389 B2 | 12/2005 | Tripsas et al. | |
| 6,979,837 B2 | 12/2005 | Tripsas et al. | |
| 6,992,323 B2 | 1/2006 | Krienger et al. | |
| 7,050,326 B2 | 5/2006 | Anthony | |
| 7,075,105 B2 | 7/2006 | Kano | |
| 7,170,779 B2 | 1/2007 | Miyawaki et al. | |
| 7,205,716 B2 | 4/2007 | Yamazaki et al. | |
| 7,220,985 B2 | 5/2007 | Cheung et al. | |
| 7,264,979 B2 | 9/2007 | Yamagata et al. | |
| 7,282,380 B2 | 10/2007 | Maruyama et al. | |
| 7,359,230 B2 | 4/2008 | Sumida et al. | |
| 7,405,167 B2 | 7/2008 | Kang et al. | |
| 7,465,956 B1 | 12/2008 | Tripsas et al. | |
| 7,485,478 B2 | 2/2009 | Yamagata et al. | |
| 7,499,305 B2 | 3/2009 | Nomura et al. | |
| 7,541,734 B2 | 6/2009 | Yamazaki et al. | |
| 7,544,966 B2* | 6/2009 | Yang et al. | 257/40 |
| 7,554,260 B2 | 6/2009 | Sakakura et al. | |
| 7,630,233 B2 | 12/2009 | Kato et al. | |
| 7,713,800 B2 | 5/2010 | Kusumoto et al. | |
| 7,791,066 B2 | 9/2010 | Yamazaki | |
| 7,825,419 B2 | 11/2010 | Yamagata et al. | |
| 7,919,772 B2 | 4/2011 | Furukawa et al. | |
| 7,956,352 B2 | 6/2011 | Yukawa et al. | |
| 8,045,369 B2 | 10/2011 | Kato et al. | |
| 2002/0021479 A1 | 2/2002 | Scalora et al. | |
| 2002/0056864 A1 | 5/2002 | Agarwal | |
| 2002/0157702 A1 | 10/2002 | Cordaro | |
| 2002/0196657 A1 | 12/2002 | Katoh | |
| 2003/0010376 A1 | 1/2003 | Yamaguchi et al. | |
| 2003/0053350 A1 | 3/2003 | Krieger et al. | |
| 2003/0137325 A1* | 7/2003 | Yamazaki et al. | 327/80 |
| 2003/0155602 A1 | 8/2003 | Krieger et al. | |
| 2003/0186040 A1 | 10/2003 | Oya | |
| 2004/0027849 A1 | 2/2004 | Yang et al. | |
| 2004/0057323 A1 | 3/2004 | Tanabe | |
| 2004/0084670 A1 | 5/2004 | Tripsas et al. | |
| 2004/0089891 A1 | 5/2004 | Anma et al. | |
| 2004/0108501 A1 | 6/2004 | Cheung et al. | |
| 2004/0160801 A1* | 8/2004 | Krieger et al. | 365/151 |
| 2004/0164302 A1 | 8/2004 | Arai et al. | |
| 2004/0217347 A1 | 11/2004 | Tripsas et al. | |
| 2004/0239597 A1 | 12/2004 | Tanabe | |
| 2004/0246768 A1 | 12/2004 | Kreiger et al. | |
| 2004/0246770 A1 | 12/2004 | Kano | |
| 2005/0008052 A1 | 1/2005 | Nomura et al. | |
| 2005/0019976 A1* | 1/2005 | Xiao et al. | 438/99 |
| 2005/0130389 A1 | 6/2005 | Yamazaki et al. | |
| 2005/0167767 A1 | 8/2005 | Akasaka | |
| 2005/0174875 A1 | 8/2005 | Katoh | |
| 2005/0214984 A1 | 9/2005 | Maruyama et al. | |
| 2005/0227389 A1* | 10/2005 | Bhattacharya et al. | 438/22 |
| 2005/0249975 A1* | 11/2005 | Sandberg et al. | 428/690 |
| 2005/0274943 A1 | 12/2005 | Chen | |
| 2006/0028895 A1 | 2/2006 | Taussig et al. | |
| 2006/0082289 A1 | 4/2006 | Yeh et al. | |
| 2006/0214008 A1 | 9/2006 | Asami et al. | |
| 2006/0263634 A1* | 11/2006 | Yamazaki | 428/690 |
| 2006/0267068 A1 | 11/2006 | Sato et al. | |
| 2007/0001581 A1* | 1/2007 | Stasiak et al. | 313/498 |
| 2007/0051940 A1 | 3/2007 | Clemens et al. | |
| 2007/0164671 A1 | 7/2007 | Yamazaki et al. | |
| 2007/0194301 A1 | 8/2007 | Sezi et al. | |
| 2007/0230235 A1 | 10/2007 | Abe et al. | |
| 2008/0001143 A1 | 1/2008 | Nomura et al. | |
| 2008/0023696 A1 | 1/2008 | Yukawa et al. | |
| 2008/0042128 A1* | 2/2008 | Furukawa et al. | 257/40 |
| 2008/0048180 A1 | 2/2008 | Abe et al. | |
| 2008/0210932 A1 | 9/2008 | Yukawa et al. | |
| 2009/0065769 A1 | 3/2009 | Yukawa et al. | |
| 2009/0081824 A1 | 3/2009 | Tripsas et al. | |
| 2009/0140231 A1 | 6/2009 | Yukawa et al. | |
| 2009/0206726 A1 | 8/2009 | Yamazaki et al. | |
| 2010/0124796 A1 | 5/2010 | Yamazaki et al. | |
| 2011/0024787 A1 | 2/2011 | Yamagata et al. | |
| 2011/0210412 A1 | 9/2011 | Yukawa et al. | |

FOREIGN PATENT DOCUMENTS

| | | |
|---|---|---|
| CN | 1604696 | 4/2005 |
| CN | 1716650 | 1/2006 |
| CN | 1719311 | 1/2006 |
| EP | 1265286 A | 12/2002 |
| EP | 1 381 054 | 1/2004 |
| EP | 1 434 232 | 6/2004 |
| JP | 62-259478 A | 11/1987 |
| JP | 63-266063 A | 11/1988 |
| JP | 04-177769 A | 6/1992 |
| JP | 11-307261 A | 11/1999 |
| JP | 2000-030870 A | 1/2000 |
| JP | 2000-113152 A | 4/2000 |
| JP | 2001-101368 A | 4/2001 |
| JP | 2002-026277 | 1/2002 |
| JP | 2002-110999 A | 4/2002 |
| JP | 2003-007977 A | 1/2003 |
| JP | 2004-047791 A | 2/2004 |
| JP | 2004-095850 | 3/2004 |
| JP | 2004-513513 | 4/2004 |
| JP | 2004-200569 | 7/2004 |
| JP | 2004-304180 A | 10/2004 |
| JP | 2005-183619 A | 7/2005 |
| JP | 2005-228804 A | 8/2005 |
| JP | 2005-311336 | 11/2005 |
| JP | 2005-317955 A | 11/2005 |
| JP | 2006-186363 A | 7/2006 |
| WO | WO-98/58383 | 12/1998 |
| WO | WO 02-37500 | 5/2002 |
| WO | WO-2005/060001 | 6/2005 |
| WO | WO-2005/096380 | 10/2005 |
| WO | WO 2006/043573 | 4/2006 |
| WO | WO-2006/059746 | 6/2006 |
| WO | WO-2006/064859 | 6/2006 |
| WO | WO 2006/101241 | 9/2006 |
| WO | WO-2007/105575 | 9/2007 |

OTHER PUBLICATIONS

Written Opinion (Application No. PCT/JP2007/054485) Dated Apr. 24, 2007.

Office Action (Application No. 200780008401.X) Dated Aug. 21, 2009.

Mattis,B et al., "A field-programmable antifuse memory for RFID on plastic,", Device Research Conference, Jun. 28, 2006, pp. 215-216.

Okabayashi.Y et al., "Negative giant surface potential of peeled $Alq_3$ thin film,", Thin Solid Films, 2009, vol. 518, pp. 839-841.

Chinese Office Action (Application No. 200780008401.X) Dated Aug. 4, 2010.

Ma.L et al., "Organic Nonvolatile Memory by Controlling the Dynamic Copper-Ion Concentration Within Organic Layer,", Appl. Phys. Lett. (Applied Physics Letters), Jun. 14, 2004, vol. 84, No. 24, pp. 4908-4910.

* cited by examiner

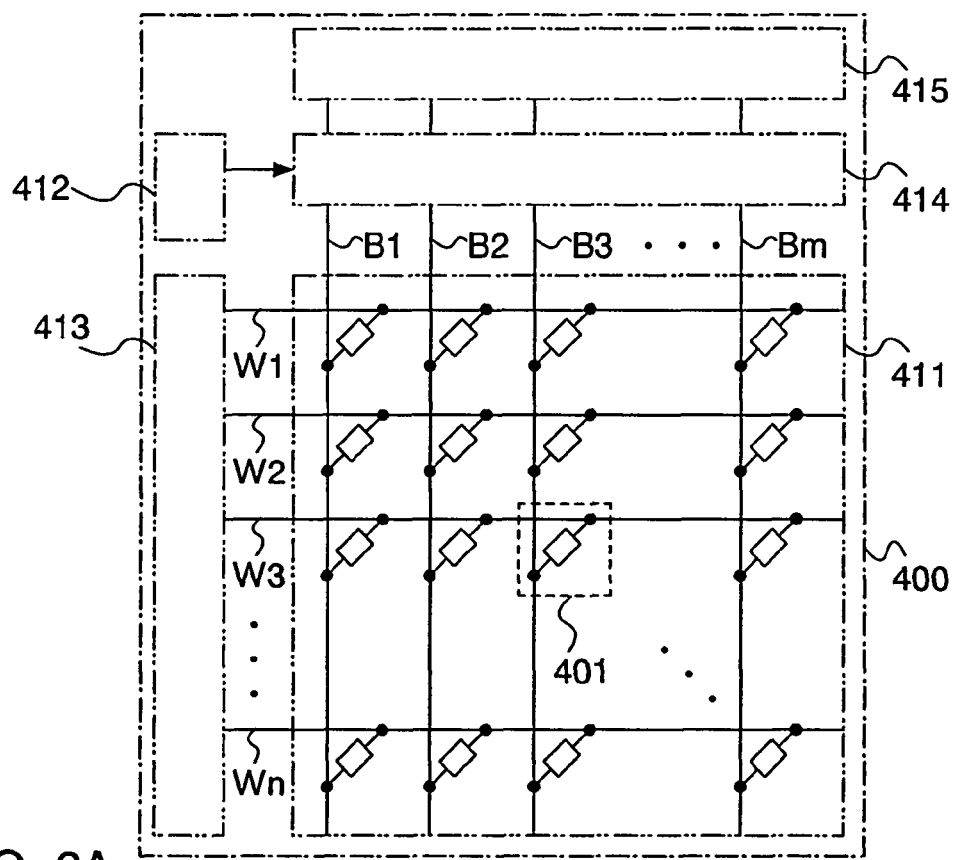
FIG. 6A
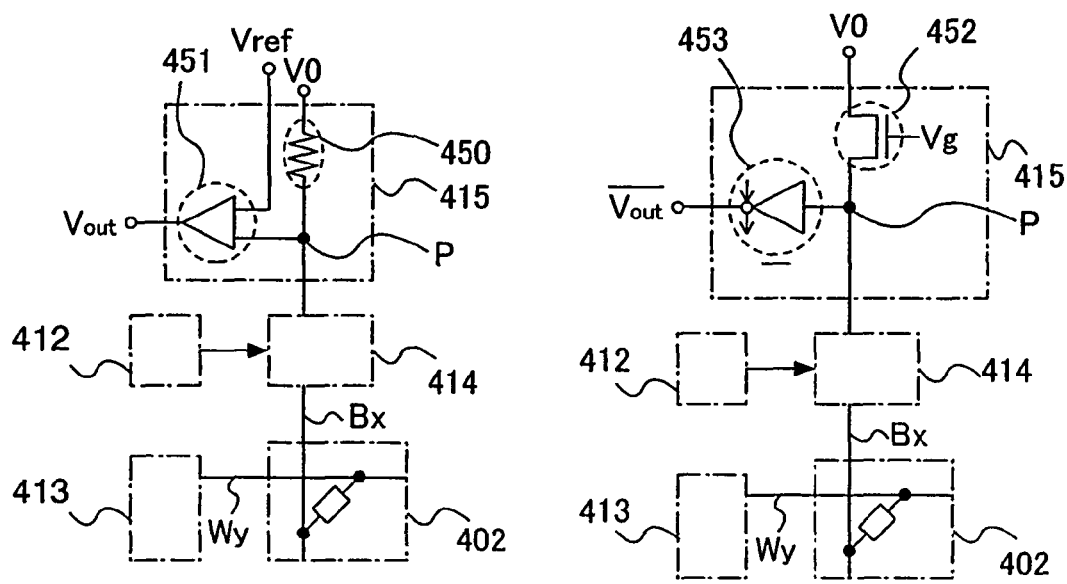
FIG. 6B
FIG. 6C

MEMORY ELEMENT AND SEMICONDUCTOR DEVICE INCLUDING THE MEMORY ELEMENT

TECHNICAL FIELD

The present invention relates to a memory element and a semiconductor device having the memory element.

BACKGROUND ART

In recent years, a semiconductor device having various functions, in which a plurality of circuits is integrated over an insulating surface, has been developed. In addition, a semiconductor device which can perform wireless transmission and reception of data by an antenna being provided has been developed. Such a semiconductor device is referred to as a wireless chip (also referred to as an ID tag, an IC tag, an IC chip, a RF (Radio Frequency) tag, a wireless tag, an electronic tag, or a RFID (Radio Frequency Identification)) tag, and has already brought in part of the market.

Many of these semiconductor devices that have already been put into practical use have a circuit (also referred to as an IC (integrated circuit) chip) using a semiconductor substrate such as silicon and an antenna, and the IC chip includes a memory circuit (also referred to as a memory), a control circuit, and the like. In particular, it is possible to provide a semiconductor device with high added value providing higher performance by being provided with a memory circuit which can store much data. In addition, such semiconductor devices are required to be manufactured at low cost. In recent years, an organic thin film transistor (hereinafter, also referred to as an "organic TFT"), an organic memory, and the like using organic compounds for a control circuit, a memory circuit, and the like have been actively developed (for example, see Patent Document 1: Japanese Published Patent Application No. 2002-26277).

DISCLOSURE OF INVENTION

As for a memory element serving as a memory portion of an organic memory, an organic compound layer is provided between a pair of electrodes. As the memory element is actually manufactured and operated, in some cases, abnormal behavior is shown or each element has variations in writing behavior (current-voltage characteristics or the like) even in a case of a memory element having the same structure. For example, FIGS. 1A and 1B each show current-voltage characteristics of a memory element where a first conductive layer, an organic compound layer, and a second conductive layer are sequentially stacked. Note that titanium of 100 nm thick, 4,4'-bis[N-(1-naphthyl)-N-phenylamino]biphenyl (abbreviation: NPB) of 8 nm thick, and aluminum of 200 nm thick are used for the first conductive layer, the organic compound layer, and the second conductive layer, respectively. FIG. 1A shows current-voltage characteristics of a memory element sized 20 μm×20 μm (hereinafter, referred to as 20 square μm) and FIG. 1B shows current-voltage characteristics of a memory element sized 10 μm×10 μm (10 square μm). It is assumed that each sample number n is 2, and as a method for applying a voltage, a sweep method for continuously changing an applied voltage is employed. Note that, here, the measurement limit of the amount of current is set to 100 mA.

In the memory element shown in FIG. 1A, the amount of current rapidly increases when a voltage is around approximately 7 V. The amount of current should be a predetermined amount of 100 mA when short circuit occurs completely between electrodes; however, the amount of current when a voltage is greater than or equal to 7 V is less than or equal to 100 mA. In other words, it can be said that complete writing is not performed. On the other hand, in the memory element shown in FIG. 1B, the measurement results of two samples differ widely. In one memory element, the amount of current is changed widely at a voltage of approximately 2 V, which reaches the predetermined amount of 100 mA which is the measurement limit. In other words, short circuit occurs between electrodes at approximately 2 V. However, in the other memory element, the amount of current is changed widely at a voltage of approximately 8 V, which does not reach the predetermined amount of 100 mA. Therefore, reliability of these elements gets poor to be used as the memory element.

In addition, when the memory element is used for a memory device or the like, a plurality of memory elements are mounted in many cases. In such a case, when the memory elements vary in each element, it is necessary to adjust a voltage of a memory element to a voltage of the memory element, which requires the highest writing voltage in performing a writing operation; thus, the power consumption is increased. Further, when the behavior differs in each element, a highly reliable memory device cannot be obtained.

In view of the above problem, it is an object of the present invention to reduce variations in behavior of each memory element. In addition, it is another object of the present invention to obtain a memory device superior in terms of performance and reliability and a semiconductor device provided with the memory device.

According to one feature of the present invention, a memory element includes a first conductive layer; a semiconductor layer; an organic compound layer; and a second conductive layer. The semiconductor layer and the organic compound layer are interposed between the first conductive layer and the second conductive layer, and the semiconductor layer is formed to be in contact with the first conductive layer or the second conductive layer.

According to another feature of the present invention, a memory element includes a first conductive layer; a first semiconductor layer; an organic compound layer; a second semiconductor layer; and a second conductive layer. The first semiconductor layer, the second semiconductor layer, and the organic compound layer are interposed between the first conductive layer and the second conductive layer, and the first semiconductor layer and the second semiconductor layer are each formed to be in contact with the first conductive layer and the second conductive layer.

In the above structures, the semiconductor layer may also be discontinuous layer without limitation to a continuous layer, which may also have a stripe shape or a net-like shape. In addition, the semiconductor layer may also have a depression and projection.

According to another feature of the present invention, a memory element includes a first conductive layer; particles; an organic compound layer; and a second conductive layer. The particles and the organic compound layer are interposed between the first conductive layer and the second conductive layer, and the particles are in contact with the first conductive layer and formed of a semiconductor as well.

According to another feature of the present invention, a memory element includes a first conductive layer; particles; an organic compound layer; and a second conductive layer. The particles and the organic compound layer are interposed between the first conductive layer and the second conductive layer, and the particles are in contact with one of the first conductive layer and the second conductive layer and formed of a semiconductor as well.

In the above memory elements, a diode may also be connected to the first conductive layer or the second conductive layer.

In the above memory elements, the organic compound layer may also have an insulator.

The organic compound layer of the memory element of the present invention is formed using an electron-transporting material or a hole-transporting material. In addition, the electrical characteristic is changed by a voltage applied to the memory element, and data is written therein. There is resistance as an example of the electrical characteristic, and parts of the first conductive layer and the second conductive layer which become a pair are connected, that is, short-circuited (hereinafter, also referred to as "short"), at the time of writing; therefore, the change occurs in resistance.

According to another feature of the present invention, a semiconductor device includes a plurality of the above memory elements arranged in matrix. Each of the plurality of memory elements may also be connected to a thin film transistor.

The above semiconductor device may also have a third conductive layer serving as an antenna which is electrically connected to the memory element through a circuit.

The writing voltage is not particularly limited as long as it is a voltage that changes an electrical characteristic of a memory element by a voltage applied between a first conductive layer and a second conductive layer. A minimum applied voltage that is required to widely change the electrical characteristic of this memory element is to be referred to as a writing voltage in this specification. Data is written using the change of the electrical characteristic of the memory element by the voltage applied in such a manner. Moreover, a reading voltage refers to an applied voltage that is used at the time of reading out the change of the electrical characteristic from an initial state due to the writing operation, which is not particularly limited as long as the voltage is such one that does not change the electrical characteristic of the memory element.

In addition, in this specification, the first conductive layer and the second conductive layer are each referred to as an electrode as well.

According to the present invention, it is possible to reduce variations in behavior of each memory element and to obtain a memory device superior in terms of performance and reliability and a semiconductor device provided with the memory device.

BRIEF DESCRIPTION OF DRAWINGS

In the accompanying drawings:
FIGS. 6A to 6C are diagrams each explaining a structural example of a memory element of the present invention.

BEST MODE FOR CARRYING OUT THE INVENTION

Figure 1A:
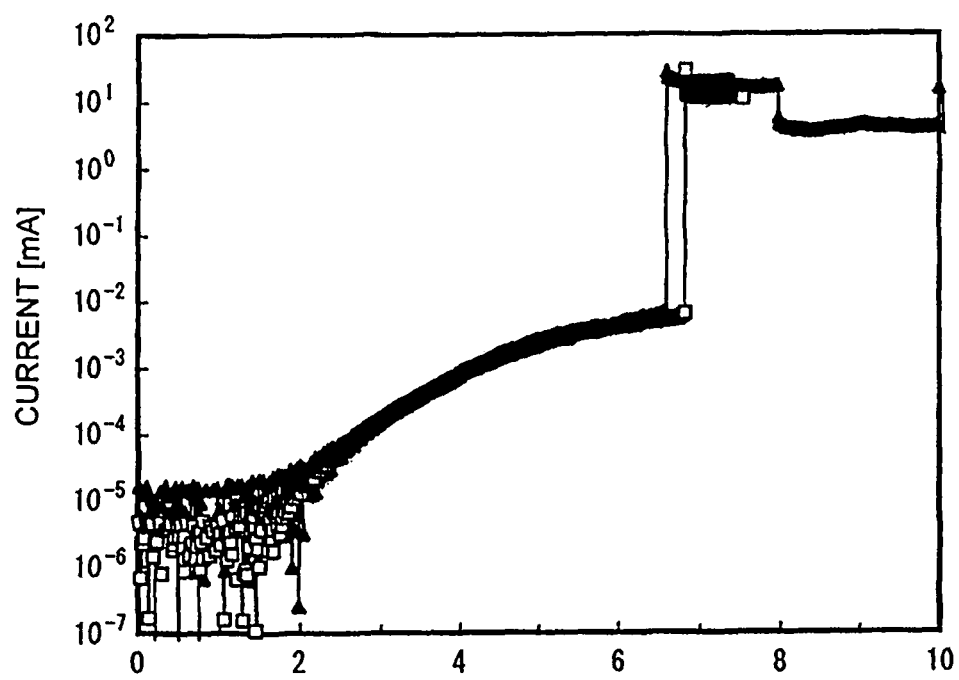
FIGS. 1A and 1B are graphs each showing current-voltage characteristics of a memory element.
Figure 1B:
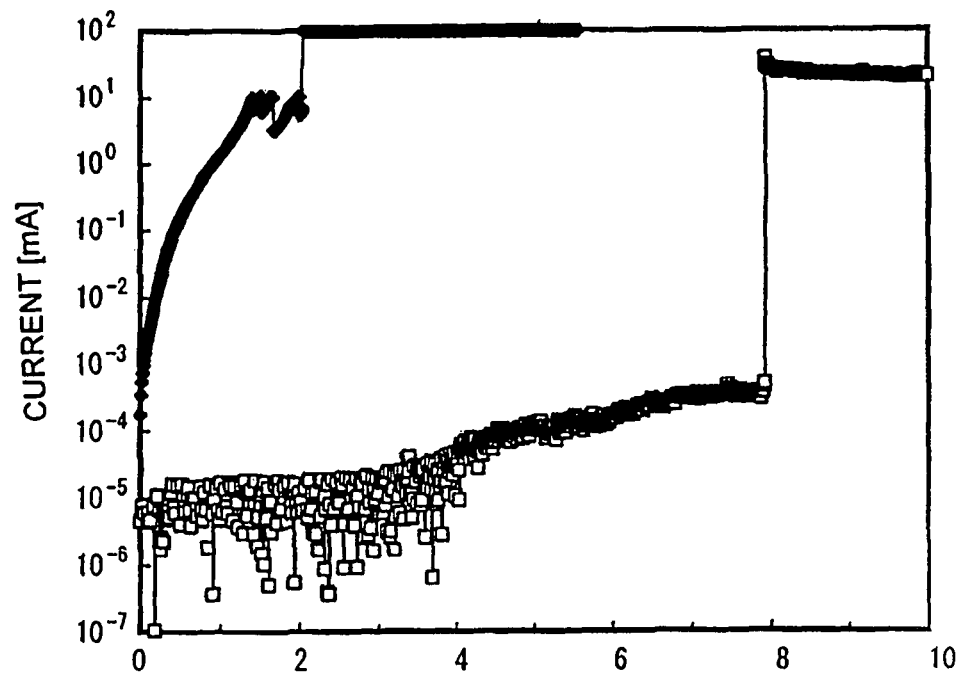

Embodiment modes of the present invention will be explained hereinafter with reference to the accompanying drawings. However, the present invention is not limited to the explanation below, and it is easily understood by those skilled in the art that modes and details of the present invention can be modified in various ways without departing from the purpose and the scope of the present invention. Therefore, the present invention should be construed as being included therein. Note that, in the structure of the present invention which will be hereinafter explained, reference numerals denoting the same portions are used in common between drawings in some cases.

Embodiment Mode 1

A structural example of a memory element of the present invention will be explained with reference to FIGS. 2A to 2C. A memory element shown in FIG. 2A has a first conductive layer 110, a semiconductor layer 111, an organic compound layer 112, and a second conductive layer 113. The semiconductor layer 111 and the organic compound layer 112 are interposed between the first conductive layer 110 and the second conductive layer 113, and the semiconductor layer 111 is formed over and in contact with the first conductive layer 110.

As for the first conductive layer 110 and the second conductive layer 113, metal, alloy, a compound, or the like which is highly conductive can be used in a single-layer or stacked-layer structure.

For example, indium tin oxide (hereinafter, referred to as ITO), indium tin oxide containing silicon, indium zinc oxide (IZO) formed with the use of a target where 2 to 20 wt % of zinc oxide (ZnO) is mixed into ITO, and the like can be given. In addition, besides titanium (Ti), gold (Au), platinum (Pt), nickel (Ni), tungsten (W), chromium (Cr), molybdenum (Mo), iron (Fe), cobalt (Co), copper (Cu), palladium (Pd), or nitride of a metal material (for example, titanium nitride (TiN), tungsten nitride (WN), or molybdenum nitride (MoN)), a metal belonging to Group 1 or 2 of a periodic table of an element, that is, an alkali metal such as lithium (Li) and cesium (Cs), an alkali earth metal such as magnesium (Mg), calcium (Ca), and strontium (Sr), an alloy containing either an alkali metal or an alkali earth metal (such as Mg:Ag and Al:Li), and the like can be given. Moreover, a rare earth metal such as europium (Eu) and ytterbium (Yb), an alloy containing the rare earth metal, or the like may also be used.

The first conductive layer 110 is formed using an evaporation method, a sputtering method, a CVD method, a printing method, an electrolytic plating method, an electroless plating method, or the like.

The second conductive layer 113 can be formed by an evaporation method, a sputtering method, a CVD method, a printing method, or a droplet discharging method. Note that the droplet discharging method is a method whereby a pattern is formed by discharge of a droplet containing a predetermined composition from a minute port.

The organic compound layer 112 is formed using an organic compound whose crystal state, conductivity, and shape are changed by voltage applied thereto from an external portion. The organic compound layer 112 may also be provided in a single layer or a multilayer by stack of layers which are formed of different organic compounds.

Note that the organic compound layer 112 is formed to have a thickness whereby electric resistance of the memory element is changed by voltage applied thereto from an external portion. A typical thickness of the organic compound layer 112 is 5 to 100 nm, and preferably, 10 to 60 nm.

For the semiconductor layer 111, an inorganic semiconductor such as molybdenum oxide, tin oxide, bismuth oxide, silicon, vanadium oxide, nickel oxide, zinc oxide, silicon germanium, gallium arsenide, gallium nitride, indium oxide, indium phosphide, indium nitride, cadmium sulfide, cadmium telluride, or strontium titanate can be used.

The film thickness of the semiconductor layer 111 is not particularly limited as long as it is greater than or equal to 0.1 nm, and the film thickness may be as thin as less than or equal to 10 nm or may be greater than or equal thereto, for example. Note that, in the latter case, it is possible to prevent dust being mixed during a process or short of a memory element due to a fine depression and projection on a conductive layer surface, in addition to an advantageous effect when the semiconductor layer is provided.

The semiconductor layer 111 can be formed using an evaporation method, an electron beam evaporation method, a sputtering method, a CVD method, or the like. Alternatively, the semiconductor layer 111 may also be formed using a spin coating method, a sol-gel method, a printing method, a droplet discharging method, or the like as another method, or the above methods may also be combined with these methods.

Further, the organic compound layer 112 can be formed using an organic compound having a hole-transporting property or an electron-transporting property.

Note that, as the organic compound having a hole-transporting property, an aromatic amine (that is a benzene ring-nitrogen bond is included) compound such as 2,7-di(N-carbazolyl)-spiro-9,9'-bifluorene (abbreviation: SFDCz), 4,4'-bis[N-(1-naphthyl)-N-phenylamino]biphenyl (abbreviation: NPB), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris[N-(3-methylphenyl)-N-phenyl-amino]-triphenylamine (abbreviation: MTDATA), and 4,4'-bis(N-(4-(N,N-di-m-tolylamino)phenyl)-N-phenylamino)biphenyl (abbreviation: DNTPD); a phthalocyanine compound such as phthalocyanine (abbreviation: $H_2Pc$), copper phthalocyanine (abbreviation: CuPc), and vanadyl phthalocyanine (abbreviation: VOPc); and the like can be given. The materials described here mainly have hole mobility greater than or equal to $10^{-6}$ $cm^2/Vs$ and less than or equal to $10^{-2}$ $cm^2 Vs$.

As the organic compound having a high electron-transporting property, it is possible to use a material made from a metal complex having a quinoline skeleton or a benzoquinoline skeleton such as tris(8-quinolinolato)aluminum (abbreviation: Alq), tris(4-methyl-8-quinolinolato)aluminum (abbreviation: $Almq_3$), bis(10-hydroxybenzo[h]-quinolinato)beryllium (abbreviation: $BeBq_2$), and bis(2-methyl-8-quinolinolato)-4-phenylphenolato-aluminum (abbreviation: BAlq), or the like. In addition, a metal complex having an oxazole ligand or a thiazole ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can also be used. In addition to the above metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), and the like can also be given as a material having a high electron-transporting property. The materials described here mainly have electron mobility greater than or equal to $10^{-6}$ $cm^2 Vs$ and less than or equal to $10^{-2}$ $cm^2/Vs$.

Note that a material having mobility outside the above range, for example, 2,3-bis(4-diphenylaminophenyl)quinoxaline (abbreviation: TPAQn) or the like, may also be used.

The organic compound layer 112 can be formed using an evaporation method, an electron beam evaporation method, a sputtering method, a CVD method, or the like. Alternatively, the organic compound layer 112 may also be formed using a spin coating method, a sol-gel method, a printing method, a droplet discharging method, or the like as another method, or the above methods may also be combined with these methods.

In addition, as the organic compound layer 112, an insulator may also be mixed into the organic compound having a hole-transporting property or an electron-transporting property. Note that the insulator does not have to be dispersed uniformly. Morphology of the organic compound layer 112 can be improved by the insulator being mixed. Thus, since crystallization or the like of the film can be partially suppressed, variations in behavior of each memory element can be further suppressed.

Note that, as the insulator, an inorganic compound or an organic compound having an insulating property can be used. For example, as the inorganic compound, an oxide such as lithium oxide ($Li_2O$), sodium oxide ($Na_2O$), potassium oxide ($K_2O$), rubidium oxide ($Rb_2O$), beryllium oxide (BeO), magnesium oxide (MgO), calcium oxide (CaO), strontium oxide (SrO), and barium oxide (BaO); a fluoride such as lithium fluoride (LiF), sodium fluoride (NaF), potassium fluoride (KF), rubidium fluoride (RbF), beryllium fluoride ($BeF_2$), magnesium fluoride ($MgF_2$), calcium fluoride ($CaF_2$), strontium fluoride ($SrF_2$), and barium fluoride ($BaF_2$); other nitride, chloride, bromide, iodide, carbonate, sulphate, and nitrate having an insulating property; and the like are given. In addition, as the organic compound having an insulating property, polyimide, acrylic, polyamide, benzocyclobutene, polyester, a novolac resin, a melamine resin, a phenol resin, an epoxy resin, a silicon resin, a furan resin, a diallyl phthalate resin, or the like can be used. Moreover, a so-called siloxane based material having a main chain skeleton structure formed by the bond of silicon and oxygen may also be used.

Note that such a mixed layer can be formed by each material being formed at the same time by combination of the same or different methods, for example, a co-evaporation method using resistance heating, a co-evaporation method using electron beam evaporation, a co-evaporation method using resistance heating evaporation and electron beam evaporation, film formation using resistance heating evaporation and a sputtering method, film formation using electron beam evaporation and a sputtering method, or the like. In addition, a spin coating method, a sol-gel method, a printing method, a droplet discharging method, or the like may also be used as another method for forming the mixed layer, or the above methods may also be combined with these methods. Moreover, instead of forming each material at the same time, the insulator may also be introduced by an ion implantation method, a doping method, or the like after the organic compound layer is formed so as to form the mixed layer of the organic compound and the insulator.

In the memory element having the structure as described above, the local concentration of an electric field on the surface of the conductive layer can be suppressed by the semiconductor layer being provided to be in contact with the conductive layer. Thus, since a region through which current flows can be increased in the organic compound layer, it is possible to suppress breakdown of the conductive layer or the like and an insulating state of the memory element due to excess current.

As described above, it is possible to suppress abnormal behavior of a memory element and further to reduce variations in behavior of each memory element.

Figure 3A:
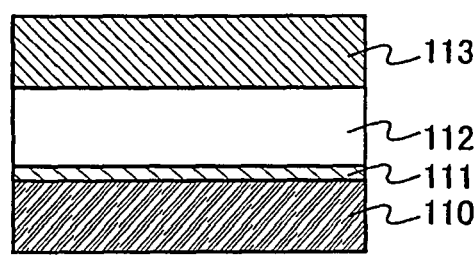
FIGS. 3A and 3B are views each explaining an operation mechanism of a memory element of the present invention.
Figure 3B:
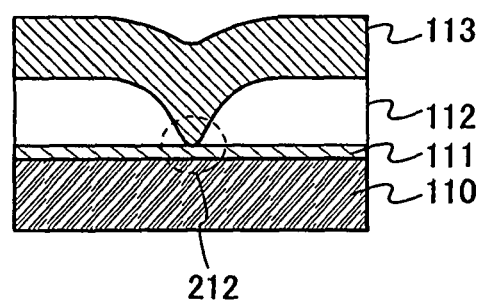

Next, an operation mechanism of a memory element will be explained with reference to FIGS. 3A and 3B. First, FIG. 3A shows a memory element before voltage is applied thereto. When a voltage is applied between a first conductive layer 110 and a second conductive layer 113, a carrier is injected into a semiconductor layer 111 from the first conductive layer 110; therefore, an organic compound layer 112 is deformed when the voltage reaches a certain applied voltage. Accordingly, the first conductive layer 110 and the second conductive layer 113 are in contact with each other, and consequently the memory element is shorted (see reference numeral 212 of FIG. 3B). The conductivity of the memory element changes before and after voltage is applied thereto.

In such a manner, data is written with the use of the change in conductivity of the memory element by the voltage being applied.

Figure 2A:
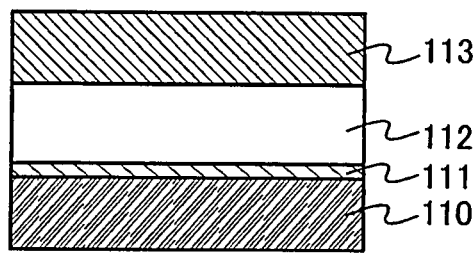
FIGS. 2A to 2C are views each explaining a structural example of a memory element of the present invention.
Figure 2B:
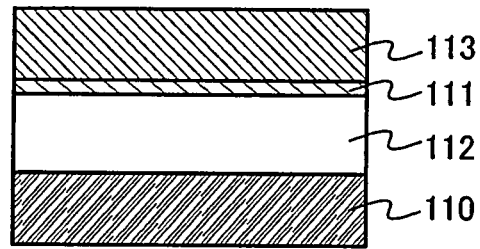

The structure of the memory element is not limited to that of FIG. 2A and a structure may also be employed where a semiconductor layer 111 is provided to be in contact with a second conductive layer 113 as in FIG. 2B. Moreover, as shown in FIG. 2C, a semiconductor layer 111 may also be provided in two layers so as to be in contact with a first conductive layer 110 and a second conductive layer 113.

Figure 2C:
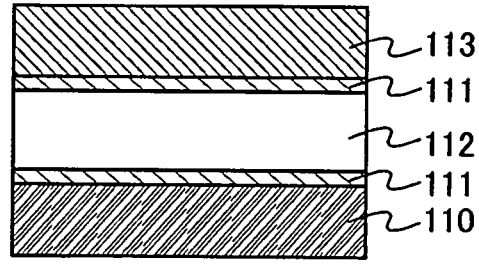
Figure 4A:
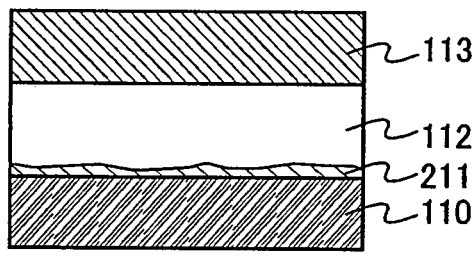
FIGS. 4A to 4C are views each explaining a structural example of a memory element of the present invention.

In addition, it is not necessary that the shape of the semiconductor layer 111 be similar to that of the surface of the first conductive layer 110 as shown in FIGS. 2A to 2C, and a semiconductor layer 211 having a depression and projection which does not depend on the shape of a first conductive layer 110 may also be employed as shown in FIG. 4A.

Figure 4B:
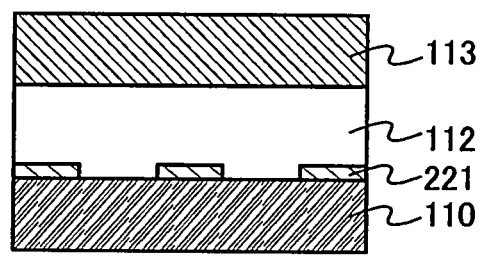

Moreover, the shape of the semiconductor layer 111 is not necessary to be a continuous layer and can also be a discontinuous layer of a stripe shape like a semiconductor layer 221 shown in FIG. 4B. Note that the stripe direction of the semiconductor layer 221 is not particularly limited. Since the local concentration of an electric field on the surface of the conductive layer can be suppressed even in the case of the discontinuous layer, an effect similar to that of the above can be obtained.

Figure 4C:
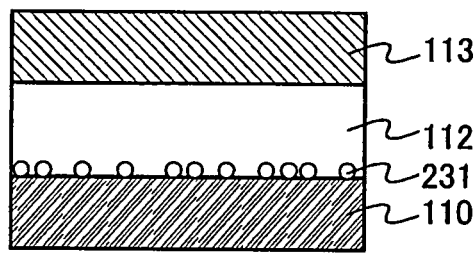

Further, the semiconductor layer 111 may also be provided in a shape of particles 231 as shown in FIG. 4C. At this time, the grain size of the particles 231 is not particularly limited.

Figure 5A:
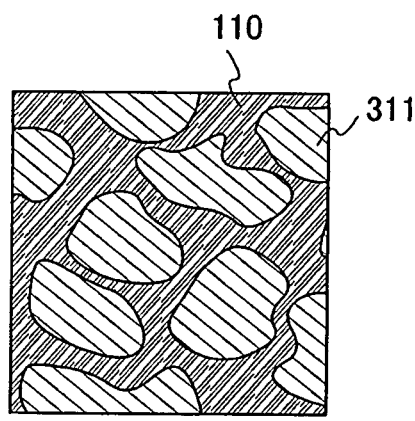
FIGS. 5A to 5C are views each explaining a structural example of a memory element of the present invention.
Figure 5B:
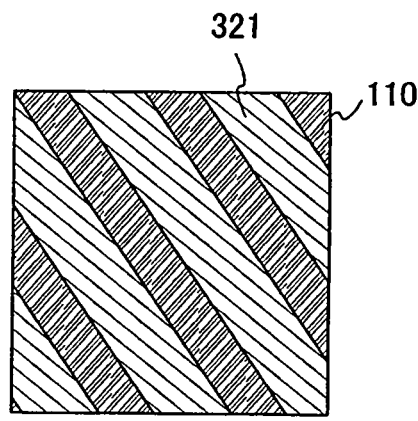
Figure 5C:
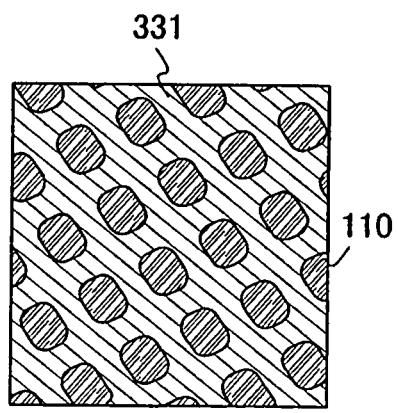

Furthermore, the shape of the semiconductor layer 111 may also be that shown in FIGS. 5A to 5C. Note that FIGS. 5A to 5C are top views where reference numerals 311, 321, and 331 are each a semiconductor layer.

As shown in FIG. 5A, the semiconductor layer 311 can be formed to be an island-shaped discontinuous layer that covers at least part of a first conductive layer 110. Here, the semiconductor layers 311 which are a plurality of discontinuous layers are dispersed irregularly on the surface of the first conductive layer 110.

In addition, as shown in FIG. 5B, a semiconductor layer 321 provided over a first conductive layer 110 can be formed to be a discontinuous layer of a stripe shape having a predetermined angle (greater than or equal to −90 degrees and less than 90 degrees) with respect to any one side of the first conductive layer 110.

Moreover, a semiconductor layer 331 provided over a first conductive layer 110 can be formed also in a net-like shape as shown in FIG. 5C.

Note that the semiconductor layer does not have to be one layer and may also have a stacked-layer structure. In addition, each of the stacked semiconductor layers can have the above shape.

As for the voltage which is applied to the memory element of the present invention, a higher voltage may be applied also to the first conductive layer 110 than that applied to the second conductive layer 113, or a higher voltage may be applied also to the second conductive layer 113 than that applied to the first conductive layer 110.

With the structure as described above, it is possible to suppress abnormal behavior such as breakdown of the conductive layer or the like and an insulating state of the memory element. Thus, it becomes possible to reduce variations in behavior of each memory element.

Therefore, the range of reading voltages which are obtained is expanded, and flexibility in designing a memory element is improved. In addition, since it is impossible to erase data of a memory element where writing is once performed in the memory element of the present invention, it is possible to prevent forgery by rewriting. Further, since the memory element of the present invention has a simple structure where a semiconductor layer and an organic compound layer are interposed between a pair of conductive layers, it becomes possible to manufacture a memory element superior in terms of performance and reliability at a low cost.

Embodiment Mode 2

This embodiment mode will explain a semiconductor device having a memory element of the present invention, typically a memory device, with reference to drawings. Note that this embodiment mode will show a case where the structure of the memory device is a passive matrix type.

FIG. 6A shows a structural example of a semiconductor device shown in this embodiment mode. A semiconductor device 400 includes a memory cell array 411 where memory elements 401 are arranged in matrix, decoders 412 and 413, a selector 414, and a readout/write circuit 415. The structure of the semiconductor device 400 which is shown here is only one example and the semiconductor device 400 may also include other circuits such as a sense amplifier, an output circuit, or a buffer.

The decoders 412 and 413, the selector 414, the readout/write circuit 415, an interface, and the like may also be formed over a substrate as with the memory element. Alternatively, they may be attached externally as IC chips.

The memory element 401 includes a first conductive layer connected to a bit line Bx ($1 \leq x \leq m$), a second conductive layer connected to a word line Wy ($1 \leq y \leq n$), a semiconductor layer in contact with the first conductive layer, and an organic compound layer over the semiconductor layer.

Figure 7A:
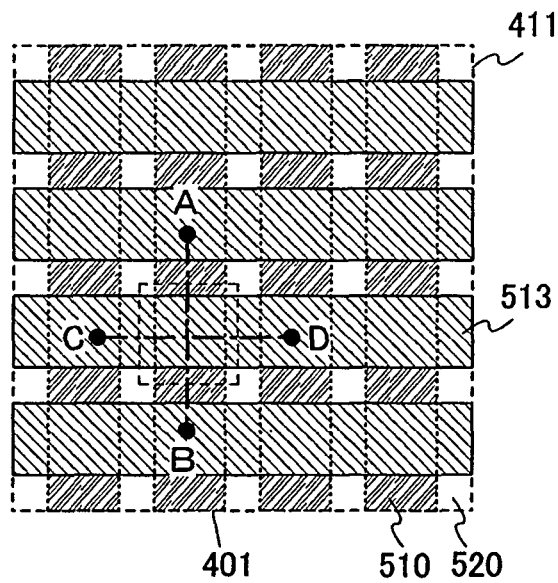
FIGS. 7A and 7B are views each explaining a memory cell included in a semiconductor device of the present invention.
Figure 7B:
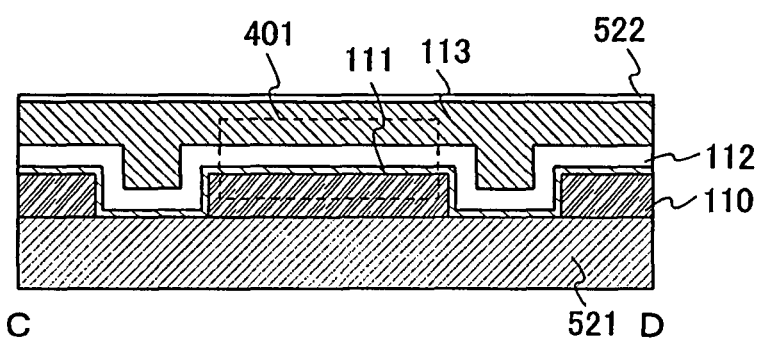

FIGS. 7A and 7B show examples of a top view and a cross-sectional view of the memory cell array 411, respectively. Note that FIG. 7A shows the top view of part of the memory cell array 411.

In the memory cell array 411, the memory elements 401 are arranged in matrix. Over a substrate, the memory element 401 has a first conductive layer 510 extended in a first direction (A-B), a semiconductor layer and an organic compound layer 520 which cover the first conductive layer 510, and a second conductive layer 513 extended in a second direction (C-D) vertical to the first direction. Note that the semiconductor layer can be formed using a material similar to that of the semiconductor layer 111 which is shown in Embodiment Mode 1. In FIG. 7A, an insulating layer serving as a protective film, which is provided so as to cover the second conductive layer 513, is omitted.

Note that the first conductive layer 510 in this embodiment mode corresponds to the first conductive layer 110 in Embodiment Mode 1, and the semiconductor layer and the organic compound layer 520 corresponds to the semiconductor layer 111 and the organic compound layer 112, respectively. In addition, the second conductive layer 513 corresponds to the second conductive layer 113 in Embodiment Mode 1. Portions similar to those in Embodiment Mode 1 are denoted by reference numerals in common, and detailed explanations of similar portions or portions having similar function will be omitted.

FIG. 7B shows an example of a cross-sectional structure taken along a line C-D in FIG. 7A. As for a substrate 521 over which the memory element 401 is provided, a quartz substrate, a silicon substrate, a metal substrate, a stainless steel substrate, paper made of a fiber material, or the like can be used in addition to a glass substrate or a flexible substrate. The flexible substrate refers to a substrate that can be bent (flexible), and a plastic substrate made of polycarbonate, polyarylate, polyethersulfone, or the like can be given, for example. In addition, a film (a film made of polypropylene, polyester, vinyl, polyvinyl fluoride, polyvinyl chloride, or the like) can also be used.

In addition, a thin film transistor (TFT) may also be provided over a substrate having an insulating property and the memory element 401 may also be provided thereover. Alternatively, instead of the above substrate, a semiconductor substrate such as an Si substrate or an SOI substrate may also be used to form a field-effect transistor (FET) over the substrate, and the memory element 401 may also be provided thereover. In addition, the semiconductor device having the memory element of the present invention may be provided by the attachment of the memory element 401 to the thin film transistor or the field-effect transistor. In this case, the memory element and the thin film transistor or the field-effect transistor are manufactured through different processes from each other, and then the thin film transistor or the field-effect transistor are provided by being attached to the memory element with the use of a conductive film, an anisotropic conductive adhesive agent, or the like.

In FIG. 7B, first, a first conductive layer 110 is formed over the substrate 521 using an evaporation method, a sputtering method, a CVD method, a printing method, an electrolytic plating method, an electroless plating method, or the like. Next, a semiconductor layer 111 and an organic compound layer 112 are formed over the first conductive layer 110 by an evaporation method, an electron beam evaporation method, a sputtering method, a CVD method, or the like. Alternatively, the semiconductor layer 111 and the organic compound layer 112 may also be formed using a spin coating method, a sol-gel method, a printing method, a droplet discharging method, or the like as another method, or the above methods may also be combined with these methods. Further, a second conductive layer 113 is formed over the organic compound layer 112 using an evaporation method, a sputtering method, a CVD method, a printing method, or a droplet discharging method. Then, an insulating layer 522 serving as a protective film is provided so as to cover the second conductive layer 113.

Figure 8A:
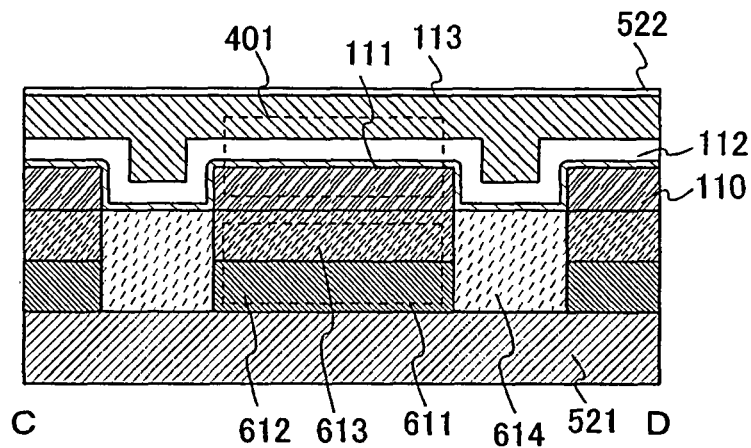
FIGS. 8A and 8B are views each explaining a structural example of a memory element of the present invention.

As shown in FIG. 8A, an element having a rectifying property may be provided between a first conductive layer 110 and a substrate 521 in a memory element 401. The element having a rectifying property is a Schottky-barrier diode, a PIN junction diode, a PN junction diode, or a diode-connected transistor, and the like are given. Here, a diode 611 including a third conductive layer 612 and a semiconductor layer 613 is provided under and in contact with the first conductive layer 110. Note that the diode 611 corresponding to each memory element is isolated from an interlayer insulating film 614. In addition, the element having a rectifying property may also be provided on the opposite side of an organic compound layer 112 with a conductive layer 113 interposed therebetween.

When there is a concern that an adverse effect of an electric field is caused between the adjacent memory elements, partition walls (insulating layers) may be provided between the organic compound layers provided in each of memory elements so as to isolate the organic compound layers provided in each of the memory elements from one another. In other words, the organic compound layer may also be selectively provided in each memory element.

Figure 8B:
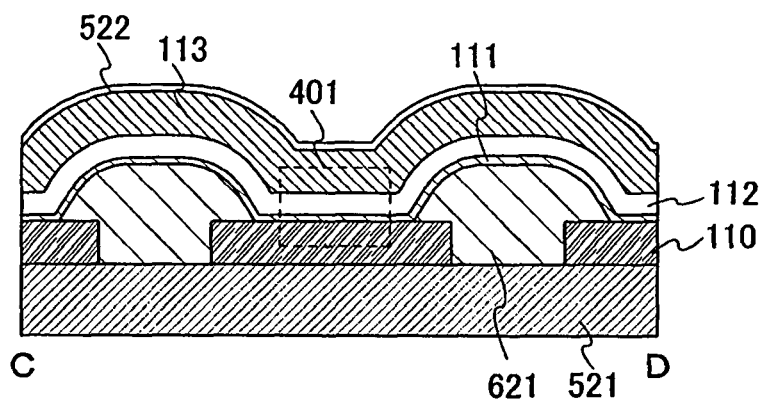

As shown in FIG. 8B, partition walls (insulating layers) 621 may also be provided between first conductive layers 110 of each memory element 401. Accordingly, it is possible to prevent disconnection of organic compound layers 112 due to level difference of the first conductive layer 110 in providing a semiconductor layer 111 and the organic compound layer 112 so as to cover the first conductive layers 110, as well as to prevent an adverse effect of an electric field caused between the adjacent memory elements. In the cross sections of the partition walls (insulating layers) 621, it is preferable that the side surfaces of the partition walls (insulating layers) 621 have angles of inclination of greater than or equal to 10 degrees and less than 60 degrees, preferably, greater than or equal to 25 degrees and less than or equal to 45 degrees with respect to the surfaces of the first conductive layers 110. Further, it is preferable that the partition walls (insulating layers) 621 be curved. After the partition walls (insulating layers) 621 are provided in such a manner, the semiconductor layer 111, the organic compound layer 112, and a second conductive layer 113 are formed so as to cover the first conductive layers 110 and the partition walls (insulating layers) 621. Moreover, the partition walls (insulating layers) 621 may also be formed after the semiconductor layer 111 is formed over the first conductive layers 110.

Next, an operation in writing data in a memory element will be explained. Here, a case of writing data by an electric action, typically by voltage applied thereto, will be explained with reference to FIGS. 6A to 6C. Note that the data is written by change of the electrical characteristics of the memory element, and "0" and "1" refer to data in an initial state (a state where an electric action is not applied) of the memory element and data in a state where the electrical characteristics are changed, respectively.

When data "1" is written in the memory element 401, first, the memory element 401 is selected by the decoders 412 and 413, and the selector 414. Specifically, predetermined potential V2 is applied to the word line W3 connected to the memory element 401 by the decoder 413. In addition, the bit line B3 connected to the memory element 401 is connected to the readout/write circuit 415 by the decoder 412 and the selector 414. Then, writing potential V1 is output to the bit line B3 from the readout/write circuit 415. Thus, a voltage Vw=V1−V2 is applied between the first conductive layer and the second conductive layer included in the memory element 401. By proper selection of the voltage Vw, a layer containing an organic compound which is provided between the conductive layers is changed physically or electrically so that the data "1" is written. Specifically, as for a readout operation voltage, electric resistance between the first and second conductive layers when the memory element 401 is in the state of the data "1" may be largely lowered than electric resistance therebetween when the memory element 401 is in the state of data "0". For example, the first and second conductive layers may be short-circuited (shorted), and the voltage (V1 and V2) may be appropriately selected from a range of (0 V and 5 to 15 V) or a range of (3 to 5 V and −12 to −2 V). The voltage Vw may be set to be greater than or equal to 5 V and less than or equal to 15 V or greater than or equal to −15 V and less than or equal to −5 V.

Further, non-selected word lines and non-selected bit lines are controlled so that the data "1" is not written in the memory elements connected to the non selected word lines and the non-selected bit lines. For example, the non-selected word lines and the non-selected bit lines may be made in a floating state. It is necessary to impart a characteristic whereby selectivity can be secured, such as a diode characteristic, to the memory element. In addition, potential set to be the same degree as that of the second conductive layer may be applied to the non-selected bit lines.

On the other hand, when data "0" is written in the memory element 401, an electric action may not be applied to the memory element 401. As for a circuit operation, for example, the memory element 401 is selected by the decoders 412 and 413, and the selector 414 as well as the case of writing data "1"; however, the output potential from the readout/write circuit 415 to the bit line B3 is set to be the same degree as potential of the selected word line W3 or potential of the non-selected lines, and a voltage (for example, greater than or equal to −5 V and less than or equal to 5 V), whereby electrical characteristics of the memory element 401 is not changed, may be applied between the first and second conductive layers included in the memory element 401.

Subsequently, an operation when data is read out from a memory element will be explained with reference to FIG. 6B. Data is read out by utilization of a difference in electrical characteristics between the first and second conductive layers included in a memory element having the data "0" and a memory element having the data "1". For example, a method for reading out data by utilization of a difference in electric resistance when effective electric resistance between the first and second conductive layers included in the memory element having the data "0" (hereinafter, simply referred to as electric resistance of the memory element) is R0 at a reading voltage and electric resistance of the memory cell having data "1" is R1 at a reading voltage, will be explained. Note that R1<<R0. As a structure of a readout portion of the readout/write circuit 415, for example, a circuit including a resistance element 450 and a differential amplifier 451 as shown in FIG. 6B can be used. The resistance element 450 has resistance Rr, where R1<Rr<R0. A transistor 452 may be used as a substitute for the resistance element 450 as shown in FIG. 6C, or a clocked inverter 453 can be used as a substitute for the differential amplifier 451. A signal φ or an inversion signal thereof, which becomes High (hereinafter, Hi) when data is read out and Low (hereinafter, Lo) when no data is read out, is input in the clocked inverter 453. Of course, the circuit configurations are not limited to FIGS. 6B and 6C.

When data is read out from a memory element 402, first, the memory element 402 is selected by decoders 412 and 413, and the selector 414. Specifically, predetermined potential Vy is applied to a word line Wy connected to the memory element 402 by the decoder 413. In addition, a bit line Bx connected to the memory element 402 is connected to a terminal P of the readout/write circuit 415 by the decoder 412 and the selector 414. As a result, potential Vp of the terminal P becomes the amount determined by resistance division generated by the resistance element 450 (resistance Rr) and the memory element 402 (resistance R0 or R1). Therefore, when the memory element 402 has the data "0", potential Vp0 of the terminal P is Vp0=Vy+(V0−Vy)×R0/(R0+Rr). Moreover, when the memory element 402 has the data "1", potential Vp1 of the terminal P is Vp1=Vy+(V0−Vy)×R1/(R1+Rr). As a result, Lo/Hi (or Hi/Lo) is output as output potential Vout in accordance with the data "0" and data "1", and can be read out by selection of Vref to be between Vp0 and Vp1 in FIG. 6B and selection of a variation point of the clocked inverter 453 between Vp0 and Vp1 in FIG. 6C.

For example, the differential amplifier 451 is operated when Vdd is 3 V, and Vy is set to be 0 V; V0, 3 V; and Vref, 1.5 V. If R0/Rr=Rr/R1=9, when the memory element has the data "0", Vp0 becomes 2.7 V and Hi is output as Vout. When the memory element has the data "1", Vp1 becomes 0.3 V and Lo is output as Vout. Thus, data can be read out from the memory element.

According to the above method, a state of electric resistance of the layer containing an organic compound is read out by the amount of a voltage by utilization of a difference in resistance and resistance division. Of course, the readout method is not limited thereto. For example, the state of electric resistance of the layer containing an organic compound may be read out by utilization of a difference in the amount of current instead of utilization of a different in electric resistance. Moreover, when an electronic characteristic of a memory element has a diode property in which a threshold voltage is differed between the data "0" and the data "1", the state of electric resistance of the layer containing an organic compound may be read out by utilization of a difference in threshold voltage.

In addition, a thin film transistor (TFT) may be provided over a substrate having an insulating property, and the memory element or a memory element array may be provided thereover. Alternatively, instead of the substrate having an insulating property, a semiconductor substrate such as an Si substrate or an SOI substrate may be used to form a field-effect transistor (FET) over the substrate, and the memory element or a memory element array may be provided thereover.

The memory element of the present invention is included in the semiconductor device described in this embodiment mode so that it is possible to suppress abnormal behavior such as breakdown of the conductive layer or the like and an insulating state of the memory element. Thus, it becomes possible to reduce variations in behavior of each memory element. Therefore, the range of reading voltages which are obtained is expanded, and flexibility in designing the semiconductor device is improved.

Moreover, data can be written in the semiconductor device not only once but can also be written additionally. On the other hand, since it is impossible to erase data of a memory element where writing is once performed, it is possible to prevent forgery by rewriting. Further, since the memory element of the present invention has a simple structure where a semiconductor layer and an organic compound layer are interposed between a pair of conductive layers, it becomes possible to manufacture a memory element superior in terms of performance and reliability at a low cost.

Note that this embodiment mode can be freely combined with other embodiment modes and embodiments.

Embodiment Mode 3

Figure 9A:
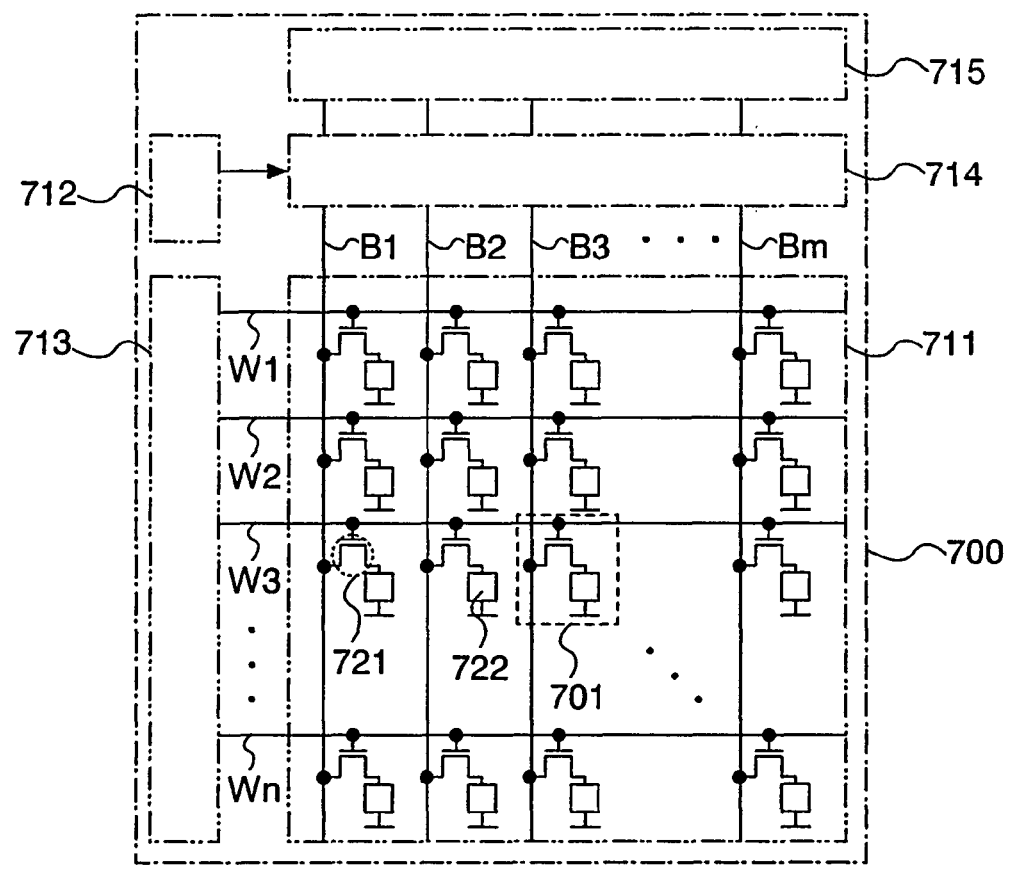
FIGS. 9A to 9C are views each explaining a structural example of a semiconductor device of the present invention.
Figure 9B:
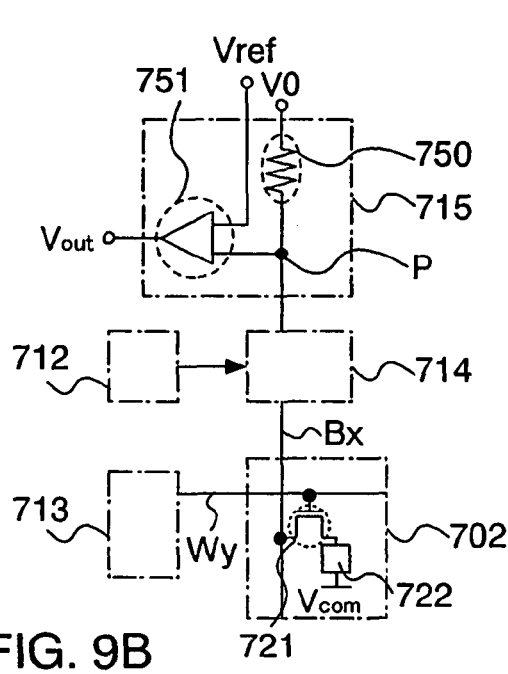
Figure 9C:
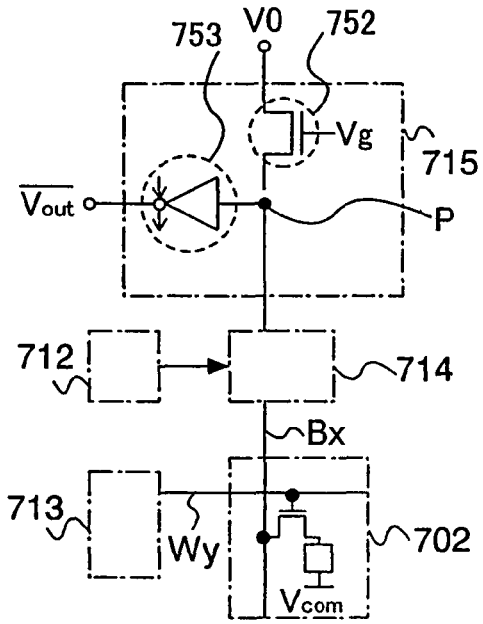

This embodiment mode will explain a semiconductor device having a memory element of the present invention with reference to FIGS. 9A to 9C. Specifically, this embodiment mode will explain an active-matrix memory device.

FIG. 9A shows a structural example of a semiconductor device shown in this embodiment mode. A semiconductor device 700 includes a memory cell array 711 where memory cells 701 are arranged in matrix, decoders 712 and 713, a selector 714, and a readout/write circuit 715. The structure of the semiconductor device 700 which is shown here is only one example and the semiconductor device 700 may also include other circuits such as a sense amplifier, an output circuit, or a buffer.

The decoders 712 and 713, the selector 714, the readout/write circuit 715, an interface, and the like may also be formed over a substrate as with a memory element. Alternatively, they may be attached externally as IC chips.

The memory cell 701 includes a first wiring connected to a bit line Bx ($1 \leq x \leq m$), a second wiring connected to a word line Wy ($1 \leq y \leq n$), a thin film transistor 721, and a memory element 722. The memory element 722 has a structure where a semiconductor layer and an organic compound layer are interposed between a pair of conductive layers.

Next, examples of a top view and cross-sectional views of the memory cell array 711 having the above structure will be explained with reference to FIGS. 10A to 10C. Note that FIG. 10A shows the top view of part of the memory cell array 711.

In the memory cell array 711, the plurality of memory elements 701 are arranged in matrix. Alternatively, in the memory cell 701, a thin film transistor 721 serving as a switching element and a memory element connected to the thin film transistor 721 are provided over a substrate having an insulating property.

Figure 10A:
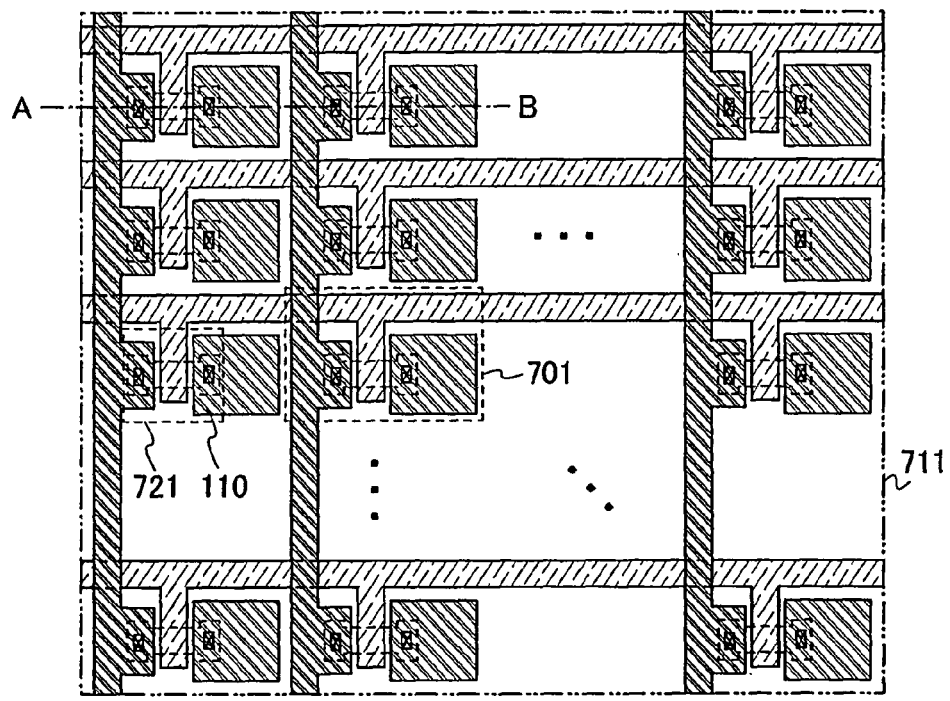
FIGS. 10A to 10C are views each explaining a memory cell included in a semiconductor device of the present invention.
Figure 10B:
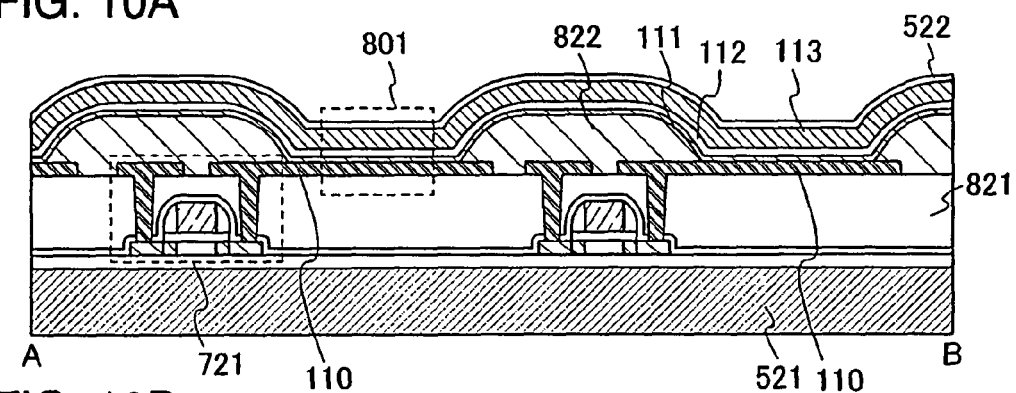

FIG. 10B shows an example of a cross-sectional structure taken along a line A-B in FIG. 10A. Note that, in FIG. 10A, partition walls (insulating layers) 822, a semiconductor layer 111, an organic compound layer 112, a second conductive layer 113, and an insulating layer 522 which are provided over first conductive layers 110 are omitted.

The memory cell 701 includes the thin film transistor 721, a memory element 801, an insulating layer 821, and the partition wall (insulating layer) 822 covering part of the first conductive layers 110. Note that the insulating layer 522 serving as a protective film is provided to cover the memory element 801. The memory element 801 connected to the thin film transistor 721 which is formed over a substrate 521 having an insulating surface includes the first conductive layer 110, the semiconductor layer 111, the organic compound layer 112, and the second conductive layer 113 which are formed over the insulating layer 821. Note that the semiconductor layer 111 can be formed using a material similar to that of the semiconductor layer shown in Embodiment Mode 1. Moreover, the thin film transistor 721 is not particularly limited as long as it serves as a switch, and a thin film transistor is not particularly necessary.

Figure 11A:
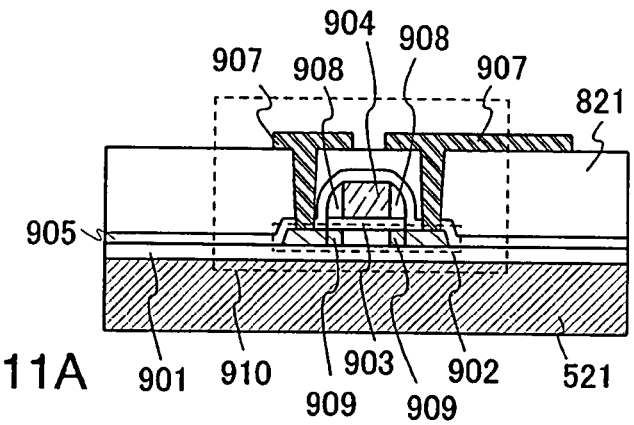
FIGS. 11A to 11D are views each explaining one mode of a thin film transistor.

One modes of the thin film transistor 721 will be explained with reference to FIGS. 11A to 11D. FIG. 11A shows an example of applying a top-gate thin film transistor. An insulating layer 901 is provided over a substrate 521 as a base film, and a thin film transistor 910 is provided over the insulating layer 901. In the thin film transistor 910, a semiconductor layer 902 and an insulating layer 903 serving as a gate insulating layer are provided over the insulating layer 901, and further a gate electrode 904 is formed over the insulating layer 903 by corresponding to the semiconductor layer 902. Note that an insulating layer 905 serving as a protective layer and an insulating layer 821 serving as an interlayer insulating layer are formed over the thin film transistor 910. Moreover, wirings 907 each connected to a source region and a drain region of the semiconductor layer are formed.

An insulating film such as a silicon oxide film, a silicon nitride film, or a silicon oxynitride film is used to form the insulating layer 901, which is formed in a single layer or a multilayer of two or more layers of these insulating films. Note that the insulating layer 901 may be formed using a sputtering method, a CVD method, or the like.

As for the semiconductor layer 902, a crystalline semiconductor film such as polysilicon may also be used, as well as a non-crystalline semiconductor film such as an amorphous semiconductor, such as amorphous silicon, a semi-amorphous semiconductor, or a microcrystalline semiconductor.

In particular, a crystalline semiconductor formed by crystallization of an amorphous or microcrystalline semiconductor by laser light irradiation, a crystalline semiconductor formed by crystallization of an amorphous or microcrystalline semiconductor by heat treatment, or a crystalline semiconductor formed by crystallization of an amorphous or microcrystalline semiconductor by combination of heat treatment and laser irradiation is preferably used. In the heat treatment, a crystallization method using a metal element such as nickel, which has a function of promoting crystallization of a silicon semiconductor, can be employed.

In the case of the crystallization with laser light irradiation, it is possible to perform crystallization in such a way that a portion in a crystalline semiconductor that is melted by irradiation with laser light is continuously moved in a direction where the laser light is delivered, where the laser light is continuous wave laser light or ultrashort pulsed laser light having a high repetition rate of greater than or equal to 10 MHz and a pulse width of less than or equal to 1 nanosecond, preferably 1 to 100 picoseconds. With the use of such a crystallization method, a crystalline semiconductor having a large grain diameter with a crystal grain boundary extending in one direction can be obtained. By a drift direction of carriers being made to conform to the direction where the crystal grain boundary extends, the electric field effect mobility in the transistor can be increased. For example, greater than or equal to 400 $cm^2/V \cdot sec$ can be achieved.

A large glass substrate can be used when the above crystallization step is applied to a crystallization process where the temperature is less than or equal to the heat resistant temperature of a glass substrate (approximately 600° C.). Therefore, a large number of semiconductor devices can be manufactured with one substrate, and cost can be decreased.

In addition, with the use of a substrate that withstands heat temperature, the semiconductor layer 902 may be formed by a crystallization step which is performed through heating at the temperature higher than a heat resistant temperature of a glass substrate. Typically, a quartz substrate is used as the insulating substrate and an amorphous or microcrystalline semiconductor is heated at temperatures greater than or equal to 700° C. to form the semiconductor layer 902. As a result, a semiconductor with superior crystallinity can be formed. In this case, a thin film transistor which is superior in response speed, mobility, and the like and which is capable of a high-speed operation can be provided.

The gate electrode 904 can be formed using metal or a polycrystalline semiconductor added with an impurity having one conductivity type. When the gate electrode 904 is formed using metal, tungsten (W), molybdenum (Mo), titanium (Ti), tantalum (Ta), aluminum (Al), or the like can be used. In addition, metal nitride formed by nitriding of the above metal can be used. Alternatively, the gate electrode 904 may include a first layer formed from the metal nitride and a second layer formed from the metal to be stacked. When the gate electrode 904 has a stacked-layer structure, a so-called hat shape, where an edge portion of the first layer may protrude from an edge portion of the second layer, may be employed. In this case, when the first layer is formed using metal nitride, the first layer can serve as barrier metal. In other words, the first layer can prevent metal contained in the second layer from dispersing in the insulating layer 903 and the underlying semiconductor layer 902.

Note that sidewalls (sidewall spacers) 908 may be provided on the both side faces of the gate electrode 904. An insulating layer is formed by a CVD method and anisotropic etching is performed to the insulating layer by an RIE (Reactive Ion Etching) method so that the sidewalls can be formed.

The thin film transistor formed of the semiconductor layer 902, the insulating layer 903, the gate electrode 904, and the like by being combined can employ various kinds of structures such as a single drain structure, an LDD (lightly doped drain) structure, and a gate overlapped drain structure. FIG. 11A shows a thin film transistor having an LDD structure in which low concentration impurity regions 909 are formed in the semiconductor layer overlapped with the sidewalls. In addition, a single gate structure, a multi-gate structure, in which transistors, to which gate voltage having the same potential in terms of equivalence, are connected in series, a dual-gate structure in which a semiconductor layer is interposed between gate electrodes, or the like can also be applied.

The insulating layer 821 is formed with an inorganic insulating material such as silicon oxide and silicon oxynitride or an organic insulating material such as an acrylic resin and a polyimide resin. When a coating method such as spin coating and roll coater is used, after coating of a material for an insulating film which is dissolved in an organic solvent, the material is subjected to heat treatment so that an insulating layer formed from silicon oxide can be used. For example, a coating film containing silicon bonds is formed so that an insulating layer which can be formed through heat treatment at 200 to 400° C. can be used. When an insulating layer formed by a coating method or an insulating layer which is planarized by reflow is formed as the insulating layer 821, disconnection of a wiring provided over the insulating layer can be prevented. Further, such a method can be effectively used in forming a multilayer wiring.

The wirings 907 formed over the insulating layer 821 can be provided to be intersected with a wiring formed in the same layer as the gate electrode 904. A multilayer wiring structure is formed. A plurality of insulating layers having a function similar to that of the insulating layer 821 is stacked and a wiring is formed thereover so that a multilayer structure can be formed. The wiring 907 is preferably formed in combination of a low resistance material such as aluminum (Al) and a barrier metal using a high melting point metal material such as titanium (Ti) or molybdenum (Mo), for example, in a stacked-layer structure of titanium (Ti) and aluminum (Al), a stacked-layer structure of molybdenum (Mo) and aluminum (Al), or the like.

Figure 11B:
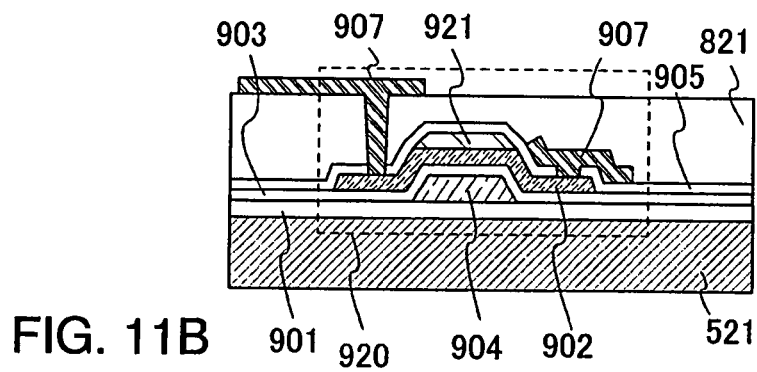

FIG. 11B shows an example of applying a bottom-gate thin film transistor. An insulating layer 901 is formed over an insulating substrate 521, and a thin film transistor 920 is provided thereover. In the thin film transistor 920, a gate electrode 904, an insulating layer 903 serving as a gate insulating layer, and a semiconductor layer 902 are provided, and a channel protective layer 921, an insulating layer 905 serving as a protective layer, and an insulating layer 821 serving as an interlayer insulating layer are provided thereover. Further, an insulating layer serving as a protective layer may also be provided thereover. Wirings 907 each connected to a source region and a drain region of the semiconductor layer can be formed over the insulating layer 905 or the insulating layer 821. Note that the insulating layer 901 may not be provided in the case of the bottom-gate thin film transistor.

When the substrate 521 is a flexible substrate, the substrate 521 has a lower heat resistant temperature as compared to a non-flexible substrate such as a glass substrate. Therefore, the thin film transistor is preferably formed using an organic semiconductor.

Figure 11C:
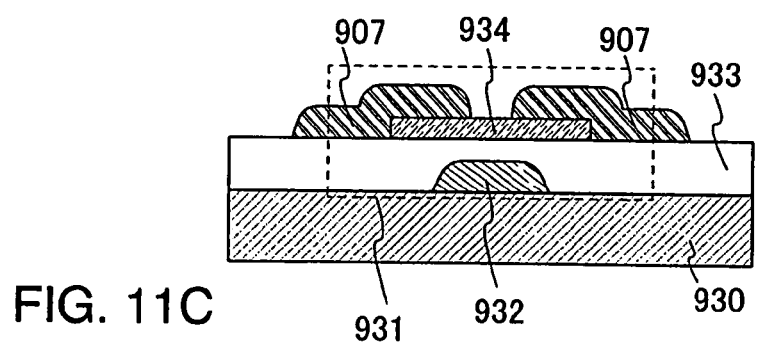

Here, a structure of a thin film transistor formed using an organic semiconductor will be explained with reference to FIGS. 11C and 11D. FIG. 11C shows an example where a staggered organic semiconductor transistor is applied. An organic semiconductor transistor 931 is provided over a flexible substrate 930. The organic semiconductor transistor 931 includes a gate electrode 932, an insulating layer 933 serving as a gate insulating film, a semiconductor layer 934 which is provided in a place where the gate electrode 932 and the insulating layer 933 are overlapped, and wirings 907 being connected to the semiconductor layer 934. Note that the semiconductor layer is in contact with the insulating layer 933 serving as a gate insulating film and the wirings 907.

The gate electrode 932 can be formed using a material and a method similar to those of the gate electrode 904. In addition, the gate electrode 932 can also be formed by being dried and baked with the use of a droplet discharging method. Moreover, a paste containing conductive fine particles is printed over the flexible substrate by a printing method and the paste is dried and baked so that the gate electrode 932 can be formed. As a typical example of the conductive fine particles, fine particles mainly containing any one of gold, copper, an alloy of gold and silver, an alloy of gold and copper, an alloy of silver and copper, and an alloy of gold, silver, and copper may also be used. Further, fine particles mainly containing conductive oxide such as indium tin oxide (ITO) as their main component may also be used.

The insulating layer 933 serving as a gate insulating film can be formed using a material and a method similar to those of the insulating layer 903. However, when the insulating layer is formed by heat treatment after coating of a material for an insulating film which is dissolved in an organic solvent, the heat treatment is performed at a temperature lower than a heat resistant temperature of the flexible substrate.

As a material for the semiconductor layer 934 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetra-cyanoquinodimethane), PTCDA (a perylene carboxylic acid anhydrous compound), NTCDA (a naphthalenecarboxylic acid anhydrous compound), or the like can be used. Moreover, as a material for the semiconductor layer 934 of the organic semiconductor transistor, a pi-conjugated system high molecule such as an organic high molecular compound, carbon nanotube, polyvinyl pyridine, a phthalocyanine metal complex, and the like can be given. In particular, a pi-conjugated system high molecule composed of a conjugated double bond such as polyacetylene, polyaniline, polypyrrole, polythienylene, a polythiophene derivative, poly(3alkylthiophene), a polyparaphenylene derivative, or a polyparaphenylenevinylene derivative, is preferably used.

As a method for forming the semiconductor layer of the organic semiconductor transistor, a method whereby a film having a uniform thickness can be formed over a substrate may be used. The thickness of the semiconductor layer is preferably set to be greater than or equal to 1 nm and less than or equal to 1000 nm, and much preferably, greater than or equal to 10 nm and less than or equal to 100 nm. As a specific method of the semiconductor layer, an evaporation method, a coating method, a spin coating method, a overcoat method, a solution cast method, a dipping method, a screen printing method, a roll coater method, or a droplet discharging method can be used.

Figure 11D:
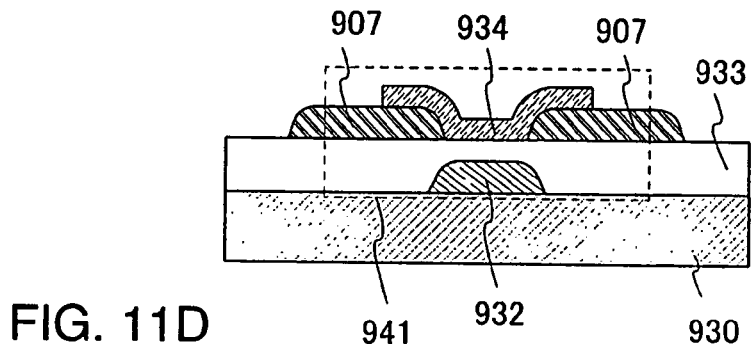

FIG. 11D shows an example of applying a coplanar organic semiconductor transistor. An organic semiconductor transistor 941 is provided over a flexible substrate 930. The organic semiconductor transistor 941 includes a gate electrode 932, an insulating layer 933 serving as a gate insulating film, a semiconductor layer 934 which is provided in a place where the gate electrode 932 and the insulating layer 933 are over-lapped, and wirings 907 being connected to the semiconductor layer 934. In addition, the wirings 907 connected to the semiconductor layer 934 are each in contact with the insulating layer serving as a gate insulating film and the semiconductor layer.

Further, the thin film transistor and the organic semiconductor transistor may be provided to have any structure as long as they can serve as switching elements.

Furthermore, a transistor may be formed using a single crystalline substrate or an SOI substrate, and a memory element may be provided thereover. The SOI substrate may be formed by using a method in which a wafer is attached, a method of forming an insulating layer 831 in an interior portion by implanting of an oxygen ion in an Si substrate, which is referred to as an SIMOX (see FIG. 10C).

Figure 10C:
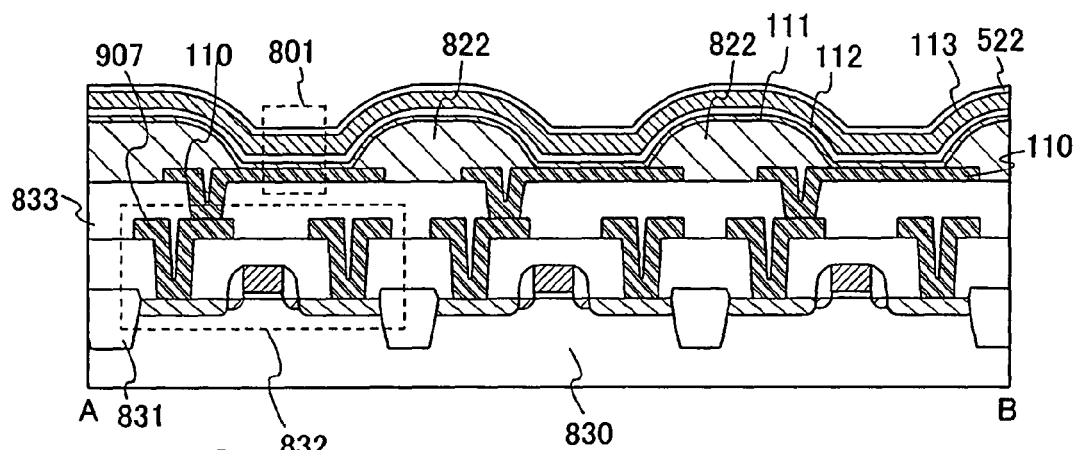

For example, when a single crystalline semiconductor is used for the substrate, as shown in FIG. 10C, a memory element 801 is connected to a field-effect transistor 832 provided using a single crystalline semiconductor substrate 830. In addition, an insulating layer 833 is provided so as to cover a wiring of the field-effect transistor 832, and the memory element 801 is provided over the insulating layer 833.

Since the transistor formed using such a single crystalline semiconductor has favorable characteristics of response speed and mobility, it is possible to provide a transistor which can be operated at high speed. In addition, such a transistor has slight variation in its characteristics; therefore, a highly-reliable semiconductor device can be provided.

Note that the memory element 801 includes a first conductive layer 110, a semiconductor layer 111, an organic compound layer 112, and a second conductive layer 113 formed over the insulating layer 833, where the semiconductor layer 111 and the organic compound layer 112 are interposed between the first conductive layer 110 and the second conductive layer 113. Note that the semiconductor layer 111 is formed over and in contact with the first conductive layer 110.

In such a manner, the memory element 801 is formed after the insulating layer 833 is provided so that the first conductive layer 110 can be freely arranged. In other words, the memory element has to be provided in a region outside a wiring connected to the transistor, in the structure shown in FIGS. 10A and 10B. However, by the insulating layer 833 being provided, it becomes possible to form, for example, the memory element 801 above the transistor 832 as shown in FIG. 10C. As a result, a memory circuit can be highly integrated.

In the structures each shown in FIGS. 10B and 10C, the semiconductor layer 111 and the organic compound layer 112 are provided over the entire surface of the substrate. Alternatively, the organic compound layer may be provided only in each memory cell. In this case, an organic compound is discharged using a droplet discharging method or the like and baked to selectively form organic compound layers; therefore, it becomes possible to improve material use efficiency.

Figure 12:
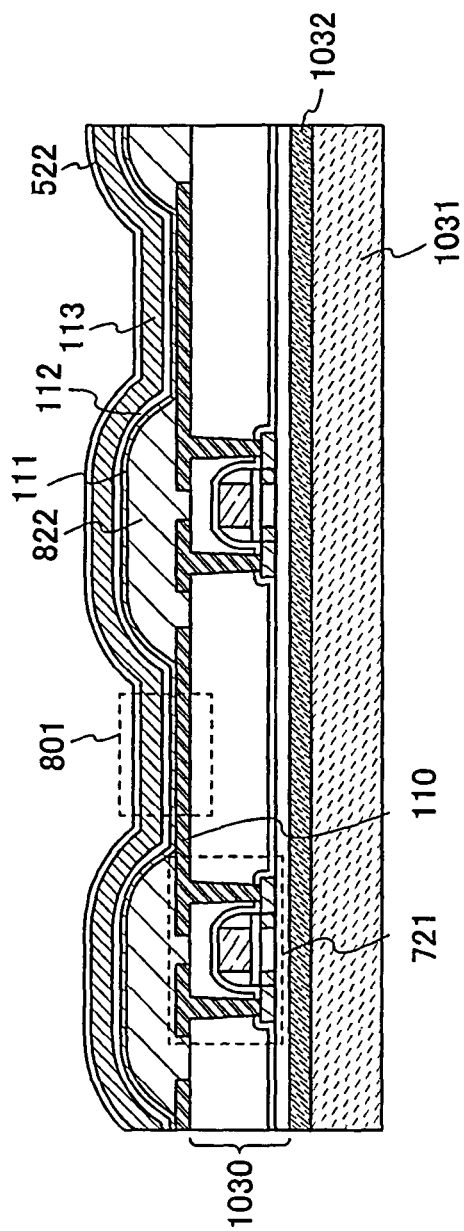
FIG. 12 is a view explaining a structural example of a semiconductor device of the present invention.

Moreover, a peeling layer is provided over a substrate and a layer 1030 having a transistor and a memory element 801 are formed over the peeling layer. Thereafter, the layer 1030 having the transistor and the memory element 801 may be peeled from the substrate with the use of the peeling layer, and the layer 1030 having the transistor and the memory element 801 may be attached to a substrate 1031, which is different from the substrate, with the use of an adhesive layer 1032, as shown in FIG. 12. As a peeling method, the following four methods and the like may be used: a first peeling method where a metal oxide layer is provided as a peeling layer between a substrate having high heat resistance and a layer having a transistor, and the metal oxide layer is weakened by crystallization so as to peel the layer having the transistor; a second peeling method where an amorphous silicon film containing hydrogen is provided as a peeling layer between a substrate having high heat resistance and a layer having a transistor, and the amorphous silicon film is removed by laser light irradiation or etching so as to peel the layer having the transistor; a third peeling method where a substrate having high heat resistance over which a layer having a transistor is formed, is mechanically removed or removed by etching with the use of a solution or halogen fluoride gas such as $NF_3$, $BrF_3$, or $ClF_3$; and a fourth peeling method where, after a metal layer and a metal oxide layer are provided as peeling layers between a substrate having high heat resistance and a layer having a transistor, the metal oxide layer is weakened by crystallization, and part of the meal layer is removed by etching with the use of a solution or halogen fluoride gas such as $NF_3$, $BrF_3$, or $ClF_3$, and then the weakened metal oxide layer is physically peeled.

When a flexible substrate, a film, paper made from a fibrous material, or the like which is like the substrate 521 shown in Embodiment Mode 2 is used as the substrate 1031, a small, thin, and lightweight memory device can be realized.

Next, an operation in writing data in the memory device, that is, the semiconductor device 700 will be explained with reference to FIG. 9A. As with Embodiment Mode 2, here, an operation in writing data by an electric action, typically, by voltage applied thereto will be explained. Note that the data is written by change of the electrical characteristics of the memory cell, and "0" and "1" refer to data in an initial state (a state where an electric action is not applied) of the memory cell and data in a state where the electrical characteristics are changed, respectively.

A case of writing data in the memory cell 701 in the x-th row and the y-th column will be explained. When data "1" is written in the memory cell 701, first, the memory element 701 is selected by the decoders 712 and 713, and the selector 714. Specifically, predetermined potential V2 is applied to the word line Wy connected to the memory cell 701 by the decoder 713. In addition, the bit line Bx connected to the memory cell 701 is connected to the readout/write circuit 715 by the decoder 712 and the selector 714. Then, writing potential V21 is output to the bit line Bx from the readout/write circuit 715.

The thin film transistor 721 that forms the memory cell is made in an on state in such a manner, a common electrode and the bit line are electrically connected to the memory element 722, and a voltage of about Vw=Vcom−V21 is applied. Vcom is a common electrode in the memory element 722, that is, potential of the second conductive layer. By the potential Vw being properly selected, the layer containing an organic compound provided between the conductive layers is physically or electrically changed; thus, the data "1" is written in the memory element. Specifically, in voltage of reading out operation, electric resistance between the first conductive layer and the second conductive layer in the state of the data "1" is preferably reduced significantly as compared to a case of being in a state of the data "0", and short circuit (short) may simply be made to occur between the first conductive layer and the second conductive layer. Note that the potential may be appropriately selected from the range of (V21, V22, and Vcom)=(5 to 15 V, 5 to 15 V, and 0 V) or (−12 to 0 V, −12 to 0 V, and 3 to 5 V). The voltage Vw may be greater than or equal to 5 V and less than or equal to 15 V or greater than or equal to −15 V and less than or equal to −5 V.

Note that non-selected word lines and non-selected bit lines are controlled so that the data "1" is not written in the memory cells connected to the non-selected word and bit lines. Specifically, potential, whereby transistors of memory cells connected to the non-selected word lines are made in an off state, may be applied to the non-selected word lines or potential which is the same level as Vcom may be applied.

On the other hand, when data "0" is written in the memory cell 701, an electric action may not be applied to the memory cell 701. As for a circuit operation, for example, the memory element 701 is selected by the decoders 712 and 713, and the selector 714 as well as the case of writing data "1"; however, the output potential from the readout/write circuit 715 to the bit line Bx is set to be the same degree as Vcom or to be potential of the selected word line W3 or potential whereby the thin film transistor 721 of the memory cell is made in an off state. As a result, low voltage (for example, −5 to 5 V) is applied to the memory element 722 or no voltage is applied to the memory element 722; therefore, electrical characteristics of the memory element are not changed and writing of the data "0" can be realized.

Next, an operation in reading out data by an electric action will be explained with reference to FIG. 9B. Data is read out by utilization of difference in electrical characteristics of the memory elements 722, which are different between a memory cell having data "0" and another memory cell having data "1". For example, a method for reading out data by utilization of difference in electric resistance will be described under conditions where electric resistance of a memory element that forms a memory cell having the data "0" is set to be R0 at a reading voltage, and electric resistance of a memory element that forms a memory cell having the data "1" is set to be R1 at a reading voltage. Note that R1<<R0. As a structure of a readout portion of the readout/write circuit 715, for example, a circuit using a resistance element 750 and a differential amplifier 751 which is shown in FIG. 9B can be considered. The resistance element has resistance Rr, where R1<Rr<R0. Instead of the resistance element 750, a transistor 752 may be used as shown in FIG. 9C or a clocked inverter 753 can also be used instead of the differential amplifier 751. Of course, the circuit configuration is not limited to FIGS. 9B and 9C.

When data is read out from a memory cell 702 in the x-th row and the y-th column, the memory cell 702 is selected by decoders 712 and 713, and a selector 714. Specifically, predetermined potential V24 is applied to a word line Wy connected to the memory cell 702 by the decoder 713, and the thin film transistor 721 is turned on. A bit line Bx connected to the memory cell 702 is connected to a terminal P of the readout/write circuit 715 by the decoder 712 and the selector 714. As a result, potential Vp of the terminal P becomes a value which is determined by resistance division of Vcom and V0 caused by the resistance element 750 (resistance Rr) and the memory element 722 (resistance R0 or R1). Therefore, in a case where the memory cell 702 has the data "0", potential Vp0 of the terminal P is Vp0=Vcom+(V0−Vcom)×R0/(R0+Rr). When the memory cell 702 has the data "1", potential Vp1 of the terminal P is Vp1=Vcom+(V0−Vcom)×R1/(R1+Rr). As a result, by selection of Vref to be between Vp0 and Vp1 in FIG. 9B and selection of a change point of the clocked inverter to be between Vp0 and Vp1 in FIG. 9C, Lo/Hi (or Hi/Lo) of an output potential Vout is output in accordance with the data "0" or data "1", and hence, the data can be read out.

For example, it is assumed that the differential amplifier 751 is operated at Vdd=3 V, and Vcom is set to be 0 V; V0, 3 V; and Vref, 1.5 V. If R0/Rr=Rr/R1=9 and on-resistance of the thin film transistor 721 can be ignored, in a case where a memory cell has the data "0", Vp0 becomes 2.7 V and Hi is output as Vout. Meanwhile, in a case where a memory cell has the data "1", Vp1 becomes 0.3 V and Lo is output as Vout. In such a manner, readout of memory cells can be performed.

According to the above method, data is read out by the amount of voltage while utilization of a difference in resistance of the memory elements 722 and resistance division. Of course, the method for reading out data is not limited to this method. For example, data may be read out by utilization of difference in the amount of current besides utilization of difference in electronic resistance. Moreover, data may also be read out by utilization of difference in threshold voltage when the electrical characteristics of the memory cells have diode characteristics which are different in threshold voltage between a memory cell having data "0" and another memory cell having data "1".

In addition, a thin film transistor (TFT) may be provided over a substrate having an insulating property, and the memory element or a memory element array may be provided thereover. Alternatively, instead of the substrate having an insulating property, a semiconductor substrate such as an Si substrate or an SOI substrate may be used to form a field-effect transistor (FET) over the substrate, and the memory element or a memory element array may be provided thereover.

The memory element of the present invention is included in the semiconductor device described in this embodiment mode so that it is possible to suppress abnormal behavior such as breakdown of the conductive layer or the like and an insulating state of the memory element. Therefore, the range of reading voltages which are obtained is expanded, and flexibility in designing the semiconductor device is improved.

Moreover, data can be written in the semiconductor device not only once but can also be written additionally. On the other hand, since it is impossible to erase data of a memory element where writing is once performed, it is possible to prevent forgery by rewriting. Further, since the memory element of the present invention has a simple structure where a semiconductor layer and an organic compound layer are interposed between a pair of conductive layers, it becomes possible to manufacture a memory element superior in terms of performance and reliability at a low cost.

Note that this embodiment mode can be freely combined with other embodiment modes and embodiments.

Embodiment Mode 4

This embodiment mode will explain a structural example of a semiconductor device having the memory element which is shown in the above embodiment modes, with reference to drawings.

One feature of the semiconductor device shown in this embodiment mode is that data can be read out from and written in the semiconductor device without contact. Data transmitting types can be largely classified into three of an electromagnetic coupling type in which a pair of coils is placed to face each other and communication is performed by mutual induction; an electromagnetic induction type in which communication is performed by an induction field; and a radio wave type in which communication is performed by utilization of radio waves, and any type can be employed. Moreover, there are two types of layouts of an antenna used for transmitting data: one is a case where an antenna is provided over a substrate over which a transistor and a memory element are provided; and the other is a case where a terminal portion is provided over a substrate over which a transistor and a memory element are provided and an antenna, which is provided over the other substrate, is connected to the terminal portion.

Figure 13A:
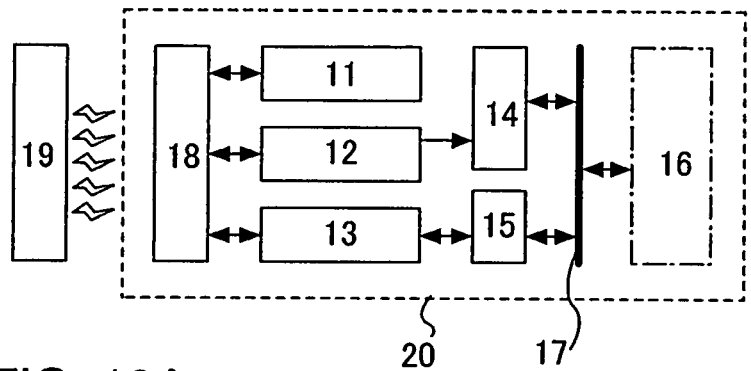
FIGS. 13A to 13C are views each explaining a structural example of a semiconductor device of the present invention.

Structures of semiconductor devices shown in this embodiment mode will be explained with reference to FIGS. 13A to 13C. As shown in FIG. 13A, a semiconductor device 20 of the present invention has a function of receiving/sending data without contact, and includes a power supply circuit 11, a clock generation circuit 12, a data demodulation/modulation circuit 13, a control circuit 14 controlling other circuits, an interface circuit 15, a memory circuit 16, a bus 17, and an antenna 18.

Figure 13B:
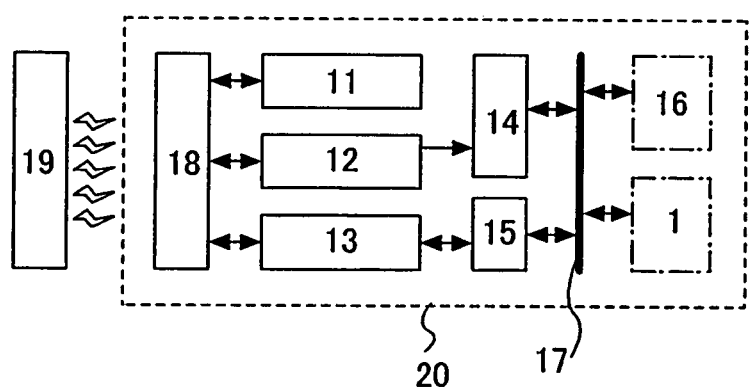

In addition, as shown in FIG. 13B, the semiconductor device 20 of the present invention has a function of receiving/sending data without contact, and may include a central processing unit 1, in addition to the power supply circuit 11, the clock generation circuit 12, the data demodulation/modulation circuit 13, the control circuit 14 controlling other circuits, the interface circuit 15, the memory circuit 16, the bus 17, and the antenna 18.

Figure 13C:
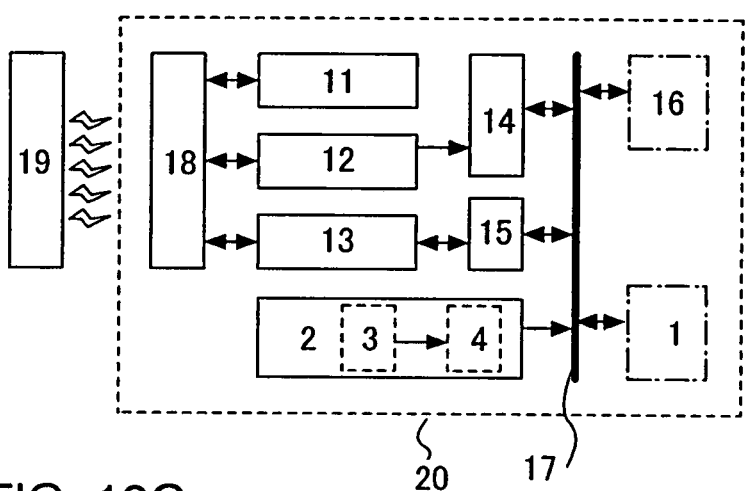

As shown in FIG. 13C, the semiconductor device 20 of the present invention has a function of receiving/sending data without contact, and may include a detecting portion 2 including a detecting element 3 and a detection control circuit 4, in addition to the power supply circuit 11, the clock generation circuit 12, the data demodulation/modulation circuit 13, the control circuit 14 controlling other circuits, the interface circuit 15, the memory circuit 16, the bus 17, the antenna 18, and the central processing unit 1.

The power supply circuit 11 generates various kinds of power sources to be supplied to various circuits inside of the semiconductor device 20 based on alternating current signals input from the antenna 18. The clock generation circuit 12 generates various clock signals to be supplied to various circuits inside of the semiconductor device 20 based on alternating current signals input from the antenna 18. The data demodulation/modulation circuit 13 includes a function of demodulating/modulating data for communicating with a reader/writer 19. The control circuit 14 has a function of controlling the memory circuit 16. The antenna 18 has a function of sending and receiving electromagnetic waves or radio waves. The reader/writer 19 controls communication with the semiconductor device and processing of data of communication. Note that the semiconductor device is not limited to the above structures. For example, the semiconductor device may further include other elements such as a limiter circuit of power voltage and hardware for encryption processing.

The memory circuit 16 includes one or a plurality of memory elements selected from the memory elements shown in Embodiment Mode 1. The memory element of the present invention is included so that it is possible to suppress abnormal behavior such as breakdown of the conductive layer or the like and an insulating state of the memory element. Therefore, the range of reading voltages which are obtained is expanded, and flexibility in designing the semiconductor device is improved.

Moreover, the chance of writing data in the memory element is not only once but can also be written additionally. On the other hand, since it is impossible to erase data of a memory element where writing is once performed, it is possible to prevent forgery by rewriting.

The detecting portion 2 can detect temperature, pressure, flow rate, light, magnetism, sonic waves, acceleration, humidity, a gas component, a fluid component, and other characteristics by physical means or chemical means. The detecting portion 2 includes the detecting element 3 for detecting a physical quantity or a chemical quantity and the detection control circuit 4, which converts a physical quantity or a chemical quantity detected by the detecting element 3 into a suitable signal such as an electrical signal. The detecting element 3 can be formed using a resistance element, a capacitance coupled element, an inductively-coupled element, a photovoltaic element, a photoelectric conversion element, a thermovoltaic element, a transistor, a thermistor, a diode, or the like. Note that a plurality of detecting portions 2 may be provided. In this case, a plurality of physical quantities or chemical quantities can be detected simultaneously.

Further, the physical quantities mentioned here indicate temperature, pressure, flow rate, light, magnetism, sonic waves, acceleration, humidity, and the like. The chemical quantities mentioned here indicate chemical substances and the like such as a gas component like a gas and a fluid component like an ion. In addition to the above, the chemical quantities further include an organic compound like a certain biologic material contained in blood, sweat, urine, and the like (for example, a blood-sugar level contained in blood). In particular, in order to detect a chemical quantity, a certain substance is inevitably detected selectively, and therefore, a substance to be detected and a substance which is selectively reacted are provided in advance in the detecting element 3. For example, when detecting a biologic material, enzyme, an antibody molecule, a microbial cell, and the like, which are selectively reacted with the biologic material to be detected by the detecting element 3, are preferably immobilized to a high molecule and the like.

Figure 14A:
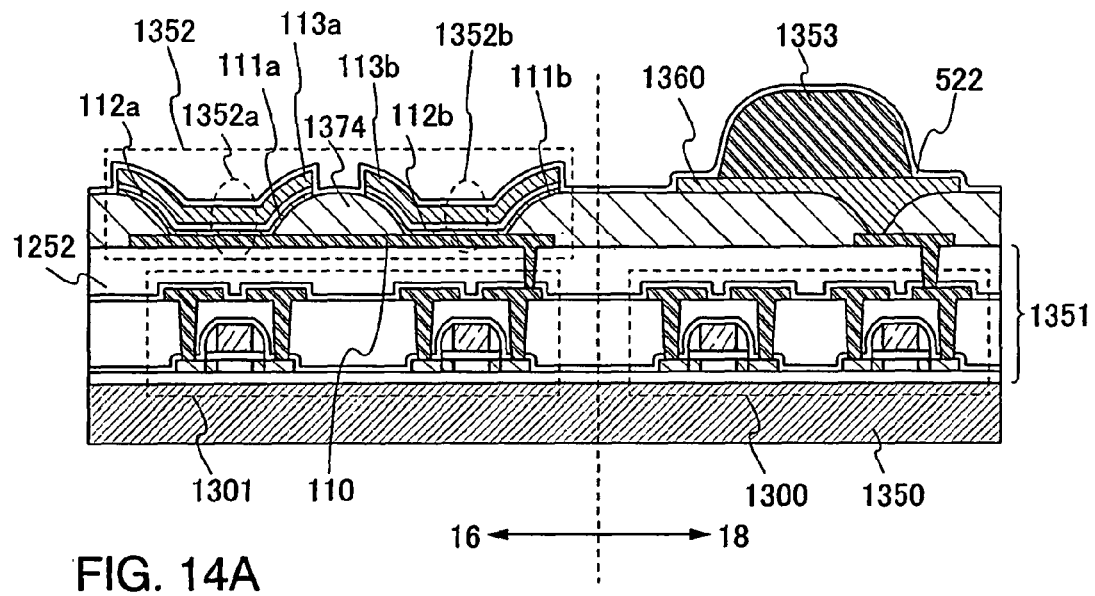
FIGS. 14A and 14B are views each explaining a cross-sectional part of a semiconductor device of the present invention.
Figure 14B:
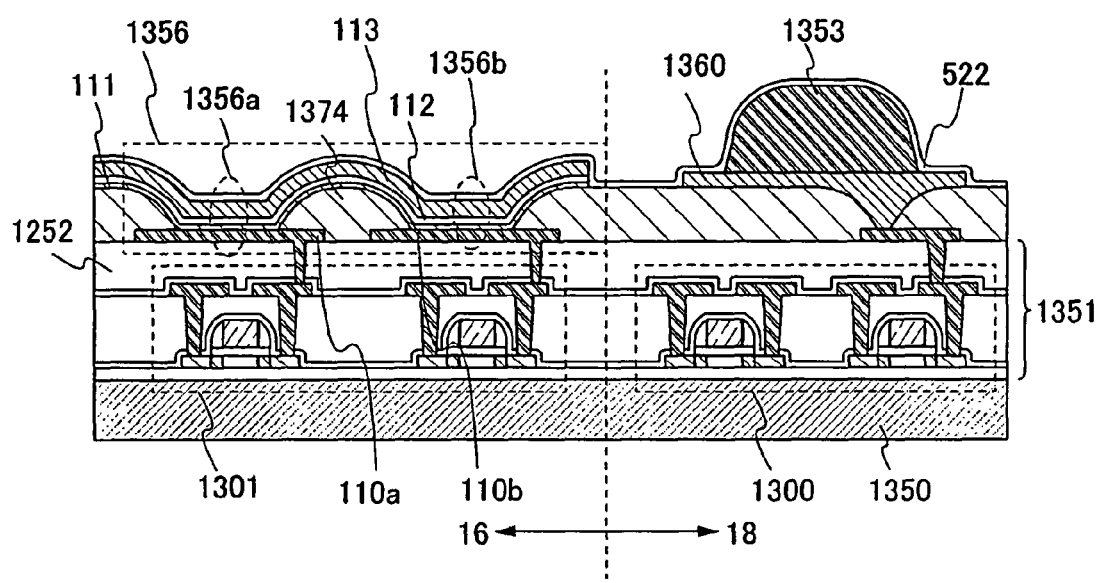

Next, FIGS. 14A and 14B each show part of a cross-sectional view where the memory element 16 and the antenna 18 are formed in a semiconductor device where an antenna is provided over a substrate over which a plurality of elements and a memory element are provided.

FIG. 14A shows a semiconductor device having a passive matrix type memory circuit. Over a substrate 1350, the semiconductor device includes a layer 1351 having transistors 1300 and 1301, a memory element portion 1352 formed above the layer 1351 having the transistors, and a conductive layer 1353 serving as an antenna.

Note that a case where the semiconductor device includes the memory element portion 1352 and the conductive layer 1353 serving as an antenna above the layer 1351 having the transistors; however, the present invention is not limited to this structure. The memory element portion 1352 or the conductive layer 1353 serving as an antenna may be provided below or in the same layer as the layer 1351 having the transistors.

The memory element portion 1352 has a plurality of memory elements 1352a and 1352b. The memory element 1352a includes a first conductive layer 110, a semiconductor layer 111a covering parts of partition walls (insulating layers) 1374 and the first conductive layer 110, and further an organic compound layer 112a and a second conductive layer 113a covering the semiconductor layer 111a which are formed over an insulating layer 1252. In addition, the memory element 1352b includes the first conductive layer 110, a semiconductor layer 111b covering parts of the partition walls (insulating layers) 1374 and the first conductive layer 110, and further an organic compound layer 112b and a second conductive layer 113b covering the semiconductor layer 111b.

In addition, an insulating layer 522 serving as a protective film is formed to cover the second conductive layers 113a and 113b and the conductive layer 1353 serving as an antenna. The first conductive layer 110 of the memory element portion 1352 is connected to a wiring of the transistor 1301. The memory element portion 1352 can be formed using a material and a manufacturing method similar to those of the memory element shown in the above embodiment modes.

The conductive layer 1353 serving as an antenna is provided over a conductive layer 1360 which is formed in the same layer as the second conductive layers 113a and 113b. Note that the conductive layer serving as an antenna may be formed in the same layer as the second conductive layers 113a and 113b. The conductive layer 1353 serving as an antenna is connected to a wiring of the transistor 1300.

The conductive layer 1353 serving as an antenna is formed from a conductive material with the use of a CVD method, a sputtering method, a printing method such as screen printing or gravure printing, a droplet discharging method, a dispenser method, a plating method, or the like. As for the conductive material, an element of aluminum (Al), titanium (Ti), silver (Ag), copper (Cu), gold (Au), platinum (Pt), nickel (Ni), palladium (Pd), tantalum (Ta), and molybdenum (Mo) or an alloy material or a compound material containing these elements as its main component is formed in a single-layer or stacked-layer structure.

When the conductive layer serving as an antenna is formed using a screen printing method, for example, a conductive paste where conductive particles each having a grain size of several nm to several tens of µm, are dissolved or dispersed in an organic resin is selectively printed so that the conductive layer serving as an antenna can be provided. As each conductive particle, a metal particle any one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersive nanoparticles can be used. In addition, as the organic resin included in the conductive paste, one or a plurality of organic resins each serving as a binder, a solvent, a dispersant, or a coating member of the metal particle can be used. Typically, an organic resin such as an epoxy resin or a silicon resin can be used. When forming the conductive layer, baking is preferably performed after the conductive paste is pushed out. For example, when fine particles (for example, the grain size greater than or equal to 1 nm and less than or equal to 100 nm) containing silver as its main component are used, as a material of the conductive paste, the conductive layer can be obtained by being cured by baking at temperatures of 150 to 300° C. Alternatively, fine particles containing solder or lead-free solder as its main component may be used. In this case, it is preferable to use fine particles each having a grain size of less than or equal to 20 µm. Solder or lead-free solder has an advantage of low cost. Moreover, besides the above materials, ceramic, ferrite, or the like may be applied.

The transistors shown in Embodiment Mode 3 or the like can be appropriately selected and used for the transistors 1300 and 1301 included in the layer 1351 having the transistors.

Moreover, a peeling layer is provided over the substrate; the layer 1351 having the transistors, the memory element portion 1352, and the conductive layer 1353 serving as an antenna are formed over the peeling layer; and the layer 1351 having the transistors, the memory element portion 1352, and the conductive layer 1353 serving as an antenna are appropriately peeled using the peeling method shown in Embodiment Mode 3, which may be attached over a substrate with the use of an adhesive layer. As the substrate, a flexible substrate, a film, paper made from a fibrous material, or the like which is shown as the substrate 521 in Embodiment Mode 2 is used so that it is possible to achieve a small, thin, and lightweight memory device.

FIG. 14B shows an example of a semiconductor device having an active matrix type memory circuit. Note that portions in FIG. 14B which are different from those in FIG. 14A will be explained.

Over a substrate 1350, the semiconductor device shown in FIG. 14B includes a layer 1351 having transistors 1300 and 1301, a memory element portion 1356 and a conductive layer 1353 serving as an antenna above the layer 1351 having the transistors. Note that a case where the memory element portion 1356 and the conductive layer 1353 serving as an antenna are formed above the layer 1351 having the transistors; however, the present invention is not limited to this structure. The memory element portion 1356 and the conductive layer 1353 serving as an antenna may be formed above or below the layer 1351 having the transistor 1301 or can be formed below or in the same layer as the layer 1351 having the transistors.

The memory element portion 1356 includes memory elements 1356a and 1356b. The memory element 1356a includes a first conductive layer 110a, a semiconductor layer 111 covering the first conductive layer 110a and partition walls (insulating layers) 1374, and an organic compound layer 112 and a second conductive layer 113 covering the semiconductor layer 111 which are formed over an insulating layer 1252. The memory element 1356b includes a first conductive layer 110b, the semiconductor layer 111, the organic compound layer 112, and the second conductive layer 113 which are formed over the insulating layer 1252. In addition, a wiring of the transistor is connected to each first conductive layer included in the memory element. In other words, the memory elements are connected to respective transistors.

In addition, a peeling layer is provided over the substrate; the layer 1351 having the transistors, the memory element portion 1356, and the conductive layer 1353 serving as an antenna are formed over the peeling layer; and the layer 1351 having the transistors, the memory element portion 1356, and the conductive layer 1353 serving as an antenna are appropriately peeled using the peeling method shown in Embodiment Mode 3, which may be attached over a substrate with the use of an adhesive layer.

Next, a structural example of a semiconductor device including a first substrate having a layer having transistors, a terminal portion being connected to the antenna, and a memory element, and a second substrate over which an antenna being connected to the terminal portion is formed will be explained with reference to FIGS. 15A and 15B. Note that portions in FIGS. 15A and 15B which are different from those in FIGS. 14A and 14B will be explained.

Figure 15A:
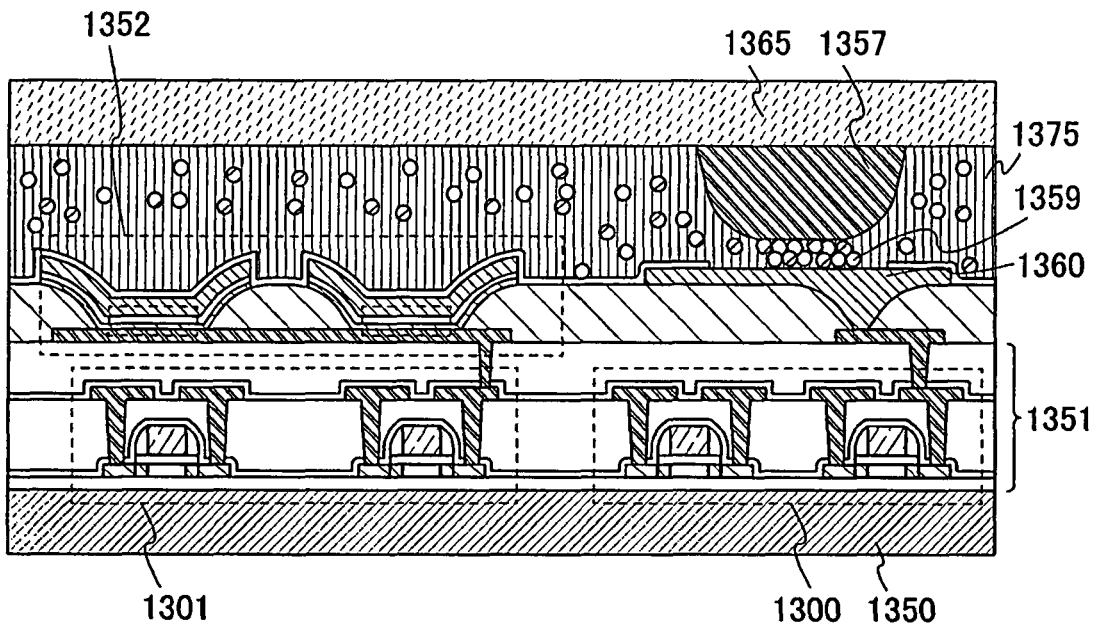
FIGS. 15A and 15B are views each explaining a cross-sectional part of a semiconductor device of the present invention.

FIG. 15A shows a semiconductor device having a passive matrix type memory device. The semiconductor device includes a layer 1351 having transistors 1300 and 1301, a memory element portion 1352 formed above the layer 1351 having the transistors, a terminal portion connected to an antenna, and a substrate 1365 over which a conductive layer 1357 serving as an antenna is formed, which are formed over a substrate 1350; and the conductive layer 1357 and a conductive layer 1360 to be a connection terminal are connected to each other by conductive particles 1359 contained in a resin 1375. Note that the substrate 1350 including the layer 1351 having the transistors, the memory element portion 1352, and the like and the substrate 1365 provided with the conductive layer 1357 serving as an antenna are attached to each other by the resin 1375 having an adhesive property.

Alternatively, the conductive layer 1357 serving as an antenna and the conductive layer 1360 to be a connection terminal may be connected to each other using a conductive adhesive agent such as a silver paste, a copper paste, and a carbon paste or a solder joint method. Note that a case in which the memory element portion 1352 is provided above the layer 1351 having the transistors is shown here; however, the present invention is not limited to this structure. The memory element portion 1352 may be provided below or in the same layer as the layer 1351 having the transistors.

Figure 15B:
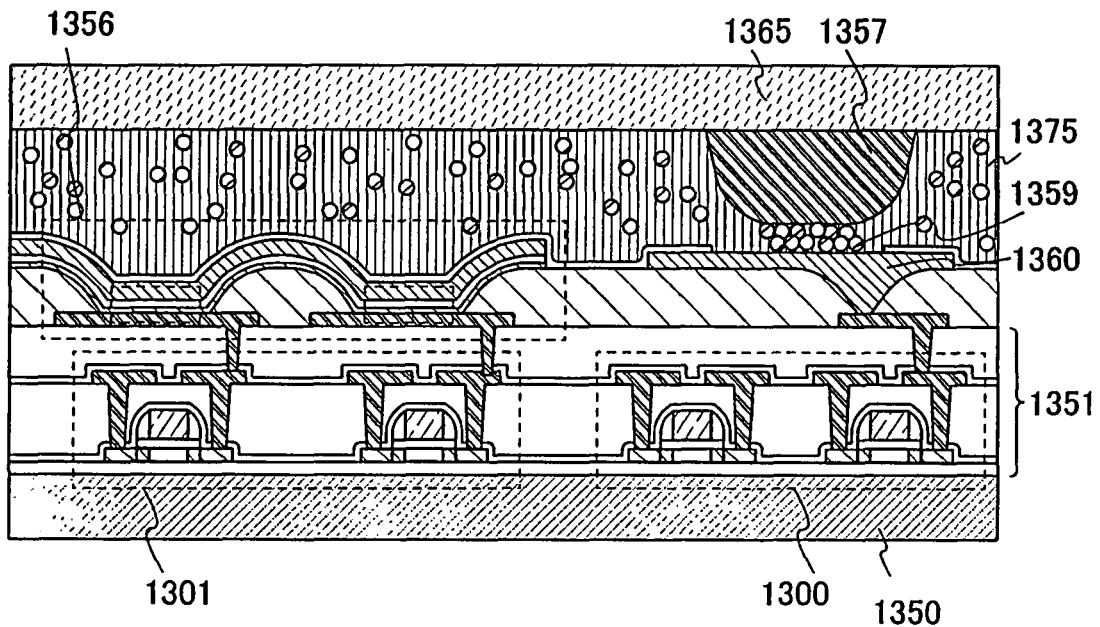

FIG. 15B shows a semiconductor device having an active matrix type memory device. The semiconductor device includes a layer 1351 having transistors 1300 and 1301, a memory element portion 1356 formed above the layer 1351 having the transistors, a terminal portion connected to the transistors, and a substrate 1365 over which a conductive layer 1357 serving as an antenna is formed, which are formed over a substrate 1350; and the conductive layer 1357 and a conductive layer 1360 to be a connection terminal are connected to each other by conductive particles 1359 contained in a resin 1375. Note that the substrate 1350 including the layer 1351 having the transistors, the memory element portion 1356, and the like and the substrate 1365 provided with the conductive layer 1357 serving as an antenna are attached to each other by the resin 1375 having an adhesive property.

Alternatively, the substrate 1350 including the layer 1351 having the transistors, the memory element portion 1356, and the like and the substrate 1365 provided with the conductive layer 1357 serving as an antenna may be connected to each other using a conductive adhesive agent such as a silver paste, a copper paste, and a carbon paste or a solder joint method. Note that a case in which the memory element portion 1352 is provided above the layer 1351 having the transistors is shown here; however, the present invention is not limited to this structure. The memory element portion 1356 may be provided below or in the same layer as the layer 1351 having the transistors.

In addition, a peeling layer is provided over the substrate; the layer 1351 having the transistors and the memory element portion 1352 or 1356 are formed over the peeling layer; and the layer 1351 having the transistors and the memory element portions 1352 and 1356 are appropriately peeled using the peeling method shown in Embodiment Mode 3, which may be attached over a substrate with the use of an adhesive layer.

Further, each of the memory element portions 1352 and 1356 may be provided over the substrate 1365 over which the conductive layer 1357 serving as an antenna is provided. In other words, a first substrate, over which a layer having transistors is provided, and a second substrate, over which a memory element portion and a conductive layer serving as an antenna are provided, may be attached to each other with the use of a resin containing conductive particles. A sensor being connected to the transistors may also be provided as well as the semiconductor devices shown in FIGS. 14A and 14B.

The memory element of the present invention is included in the semiconductor device described in this embodiment mode so that it is possible to suppress abnormal behavior such as breakdown of the conductive layer or the like and an insulating state of the memory element. Therefore, the range of reading voltages which are obtained is expanded, and flexibility in designing the semiconductor device is improved.

Moreover, data can be written in the semiconductor device not only once but also can be written additionally. On the other hand, since it is impossible to erase data of a memory element where writing is once performed, it is possible to prevent forgery by rewriting. In addition, data can be read out and written without contact. Further, since the memory element of the present invention has a simple structure where a semiconductor layer and an organic compound layer are interposed between a pair of conductive layers, it becomes possible to manufacture a memory element superior in terms of performance and reliability at a low cost.

Note that this embodiment mode can be freely combined with other embodiment modes and embodiments.

Embodiment Mode 5

Figure 16A:
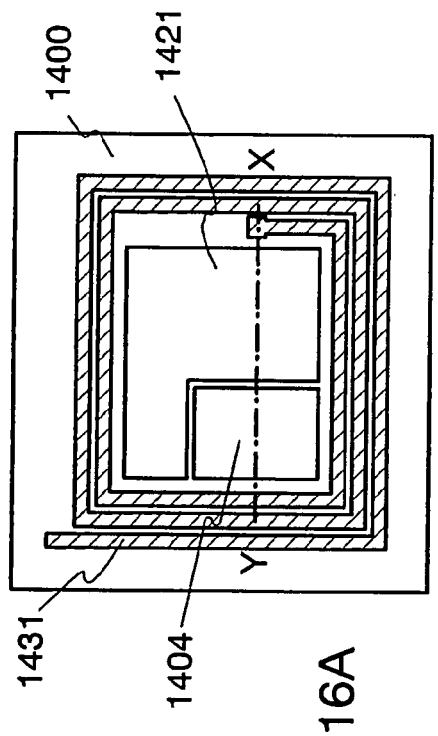
FIGS. 16A and 16B are views each explaining a semiconductor device of the present invention.
Figure 16B:
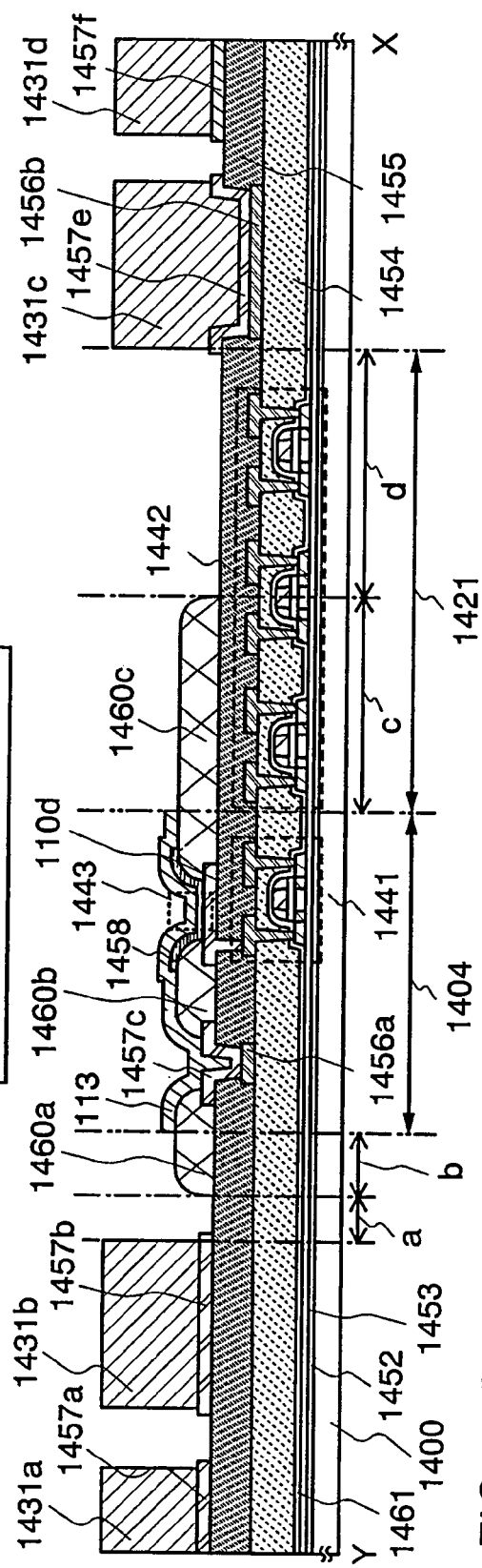
Figure 17A:
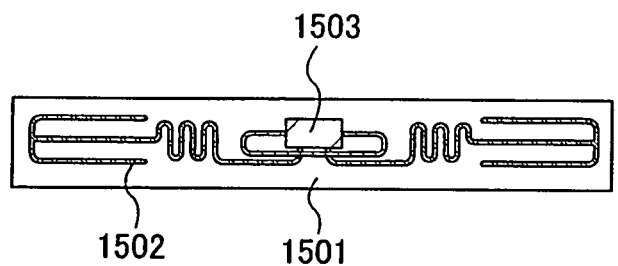
FIGS. 17A to 17D are views each explaining a chip-like semiconductor device of the present invention.
Figure 17B:
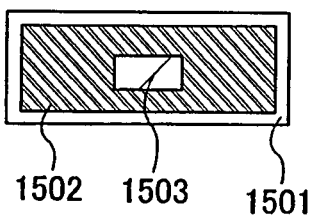
Figure 17C:
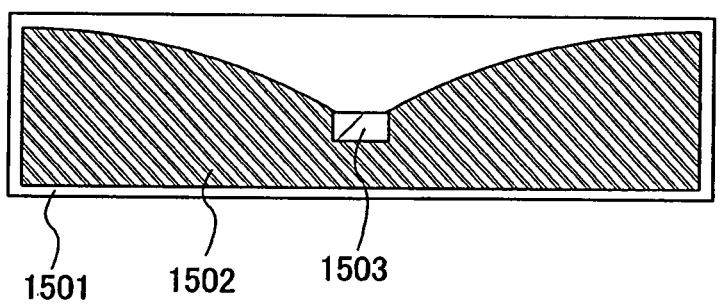
Figure 17D:
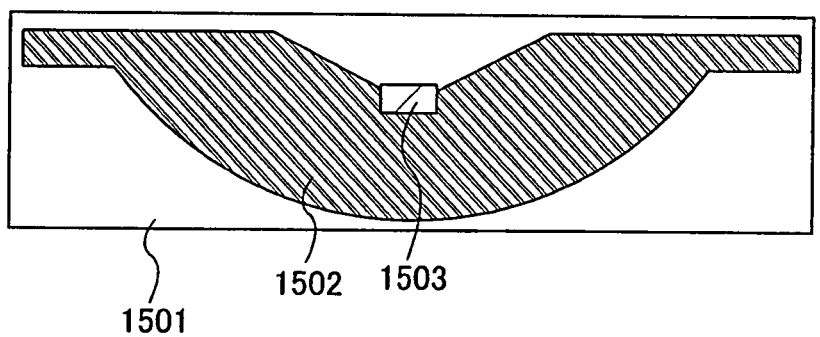

This embodiment mode will explain an example of a semiconductor device having the memory element of the present invention with reference to drawings. FIG. 16A shows a top view of the semiconductor device of this embodiment mode, and FIG. 16B shows a cross-sectional view taken along a line X-Y in FIG. 16A.

As shown in FIG. 16A, a memory element portion 1404 having a memory element, a circuit portion 1421, and an antenna 1431 are formed over a substrate 1400. States shown in FIGS. 16A and 16B are in the middle of a manufacturing process, in which the memory element portion, the circuit portion, and the antenna have been formed over the substrate 1400 capable of resisting the manufacturing condition. The material and manufacturing process may appropriately be selected in a manner similar to the above embodiment modes for manufacturing.

Over the substrate 1400, a transistor 1441 is provided in the memory element portion 1404 while a transistor 1442 is provided in the circuit portion 1421, with a peeling layer 1452 and an insulating layer 1453 interposed therebetween. Insulating layers 1461, 1454, and 1455 are formed over the transistors 1441 and 1442, and a memory element 1443 is formed over the insulating layer 1455. The memory element 1443 includes a first conductive layer 110d, a layer 1458 having a semiconductor layer and an organic compound layer, and a second conductive layer 113 which are provided over the insulating layer 1455. The layer 1458 having the semiconductor layer and the organic compound layer is interposed between the first conductive layer 110d and the second conductive layer 113, and the semiconductor layer is formed over and in contact with the first conductive layer 110d. Note that, although omitted in FIGS. 16A and 16B, a number of the memory elements 1443 are individually isolated by an insulating layer 1460b serving as a partition wall.

The first conductive layer 110d is connected to a wiring layer of the transistor 1441. On the other hand, the second conductive layer 113 is connected to a conductive layer 1457c stacked on a wiring layer 1456a. In addition, a conductive layer and an antenna 1431 shown in FIG. 16A are provided over the insulating layer 1455 by being stacked together. In FIG. 16B, the conductive layer corresponds to conductive layers 1457a, 1457b, 1457e, and 1457f, and the conductive layers 1457a, 1457b, and 1457f are stacked with antennas 1431a, 1431b, and 1431d, respectively. Note that the conductive layer 1457e and an antenna 1431c are each formed in an opening portion that reaches a wiring layer 1456b which is formed in the insulating layer 1455, and the conductive layer 1457e and the wiring layer 1456b are connected to each other. In such a manner, the antennas are electrically connected to the memory element portion 1404 and the circuit portion 1421. In addition, the conductive layers 1457a, 1457b, 1457e, and 1457f formed under the antennas 1431a, 1431b, 1431c, and 1431d, respectively, also have an effect of improving adhesiveness between the insulating layer 1455 and the antennas. In this embodiment mode, a polyimide film is used for the insulating layer 1455, a titanium film is used for each of the conductive layers 1457a, 1457b, 1457e, and 1457f, and an aluminum film is used for each of the antennas 1431a, 1431b, 1431c, and 1431d.

Openings (also referred to as contact holes) are formed in the insulating layer 1455 so that the first conductive layer 110d and the transistor 1441, the conductive layer 1457c and the wiring layer 1456a, and the conductive layer 1457e and the wiring layer 1456b are connected to each other. Since resistance is decreased as the contact area between conductive layers are increased by enlargement of the opening, the openings are set in this embodiment mode so that the opening for connecting the first conductive layer 110d to the transistor 1441 is the smallest, the opening for connecting the conductive layer 1457c to the wiring layer 4456a is followed, and the opening for connecting the conductive layer 1457e to the wiring layer 1456b is the largest. In this embodiment mode, the opening for connecting the first conductive layer 110d to the transistor 1441 is 5 μm×5 μm, the opening for connecting the conductive layer 1457c to the wiring layer 1456a is 50 μm×50 μm, and the opening for connecting the conductive layer 1457e to the wiring layer 1456b is 500 μm×500 μm.

In this embodiment mode, distance a from an insulating layer 1460a to the antenna 1431b is greater than or equal to 500 μm, distance b from the end portion of the second conductive layer 113 to the end portion of the insulating layer 1460a is greater than or equal to 250 μm, distance c from the end portion of the second conductive layer 113 to an end portion of an insulating layer 1460c is greater than or equal to 500 μm, and distance d from the end portion of the insulating layer 1460c to the antenna 1431c is greater than or equal to 250 μm. The insulating layer 1460c is formed partially in the circuit portion 1421; thus, one part of the transistor 1442 is covered with the insulating layer 1460c and the other part thereof is not covered with the insulating layer 1460c.

With the use of such a semiconductor device, a power supply voltage or a signal is directly input to the memory element portion 1404 from an external input portion so that data (corresponding to information) can be written to the memory element portion 1404 or read out from the memory element portion 1404.

Moreover, the antenna may be provided either so as to overlap the memory element portion or so as to surround the memory element portion without the memory element portion being overlapped. When the memory element portion overlaps, the antenna may overlap the memory element portion either entirely or partially. For example, a structure where an antenna portion and a memory element portion are overlapped each other can reduce a defective operation of a semiconductor device caused by noise superposed on a signal when communication is performed by the antenna, or fluctuation or the like of electromotive force generated by electromagnetic induction.

As a signal transmission system in the above semiconductor device capable of transmitting and receiving data in a non-contact manner, an electromagnetic coupling system, an electromagnetic induction system, a microwave system, or the like can be used. The transmission system can be appropriately selected in consideration of an intended use, and an optimum antenna may be provided in accordance with the transmission system.

FIGS. 17A to 17D each show an example of a chip-like semiconductor device including a conductive layer 1502 serving as an antenna and a memory element 1503 which are formed over a substrate 1501. Note that an integrated circuit or the like may be mounted on the semiconductor device in addition to the memory element.

When a microwave system (for example, an UHF band (a 860 to 960 MHz band), a 2.45 GHz band, or the like) is applied as the signal transmission system in the semiconductor device, the shape such as the length of the conductive layer serving as an antenna may be appropriately set in consideration of the wavelength of an electromagnetic wave used for signal transmission. For example, the conductive layer serving as an antenna can be formed in a linear shape (for example, a dipole antenna (see FIG. 17A)), a flat shape (for example, a patch antenna (see FIG. 17B)), a ribbon shape (see FIGS. 17C and 17D), or the like. The shape of the conductive layer serving as an antenna is not limited to the form of a line; however, the conductive layer serving as an antenna may also be provided in the form of a curve, a meander, or a combination of them, in consideration of the wavelength of the electromagnetic wave.

In addition, when an electromagnetic coupling system or an electromagnetic induction system (for example, a 13.56 MHz band) is applied as the signal transmission system in the semiconductor device, electromagnetic induction caused by change in magnetic field density is utilized; therefore, a conductive layer serving as an antenna is preferably formed in an annular shape (for example, a loop antenna) or a spiral shape (for example, a spiral antenna).

In addition, even when an electromagnetic coupling system or an electromagnetic induction system is applied and a semiconductor device having an antenna is provide in contact with metal, a magnetic material having magnetic permeability is preferably provided between the semiconductor device and the metal. When a semiconductor device having an antenna is provided in contact with metal, eddy current flows through the metal in accordance with change in magnetic field, and a demagnetizing field generated by the eddy current impairs the change in magnetic field to reduce the communication distance. Therefore, by a material having magnetic permeability being provided between the semiconductor device and the metal, eddy current of the metal can be suppressed; thus, reduction in communication distance can be suppressed. Note that ferrite or a metal thin film having high magnetic permeability and little loss of high frequency wave can be used as the magnetic material.

Moreover, when providing an antenna, a semiconductor element such as a transistor and a conductive layer serving as an antenna may be directly formed on one substrate, or alternatively, a semiconductor element and a conductive layer serving as an antenna may be separately provided over different substrates and then attached to be electrically connected to each other.

As described above, the memory element of the present invention is included in the semiconductor device described in this embodiment mode so that it is possible to suppress abnormal behavior such as breakdown of the conductive layer or the like and an insulating state of the memory element. Therefore, the range of reading voltages which are obtained is expanded, and flexibility in designing the semiconductor device is improved.

Moreover, data can be written in the semiconductor device not only once but also can be written additionally. On the other hand, since it is impossible to erase data of a memory element where writing is once performed, it is possible to prevent forgery by rewriting. In addition, data can be read out and written without contact. Further, since the memory element of the present invention has a simple structure where a semiconductor layer and an organic compound layer are interposed between a pair of conductive layers, it becomes possible to manufacture a memory element superior in terms of performance and reliability at a low cost.

Note that this embodiment mode can be freely combined with other embodiment modes and embodiments.

Embodiment 1

Figure 18:
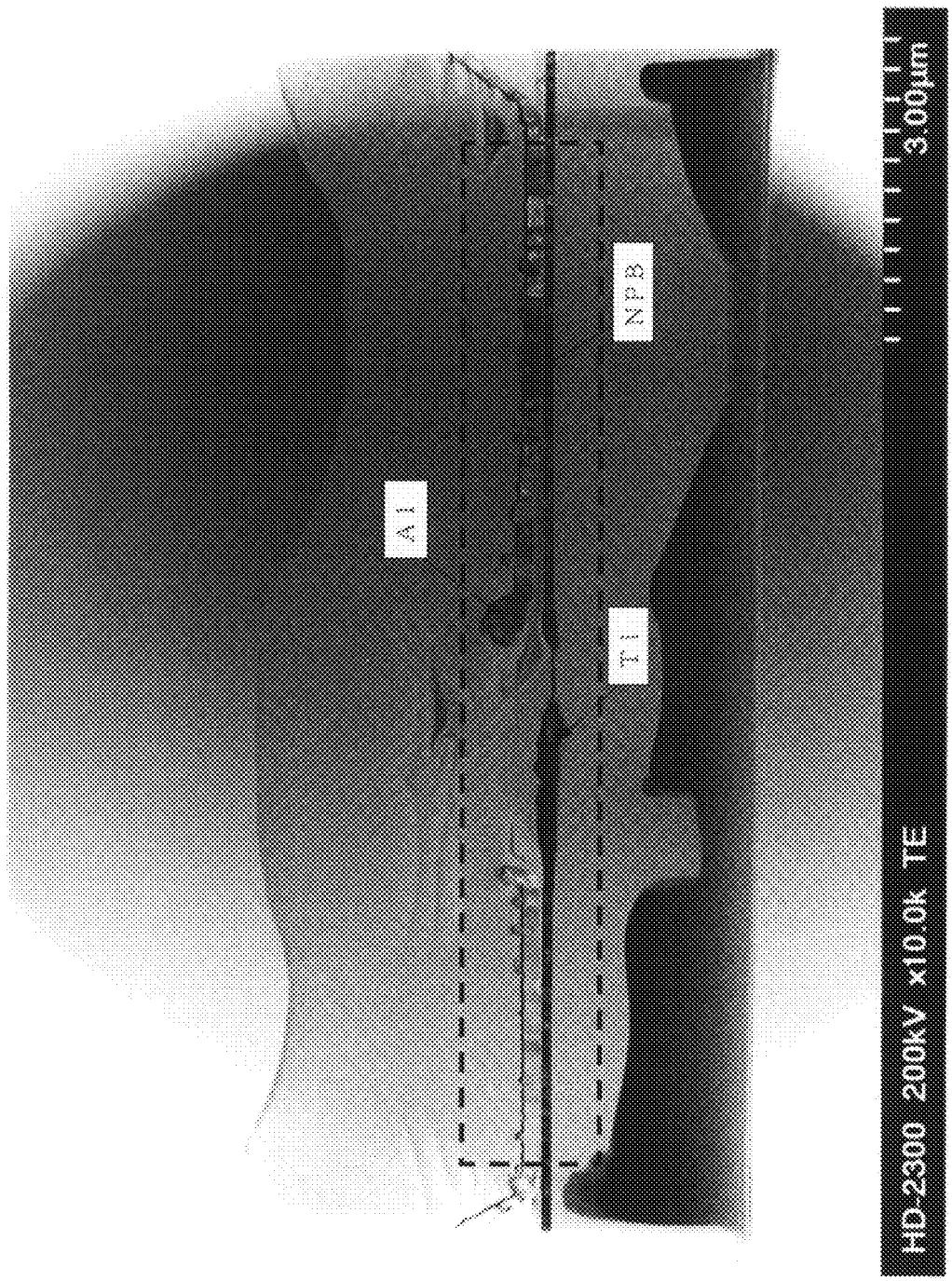
FIG. 18 is a TEM photograph after a writing voltage is applied to a memory element.

The inventors performed the following to pursue the cause of variations in behavior of each memory element. FIG. 18 shows a TEM photograph after a writing voltage is applied to a memory element which is formed of a stacked body of titanium of 100 nm thick, NPB of 10 nm thick, and aluminum of 200 nm thick.

As seen from FIG. 18, it is apparent that the aluminum is disconnected. Further, the deformation of the titanium was observed. This implies a case where there is influence even on titanium which has been generally recognized as a hard metal having a high melting point. Besides, there is also a case where the variations in behavior of each memory element are have influence also on a portion other than the memory element where a cavity is made.

Therefore, it can be considered that variations in behavior of each memory element are caused because of short circuit of an electrode due to breakdown of the electrode or the like or an insulating state of an element due to disconnection of an electrode or the like.

In addition, variations in behavior of each memory element were examined by difference in writing voltage. Note that the size of the memory elements which were used each 2 μm square, 3 μm square, 5 μm square, and 10 μm square, and the memory elements were each similar to the above memory element which was formed of a stacked body of titanium of 100 nm thick, NPB of 10 nm thick, and aluminum of 200 nm thick.

Figure 19:
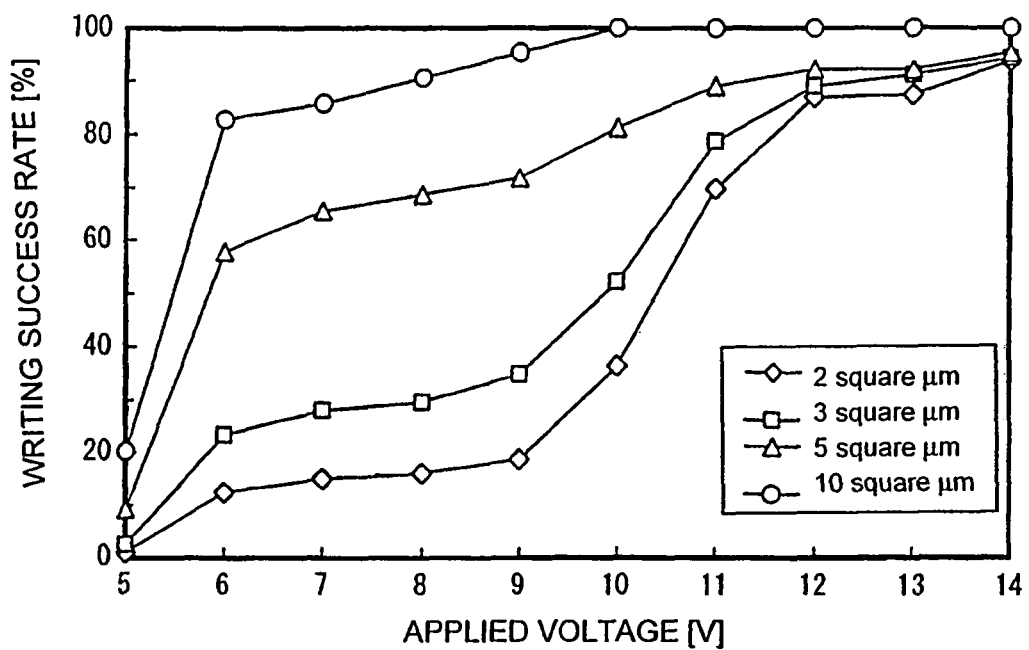
FIG. 19 is a graph showing a writing success rate of an applied voltage in memory elements with different element sizes.

FIG. 19 shows writing success rates with respect to applied voltages of each of the memory elements whose sizes are each 2 μm square, 3 μm square, 5 μm square, and 10 μm square. In the memory elements whose element sizes were each 2 μm square and 3 μm square, the sample numbers n were each to be 192 and, in the memory elements whose element sizes were each 5 μm square and 10 μm square, the sample numbers n were each to be 64. In addition, each voltage was to be applied for 10 m seconds.

As seen from FIG. 19, it was apparent that a writing success rate with respect to each applied voltage was reduced as the element size decreases, and further, the memory elements had variations in writing voltage. Thus, since variations in writing voltages become apparent along with reduction in element size, it is considered that breakdown of an electrode or the like and an insulating state of the memory elements are due to excess current caused by the local concentration of an electric field by a minute depression and projection on the surface of a conductive layer.

A structure capable of suppressing the local concentration of an electric field on the surface of a conductive layer is shown below along with a measurement result thereof.

In this embodiment, a memory element having a semiconductor layer being in contact with a first conductive layer is manufactured to explain current-voltage characteristics of a memory element which is a structural example of the present invention. Note that the memory element is an element where the first conductive layer, the semiconductor layer, an organic compound layer, and a second conductive layer are sequentially stacked over a substrate, and a manufacturing method thereof is explained with reference to FIG. 2A. In addition, the current-voltage characteristics were measured by the memory elements connected in series to a resistor of 500 kΩ by a sweep method for continuously changing the applied voltage.

First, titanium was formed over a substrate by a sputtering method to obtain a first conductive layer 110. Note that the film thickness was to be 100 nm.

Next, the substrate over which the first conductive layer 110 was formed was fixed to a substrate holder which was provided in a vacuum evaporation apparatus so that the surface over which the first conductive layer 110 was formed faces down. Then, a semiconductor layer 111 of 1 nm thick was formed over the first conductive layer 110 by an evaporation method using resistance heating.

Then, SFDCz was formed over the semiconductor layer 111 by an evaporation method using resistance heating so as to be 10 nm thick; therefore, an organic compound layer 112 was formed.

Further, aluminum was formed over the organic compound layer 112 by an evaporation method using resistance heating so as to be 200 nm thick; therefore, a second conductive layer 113 was formed.

Figure 20A:
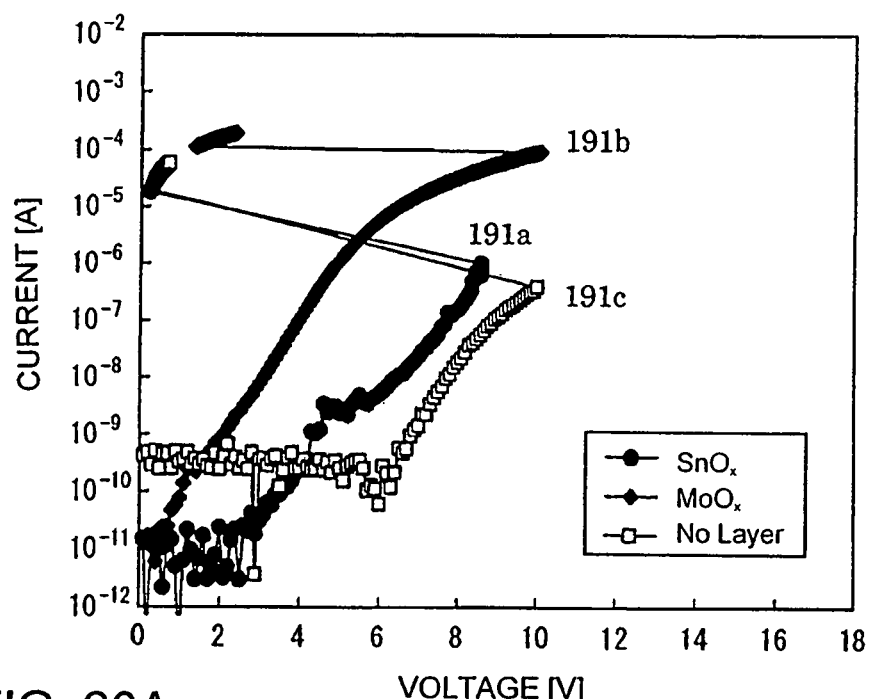
FIGS. 20A and 20B are graphs each showing current-voltage characteristics of a memory element of the present invention.
Figure 20B:
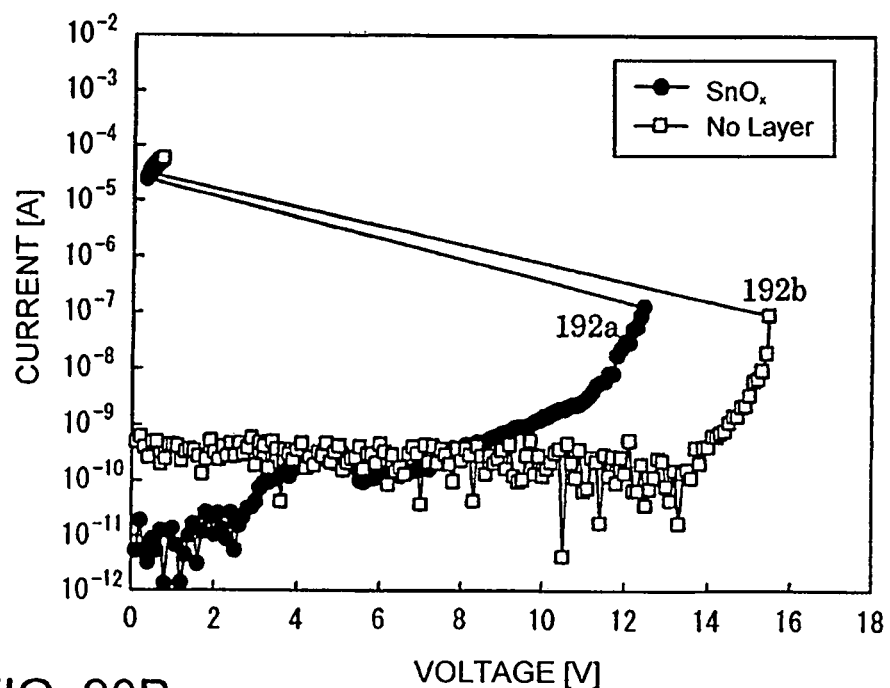

FIGS. 20A and 20B each show the current-voltage characteristics of the memory element which is obtained through the above manner. FIG. 20A shows a current-voltage characteristic in a memory element using tin oxide ($SnO_x$) or molybdenum oxide ($MoO_x$) for the semiconductor layer 111. Note that the element size was set at 10 μm square, and the memory element where tin oxide was used for a semiconductor layer and the memory element where molybdenum oxide was used for a semiconductor layer were to be denoted by reference numerals 191a and 191b, respectively. Moreover, results of a memory element 191c without a semiconductor layer 111 were also shown as a comparative example. Note that, except that a semiconductor layer 111 was not formed, the comparative example was manufactured with a material and a method similar to those of the memory elements in this embodiment.

As seen from FIG. 20A, it was apparent that current flowed more easily through the memory elements 191a and 191b, having the semiconductor layers being in contact with respective first conductive layers, than through the memory element 191c. It can be considered that this is because the local concentration of electric fields on the surfaces of the conductive layers is suppressed by the semiconductor layers being provided to be in contact with the respective first conductive layers.

In addition, FIG. 20B shows current-voltage characteristics of a memory element 192a, whose element size is 2 μm square, using tin oxide of 1 nm thick for the semiconductor layer 111. Note that other structures are similar to the above memory elements. In addition, a memory element 192b, whose element size was 2 μm square, without a semiconductor layer 111 was also shown as a comparative example. As seen from FIG. 20B, it was apparent that current flowed more easily through the memory element 192a having the semiconductor layer being in contact with a first conductive layer than through the memory element 192b without a semiconductor layer. Thus, it was apparent that, regardless of the element size, the local concentration of an electric field on the surface of the conductive layer could be suppressed by the semiconductor layer being provided between the first conductive layer and the organic compound layer.

Figure 21:
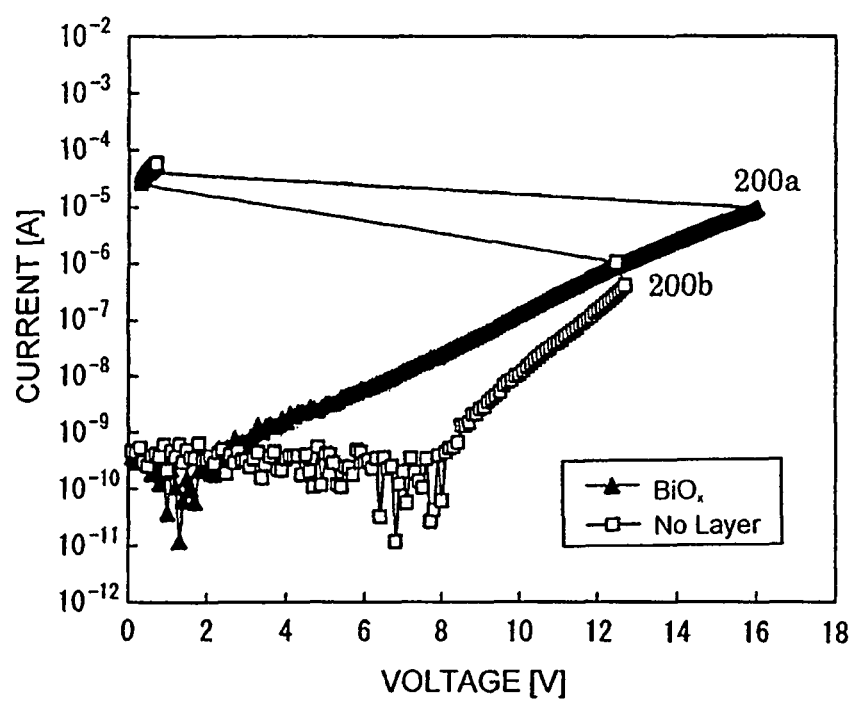
FIG. 21 is a graph showing current-voltage characteristics of a memory element of the present invention.

Further, other current-voltage characteristics were observed using a memory element of which semiconductor layer 111 and element size are different from those of the above memory elements. FIG. 21 shows current-voltage characteristics in a memory element 200a, whose element size is 5 μm square, using bismuth oxide ($BiO_x$) of 1 nm thick for the semiconductor layer 111. Note that results of a memory element 200b without a semiconductor layer 111 were also shown as a comparative example. As seen from FIG. 21, similarly to the above, it was apparent that current flowed more easily through the memory element 200a having the semiconductor layer than through the memory element 200b without a semiconductor layer. Thus, it was apparent that, regardless of the material of the semiconductor layer and the element size, the local concentration of an electric field on the surface of the conductive layer was suppressed by the semiconductor layer being provided to be in contact with the first conductive layer and a region through which current flows increases in the organic compound layer.

As described above, the local concentration of an electric field on the surface of the conductive layer can be suppressed by the semiconductor layer being provided to be in contact with the conductive layer, and a region through which current flows can be increased in the organic compound layer. Therefore, it is possible to suppress breakdown of the conductive layer or the like and an insulating state of the memory element due to excess current.

Therefore, it is possible to suppress abnormal behavior of the memory element and further to reduce variations in behavior of each memory element.

Embodiment 2

In this embodiment, a memory element having a semiconductor layer being in contact with a first conductive layer, which is different from that in Embodiment 1, was manufactured to explain current-voltage characteristics of a memory element which is a structural example of the present invention. Note that, in this embodiment, except that molybdenum oxide ($MoO_x$) of 0.1 nm thick was used for a semiconductor layer, the memory element was manufactured using a material and a method similar to those of the memory elements in Embodiment 1.

The memory element of this embodiment was an element where a first conductive layer, a semiconductor layer, an organic compound layer, and a second conductive layer were sequentially stacked over a substrate. Note that titanium of 100 nm thick, molybdenum oxide of 0.1 nm thick, SFDCz of 10 nm thick, and aluminum of 200 nm thick were used for the first conductive layer, the semiconductor layer, the organic compound layer, and the second conductive layer, respectively, and the element size was to be 10 μm square.

In addition, as a comparative example, a memory element without a semiconductor layer was also manufactured. Note that, except that a semiconductor layer was not provided, a material and a method similar to those of the memory element of this embodiment were used.

Figure 22A:
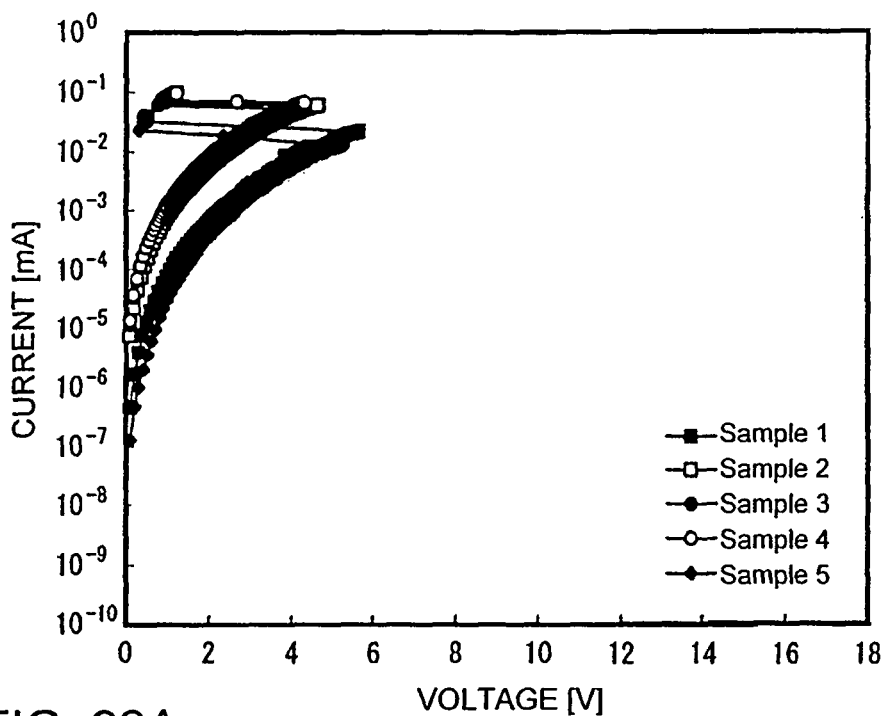
FIGS. 22A and 22B are graphs each showing current-voltage characteristics of a memory element of the present invention.
Figure 22B:
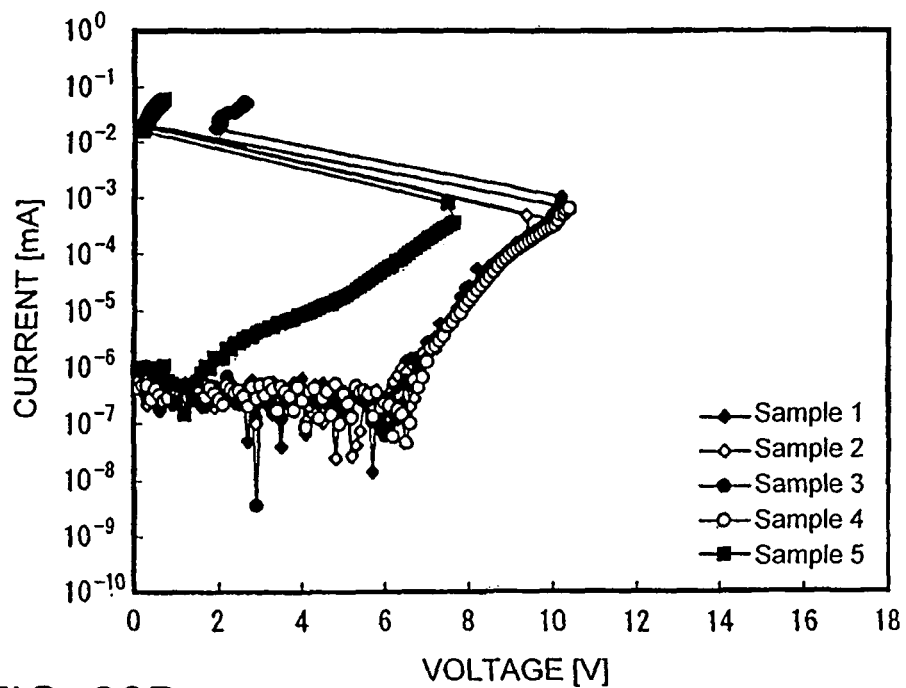

FIG. 22A shows the current-voltage characteristics of the memory element with the semiconductor layer, and FIG. 22B shows the current-voltage characteristics of the memory element without a semiconductor layer, each manufactured as described above. Note that, in the memory elements, the sample numbers n were each to be 5, and the current-voltage characteristics were each measured by the memory elements connected in series to a resistor of 500 kΩ by a sweep method. First, as seen from FIG. 22B, it was observed that there was great difference among writing voltages and variations in behavior of each memory element. In addition, even after the writing, there was an element with high resistance, which showed an abnormal behavior.

On the other hand, as seen from FIG. 22A, it is apparent that variations in behavior of each memory element are suppressed in the memory element with the semiconductor layer. In addition, as seen from FIGS. 22A and 22B, it was apparent that current easily flows because of a semiconductor layer being provided. Thus, it was apparent that the local concentration of an electric field on the surface of the conductive layer was suppressed by the semiconductor layer being provided to be in contact with the conductive layer and the amount of current that flowed through the organic compound layer increased. Therefore, it was possible to suppress breakdown of the conductive layer or the like and an insulating state of the memory element due to excess current and to reduce variations in behavior of each memory element by increase of the region through which current flowed in the organic compound layer.

As described above, the local concentration of an electric field on the surface of the conductive layer can be suppressed by the semiconductor layer, even one with a thickness as thin as 0.1 nm, being provided, and a region through which current flows can be increased in the organic compound layer. Thus, it is possible to suppress breakdown of the conductive layer or the like and an insulating state of the memory element due to excess current. Therefore, it is possible to suppress abnormal behavior of the memory element and, further, to reduce variations in behavior of each memory element.

Embodiment 3

This embodiment explains a memory element using a material different from that in Embodiments 1 and 2 for an organic compound layer.

The memory element of this embodiment was an element where a first conductive layer, a semiconductor layer, an organic compound layer, and a second conductive layer were sequentially stacked over a substrate. Titanium of 100 nm thick, tin oxide of 1.0 nm thick, NPB of 30 nm thick, and aluminum of 200 nm thick were used for the first conductive layer, the semiconductor layer, the organic compound layer, and the second conductive layer, respectively. Note that each element size is 10 µm square.

In addition, as a comparative example, a memory element without a semiconductor layer was also manufactured. Note that, except that a semiconductor layer was not provided, a material and a method similar to those of the memory element of this embodiment were used.

Figure 23A:
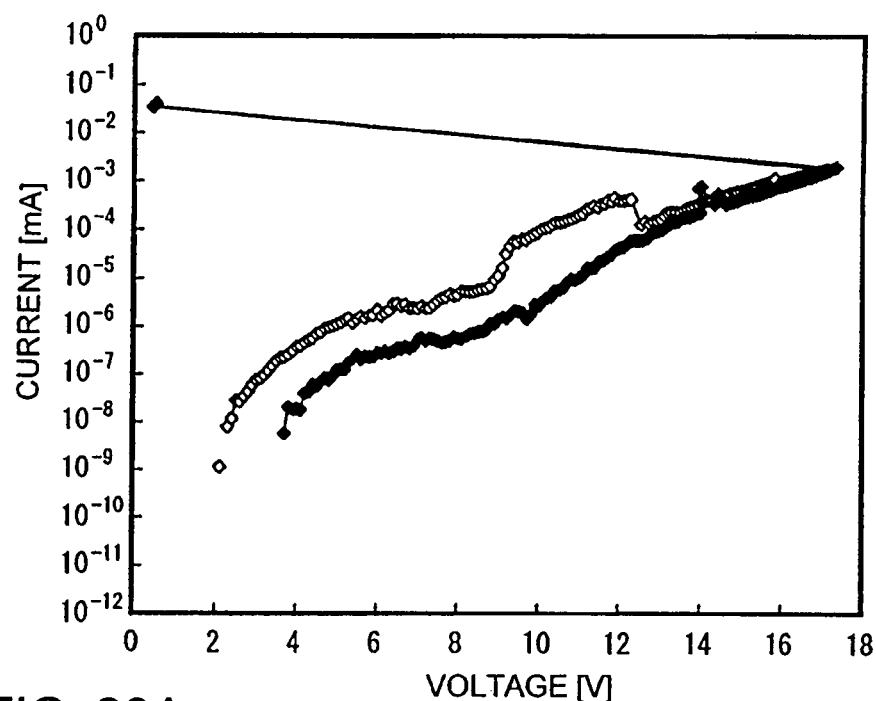
FIGS. 23A and 23B are graphs each showing current-voltage characteristics of a memory element of the present invention.
Figure 23B:
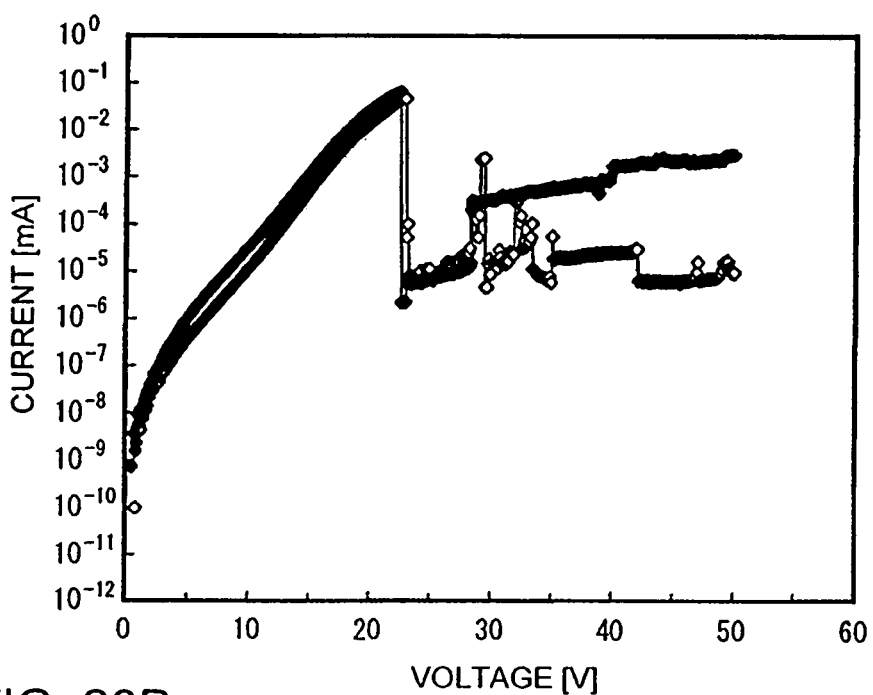

FIG. 23A shows the current-voltage characteristics of the memory element with the semiconductor layer, and FIG. 23B shows the current-voltage characteristics of the memory element without a semiconductor layer, each manufactured as described above. Note that, in the memory elements, the sample numbers n were each to be 2, and the current-voltage characteristics were each measured by the memory elements connected in series to a resistor of 500 kΩ by a sweep method. As seen from FIG. 23B, in the memory element without a semiconductor layer, short did not occur even when voltage was continuously applied, and the amount of current suddenly decreased when voltage was applied up to 23 V. It can be considered that this is because the element is in an insulating state. In addition to a phenomenon where there are variations in behavior, as shown in Embodiment 1 or 2, due to the material used for the organic compound layer, there is a possibility that a memory element is in an insulating state like NPB. In either case, it is difficult to use the memory element without a semiconductor layer as a memory element.

On the other hand, as seen from FIG. 23A, the memory element with the semiconductor layer could be shorted at the time of a certain voltage without being in an insulating state. In addition, variations in behavior of each memory element were not observed. Thus, the local concentration of an electric field on the surface of the conductive layer could be suppressed by the semiconductor layer being provided to be in contact with the first conductive layer. Therefore, since a region through which current flows can be increased in the organic compound layer, it is possible to suppress breakdown of the conductive layer or the like and an insulating state of the memory element due to excess current.

As described above, it is possible to suppress abnormal behavior of the memory element and, further, to reduce variations in behavior of each memory element.

Moreover, an organic compound layer different from the above was used to observe current-voltage characteristics thereof. Note that Alq of 30 nm thick and molybdenum oxide of 1.0 nm thick were used for the organic compound layer and a semiconductor layer, respectively. A material and a method similar to those of the above memory elements of this embodiment are used, and each element size is 10 µm square.

Figure 24:
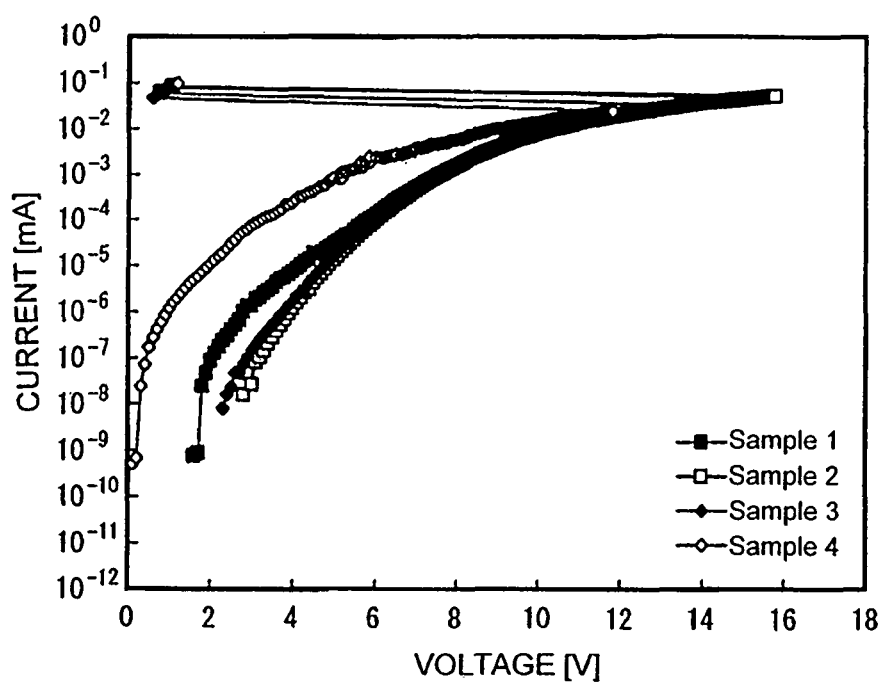
FIG. 24 is a graph showing current-voltage characteristics of a memory element of the present invention.

FIG. 24 shows the current-voltage characteristics of the obtained memory element. Note that the sample number n was to be 4 and a sweep method was employed. As seen from FIG. 24, the memory element was not in an insulating state and, further, variations in behavior were not observed.

As described above, even with the use of a different organic compound layer, the local concentration of an electric field could be suppressed by the semiconductor layer being provided to be in contact with the conductive layer. Thus, since a region through which current flows can be increased in the organic compound layer, it is possible to suppress breakdown of the conductive layer or the like and an insulating state of the memory element due to excess current. Therefore, it is possible to suppress abnormal behavior of the memory element and, further, to reduce variations in behavior of each memory element due to the memory element being provided in the memory element.

Embodiment 4

In this embodiment, writing voltages of each memory element were investigated. First, the memory element manufactured to be used in this embodiment was an element where a first conductive layer, a semiconductor layer, an organic compound layer, and a second conductive layer were sequentially stacked over a substrate. Note that titanium of 100 nm thick, tin oxide of 1.0 nm thick, SFDCz of 10 nm thick, and aluminum of 200 nm thick were used for the first conductive layer, the semiconductor layer, the organic compound layer, and the second conductive layer, respectively. The element size was to be 10 µm square, and, as a comparative example, also a memory element without a semiconductor layer was manufactured. As for a manufacturing method thereof, except that a semiconductor layer was not provided, a material and a method similar to those of the memory element of this embodiment were used.

Figure 25A:
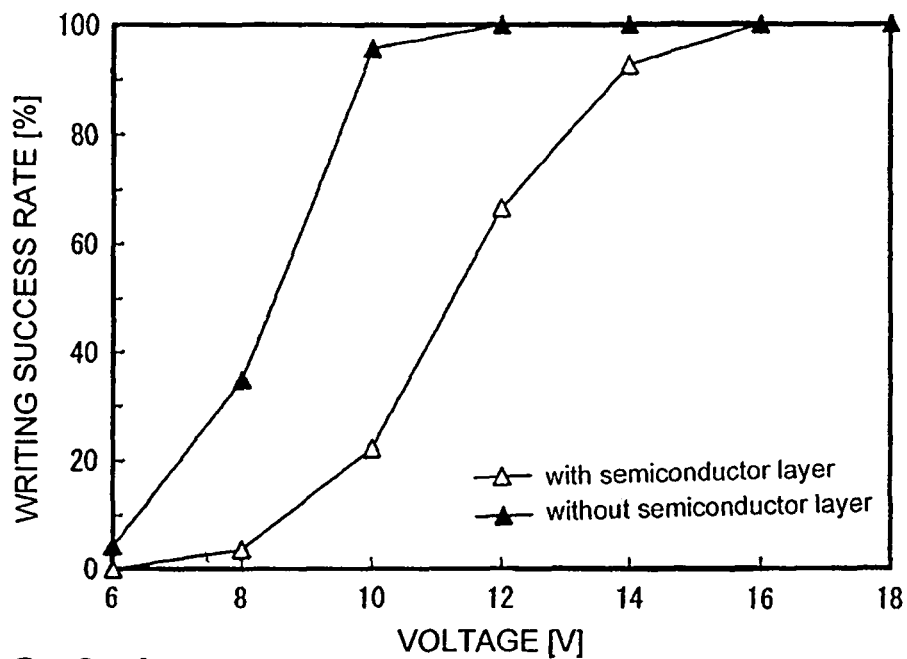
FIGS. 25A and 25B are graphs each showing a writing success rate of an applied voltage of a memory element of the present invention.
Figure 25B:
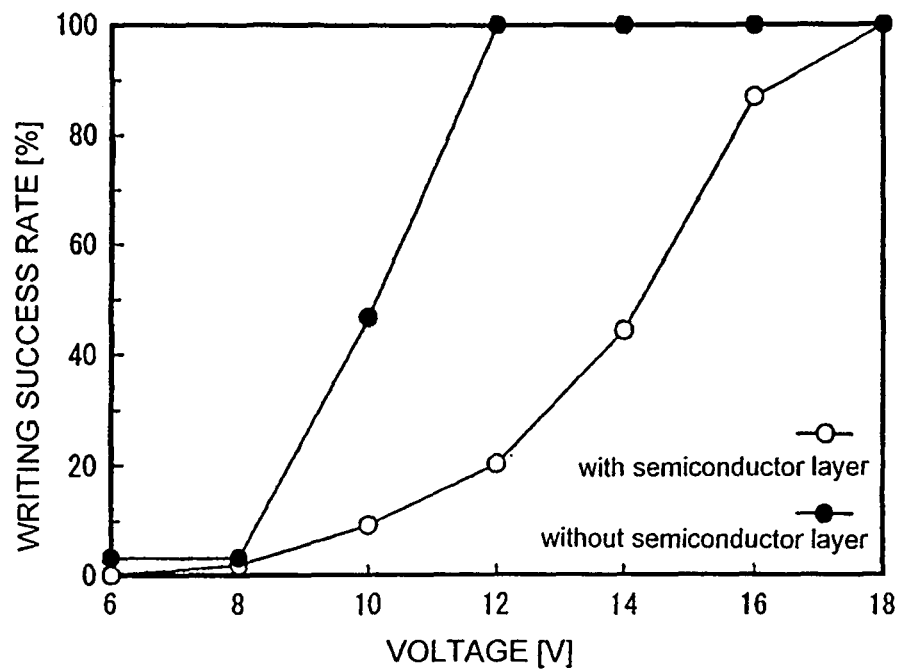

FIG. 25A shows writing success rates with respect to applied voltages in each memory element manufactured as described above. In addition, memory elements whose element sizes are each 5 µm square were also manufactured in a similar manner and writing success rates with respect to applied voltages in each memory element are shown in FIG. 25B. Note that each voltage was to be applied for 10 m seconds. In the memory elements whose sizes are each 10 µm square, the sample number n of the memory element with the semiconductor layer was to be 23 and the sample number n of a memory element without a semiconductor layer was to be 27. In the memory elements whose sizes were each 5 µm square, the sample number n of a memory element with a semiconductor layer was to be 62 and the sample number n of a memory element without a semiconductor layer was to be 54.

As seen from FIGS. 25A and 25B, in either case, writing success rates in the memory element with the semiconductor layer with respect to applied voltages showed sharper rising as compared with the memory element without a semiconductor layer. Thus, it was apparent that variations in behavior of each element were reduced in the memory element having the semiconductor layer.

Figure 26A:
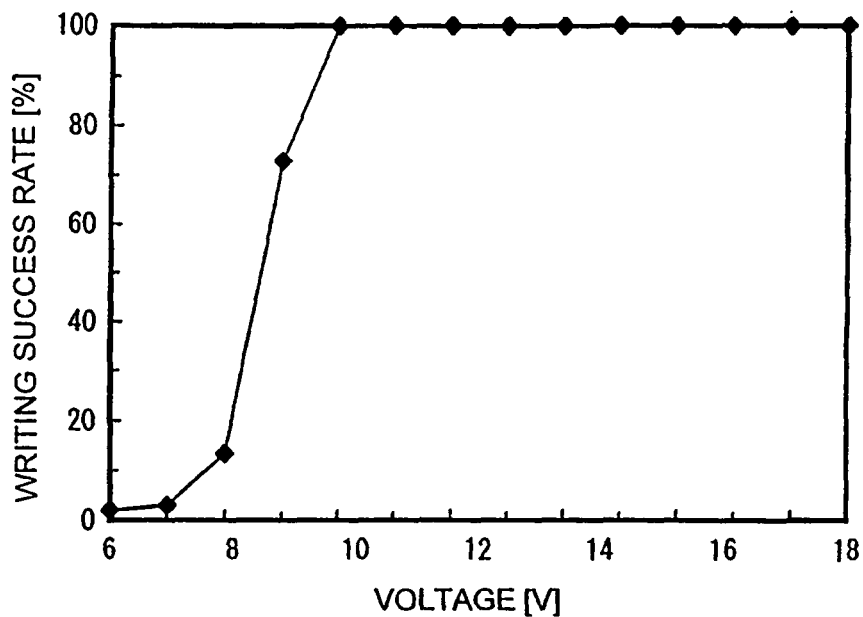
FIGS. 26A and 26B are graphs each showing a writing success rate of an applied voltage of a memory element of the present invention.
Figure 26B:
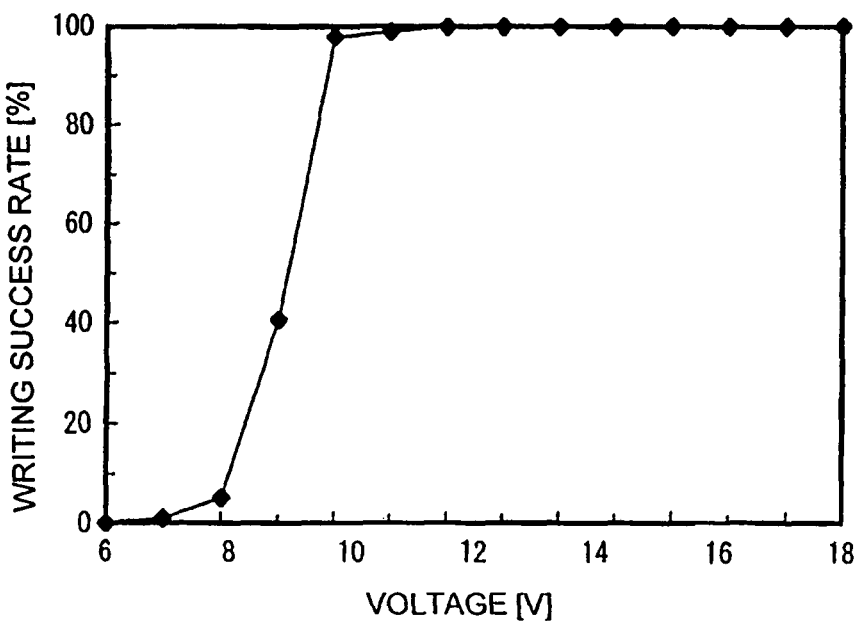

A semiconductor device where each of such memory elements was further connected to a TFT was manufactured to investigate writing success rates with respect to applied voltages in a manner similar to the above. FIG. 26A shows measurement results of memory elements whose sizes are each 10 µm square, and FIG. 26B shows measurement results of memory elements whose sizes are each 5 µm square. Note that the structures of the memory elements were similar to the above except that respective TFTs were connected to the memory elements, and each voltage applied to the memory element was to be 10 m seconds.

As seen from FIGS. 26A and 26B, it was apparent that, in any of the element sizes, writing success rates with respect to writing voltages each showed sharp rising and variations in behavior were little. Therefore, the range of reading voltages which are obtained is expanded, and flexibility in designing the semiconductor device having the memory element can be improved.

Embodiment 5

In this embodiment, writing voltages of each memory element were investigated. The memory element manufactured to be used in this embodiment was an element where a first conductive layer, a semiconductor layer, an organic compound layer, and a second conductive layer were sequentially stacked over a substrate, and four kinds of elements, where each semiconductor layer was different in thickness, were used. Note that titanium of 100 nm thick, tin oxide different in thickness, SFDCz of 10 nm thick, and aluminum of 200 nm thick were used for the first conductive layers, the semiconductor layers, the organic compound layers, and the second conductive layers, respectively. Each element size was to be 10 µm square, and the thickness of the semiconductor layers were each 0.2 nm, 1 nm, 3 nm, and 5 nm.

Figure 27A:
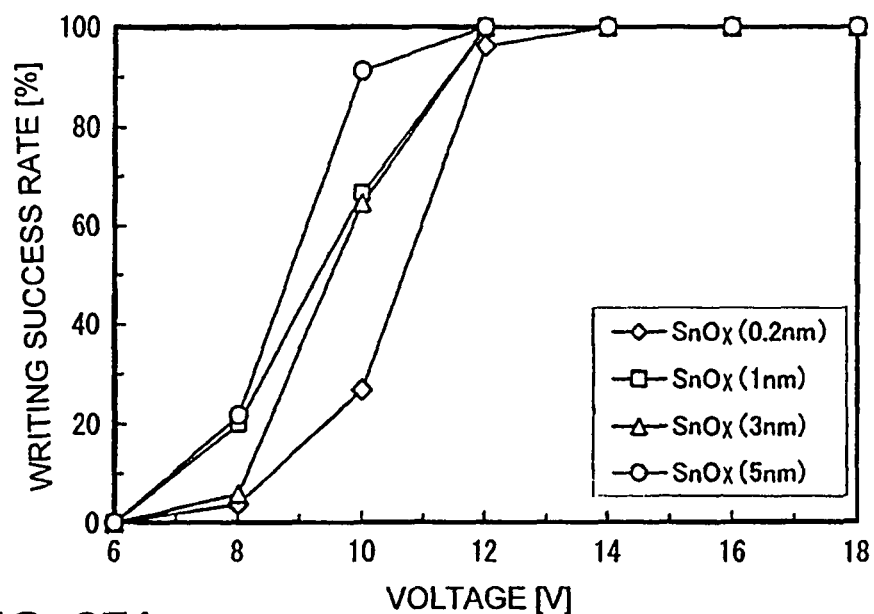
FIGS. 27A and 27B are graphs each showing a writing success rate of an applied voltage of a memory element of the present invention.
Figure 27B:
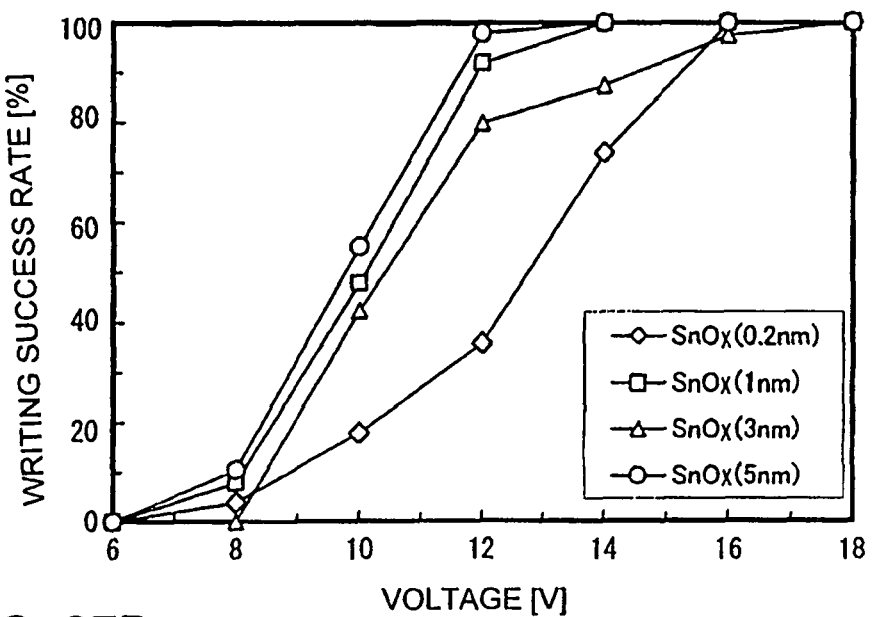

FIG. 27A shows writing success rates with respect to applied voltages in each memory element manufactured as described above. The sample number n of the memory element where the semiconductor layer was 0.2 nm thick was to be 26, the sample number n of the memory element where the semiconductor layer was 1 nm thick was to be 15, the sample number n of the memory element where the semiconductor layer was 3 nm thick was to be 17, and the sample number n of the memory element where the semiconductor layer was 5 nm thick was to be 23. In addition, memory elements whose element sizes were each 5 µm square were also manufactured in a similar manner. The writing success rates with respect to applied voltages in each obtained memory element are shown in FIG. 27B. In the memory elements whose sizes were each 5 µm square, the sample number n of a memory element where a semiconductor layer was 0.2 nm thick was to be 50, the sample number n of a memory element where a semiconductor layer was 1 nm thick was to be 25, the sample number n of a memory element where a semiconductor layer was 3 nm thick was to be 40, and the sample number n of a memory element where a semiconductor layer was 5 nm thick was to be 47. Note that each voltage was to be applied for 10 m seconds.

As seen from FIGS. 27A and 27B, it was apparent that, even in either element size or thickness of the semiconductor layer, writing success rates with respect to applied voltages each showed sharp rising and variations in behavior were little. In addition, no large difference was found in writing voltages even when the semiconductor layer was made thick.

As described above, it was apparent that variations in behavior of each element were reduced due to the semiconductor layer of the memory element of the present invention, and the thickness of the semiconductor layer did not have a large effect on writing voltages.

Embodiment 6

This embodiment explains a memory element where an organic compound layer is different from those in Embodiments 1 to 5. The memory element was an element where a first conductive layer, a semiconductor layer, an organic compound layer having an insulator, and a second conductive layer are sequentially stacked over a substrate, and a manufacturing method thereof is explained with reference to FIG. 2A. Note that the element size was to be 10 µm square.

First, titanium was formed using a sputtering method over a substrate to obtain a first conductive layer 110. Note that the thickness was to be 100 nm.

Next, the substrate over which the first conductive layer 110 was formed was fixed to a substrate holder which was provided in a vacuum evaporation apparatus so that the surface over which the first conductive layer 110 was formed faced down. Then, tin oxide was formed on the first conductive layer 110 in 1 nm thick as a semiconductor layer 111 with the use of an evaporation method using resistance heating.

Next, NPB and calcium fluoride were formed on the semiconductor layer 111 to be 20 nm thick as an organic compound layer 112 with the use of a co-evaporation method using resistance heating. Note that the volume ratio of NPB and calcium fluoride in the organic compound layer was to be 1:1.

Further, aluminum was formed on the organic compound layer 112 to be 200 nm thick as a second conductive layer 113 with the use of an evaporation method using resistance heating.

Figure 28:
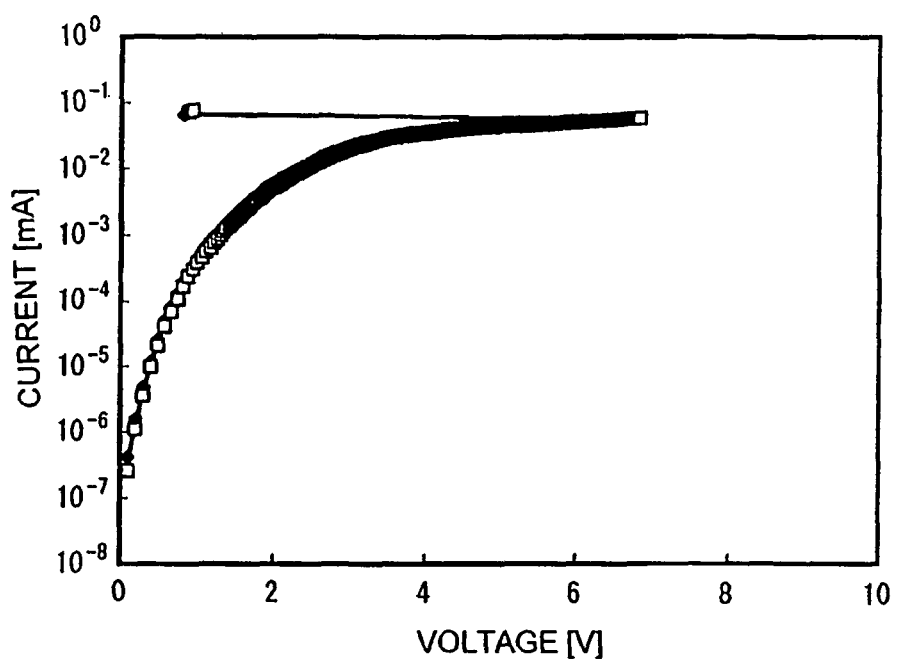
FIG. 28 is a graph showing current-voltage characteristics of a memory element of the present invention.

FIG. 28 shows the current-voltage characteristics of the memory element which is obtained as described above. Note that, in the memory element, the sample number n was to be 2, and the current-voltage characteristics were measured by the memory elements connected in series to a resistor of 500 kΩ by a sweep method. As seen from FIG. 28, it is apparent that there is almost no variation in current-voltage characteristics. Thus, variations in behavior of each memory element can be reduced by the semiconductor layer being provided, even with the use of the organic compound layer having an insulator.

Embodiment 7

Figure 29A:
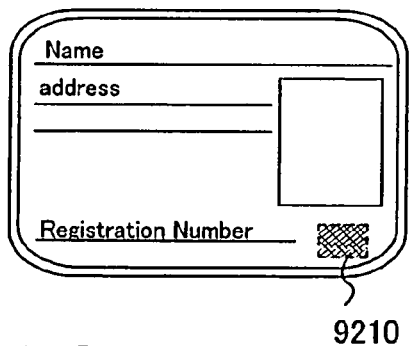
FIGS. 29A to 29F are views each explaining an article on which a semiconductor device of the present invention is mounted.
Figure 29B:
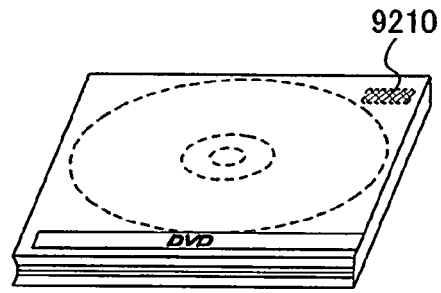
Figure 29C:
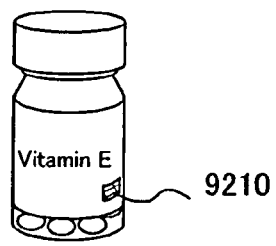
Figure 29D:
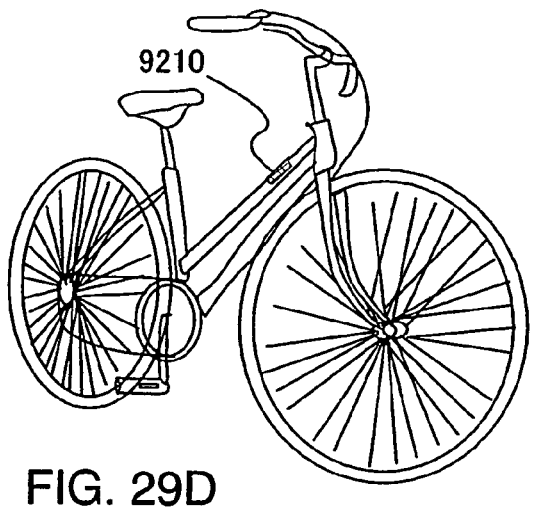
Figure 29E:
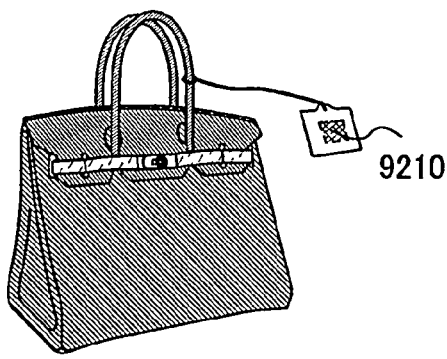
Figure 29F:
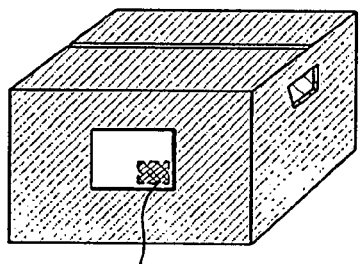

According to the present invention, a semiconductor device serving as a wireless chip can be formed. Although a wireless chip can be used broadly, it may be used by being mounted in products such as, bills, coins, securities, bearer bonds, certificates (driver's licenses, resident cards, or the like, see FIG. 29A), containers for wrapping objects (wrapping paper, bottles, or the like, see FIG. 29C), recording media (DVDs, video tapes, or the like, see FIG. 29B), vehicles (bicycles or the like, see FIG. 29D), products such as personal belongings (bags, glasses, or the like), foods, plants, animals, clothes, livingware, or electronic devices, or objects such as shipping tags of baggage (see FIGS. 29E and 29F). The electronic device indicates a liquid crystal display device, an EL display device, a television device (also simply referred to as a TV, a TV receiver, or a television receiver), a cellular phone, and the like.

A semiconductor device 9210 of the present invention, having a memory element of the present invention, is mounted on a printed substrate, attached to a surface, or incorporated to be fixed in an object. For example, the semiconductor device is incorporated in paper of a book or an organic resin of a package to be fixed in each object. As for the semiconductor device 9210 of the present invention, a small size, a thin shape, and lightweight are achieved and an attractive design of the object itself is not damaged even after being fixed in the object. In addition, by the semiconductor device 9210 of the present invention being provided in bills, coins, securities, bearer bonds, certificates, or the like, a certification function can be obtained and forgery thereof can be prevented by the use of the certification function being made. Further, by the semiconductor device 9210 of the present invention being provided in containers for wrapping objects, recording media, personal belongings, foods, clothes, livingware, electronic devices, or the like, a system such as an inspection system can be performed efficiently.

Figure 30:
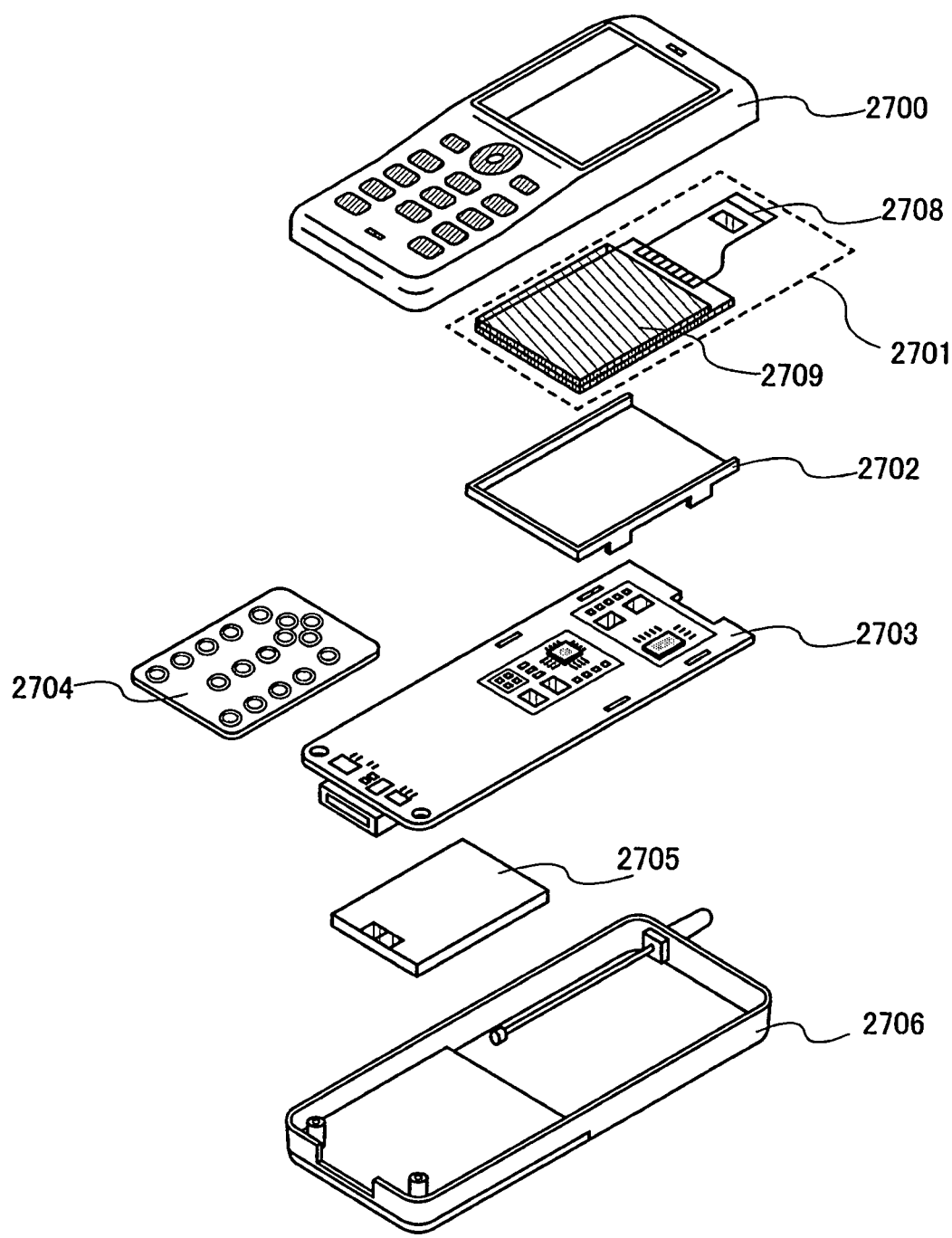
FIG. 30 is a view explaining a cellular phone on which a semiconductor device of the present invention is mounted.

Next, one mode of the electronic devices on which the semiconductor device of the present invention is mounted will be explained with reference to FIG. 30. The electronic device exemplified here is a cellular phone, which includes chassis 2700 and 2706, a panel 2701, a housing 2702, a printed wiring board 2703, operation buttons 2704, and a battery 2705. The panel 2701 is incorporated in the housing 2702 to be detachable, and the housing 2702 is fitted to the printed wiring board 2703. As for the housing 2702, a shape and a size thereof are appropriately changed depending on an electronic device in which the panel 2701 is incorporated. A plurality of semiconductor devices which are packaged are mounted on the printed wiring board 2703, and as one of the semiconductor devices, the semiconductor device having the memory element of the present invention can be used. A plurality of semiconductor devices mounted on the printed wiring board 2703 have any function of a controller, a central processing unit (CPU), a memory, a power supply circuit, an audio processing circuit, a transmitter/receiver circuit, and the like.

The panel 2701 is connected to the printed wiring board 2703 through a connection film 2708. The panel 2701, the housing 2702, and the printed wiring board 2703 are stored in the chassis 2700 and 2706 with the operation buttons 2704 and the battery 2705. A pixel region 2709 included in the panel 2701 is disposed so as to be visually recognized by an opening window provided in the chassis 2700.

As described above, the semiconductor device of the present invention has features of a small size, a thin shape, and lightweight. According to these features, limited space inside the chassis 2700 and 2706 of the electronic device can be used efficiently. Note that the chassis 2700 and 2706 are shown as one example of an appearance shape of a cellular phone, and the electronic device according to this embodiment can be changed to various modes in accordance with a function or an application thereof.

Note that the memory element of the present invention has a first conductive layer, a semiconductor layer, an organic compound layer, and a second conductive layer. The semiconductor layer and the organic compound layer are interposed between the first conductive layer and the second conductive layer, and the semiconductor layer is formed over and in contact with the first conductive layer. Such a memory element is included so that it is possible to suppress abnormal behavior such as breakdown of the conductive layer or the like and an insulating state of the memory element. Thus, it becomes possible to reduce variations in behavior of each memory element. Therefore, the range of reading voltages which are obtained is expanded, and flexibility in designing the semiconductor device is improved.

Moreover, data can be written in the semiconductor device not only once but also can be written additionally. On the other hand, since it is impossible to erase data of a memory element where writing is once performed, it is possible to prevent forgery by rewriting. Further, since the memory element of the present invention has a simple structure where a semiconductor layer and an organic compound layer are interposed between a pair of conductive layers, it becomes possible to manufacture a memory element superior in terms of performance and reliability at a low cost.

Note that this embodiment mode can be freely combined with the embodiment modes and other embodiments.

The present application is based on Japanese Patent Application serial No. 2006-066527 filed on Mar. 10, 2006 in Japanese Patent Office, the entire contents of which are hereby incorporated by reference.

The invention claimed is:

1. A semiconductor device comprising a memory element, the memory element comprising:
    a first conductive layer;
    a first semiconductor layer formed over the first conductive layer;
    an organic compound layer over and being in direct contact with the first semiconductor layer, the organic compound layer being a single layer;
    a second semiconductor layer over and being in direct contact with the organic compound layer; and
    a second conductive layer formed over the second semiconductor layer,
    wherein the organic compound layer comprises an electron-transporting material or a hole-transporting material, and
    wherein each of the first semiconductor layer and the second semiconductor layer comprises an inorganic semiconductor selected from molybdenum oxide, tin oxide, bismuth oxide, silicon, vanadium oxide, nickel oxide, zinc oxide, silicon germanium, gallium arsenide, gallium nitride, indium oxide, indium phosphide, indium nitride, cadmium sulfide, cadmium telluride, and strontium titanate.

2. The semiconductor device according to claim 1, wherein at least one of the first semiconductor layer and the second semiconductor layer is a discontinuous layer.

3. The semiconductor device according to claim 1, wherein the memory element is arranged to change a distance between the first conductive layer and the second conductive layer when a voltage is applied between the first conductive layer and the second conductive layer.

4. The semiconductor device according to claim 1,
    wherein the memory element is arranged to change a distance between the first conductive layer and the second conductive layer when a voltage is applied between the first conductive layer and the second conductive layer, and
    wherein the change in distance between the first conductive layer and the second conductive layer allows a part of the first conductive layer and a part of the second conductive layer to be brought in direct contact with each other.

5. The semiconductor device according to claim 1, wherein the first conductive layer and the second conductive layer comprise a material selected from titanium, gold, platinum, nickel, tungsten, chromium, molybdenum, iron, cobalt, copper, and palladium.

6. The semiconductor device according to claim 1, wherein the organic compound layer comprises an aromatic amine, a phthalocyanine compound, a metal complex having a quinoline skeleton or a benzoquinoline skeleton, a metal complex having an oxazole ligand or a thiazole ligand, 2-(4-biphenylyl)-5-(4-tert-butylphenyl)-1,3,4-oxadiazole, 1,3-bis[5-(p- tert-butylphenyl)-1,3,4-oxadiazole-2-yl]]benzene, 3-(4-tert-butylphenyl)-4-phenyl-5-(4-biphenylyl)-1,2,4-triazole, 3-(4-tert-butylphenyl)-4-(4-ethylphenyl)-5-(4-biphenylyl)-1,2,4-triazole, bathophenanthroline, bathocuproin, or 2,3-bis(4-diphenylaminophenyl)quinoxaline.

7. The semiconductor device according to claim 1, further comprising an antenna which is electrically connected to the memory element.

8. The semiconductor device according to claim 1, wherein the memory element is formed over a flexible substrate.

9. The semiconductor device according to claim 1, wherein the first semiconductor layer is in direct contact with a top surface of the first conductive layer.

10. The semiconductor device according to claim 1, wherein the second conductive layer is in direct contact with the second semiconductor layer.

11. The semiconductor device according to claim 1, wherein the organic compound layer contains an insulator.

12. A semiconductor device comprising:
a plurality of memory elements arranged in matrix, each of which comprising:
a first conductive layer;
a first semiconductor layer formed over the first conductive layer;
an organic compound layer over and being in direct contact with the first semiconductor layer, the organic compound layer being a single layer;
a second semiconductor layer over and being in direct contact with the organic compound layer; and
a second conductive layer formed over the second semiconductor layer,
wherein the organic compound layer comprises an electron-transporting material or a hole-transporting material, and
wherein each of the first semiconductor layer and the second semiconductor layer comprises an inorganic semiconductor selected from molybdenum oxide, tin oxide, bismuth oxide, silicon, vanadium oxide, nickel oxide, zinc oxide, silicon germanium, gallium arsenide, gallium nitride, indium oxide, indium phosphide, indium nitride, cadmium sulfide, cadmium telluride, and strontium titanate.

13. A semiconductor device according to claim 12, further comprising a plurality of thin film transistors, each of which is electrically connected to corresponding one of the plurality of memory elements.

14. A semiconductor device according to claim 12, wherein the semiconductor device is provided over a flexible substrate.

15. A semiconductor device according to claim 12, further comprising an antenna,
wherein the antenna is electrically connected to the plurality of memory elements.

16. A semiconductor device according to claim 12, wherein at least one of the first semiconductor layer and the second semiconductor layer is a discontinuous layer.

17. A semiconductor device according to claim 12, wherein the plurality of memory elements are arranged to change a distance between the first conductive layer and the second conductive layer when a voltage is applied between the first conductive layer and the second conductive layer.

18. A semiconductor device according to claim 12,
wherein the plurality of memory elements are arranged to change a distance between the first conductive layer and the second conductive layer when a voltage is applied between the first conductive layer and the second conductive layer, and
wherein the change in distance between the first conductive layer and the second conductive layer allows a part of the first conductive layer and a part of the second conductive layer to be brought in direct contact with each other.

19. A semiconductor device according to claim 12, wherein the first conductive layer and the second conductive layer comprise a material selected from titanium, gold, platinum, nickel, tungsten, chromium, molybdenum, iron, cobalt, copper, and palladium.

20. A semiconductor device according to claim 12, wherein the organic compound layer comprises an aromatic amine, a phthalocyanine compound, a metal complex having a quinoline skeleton or a benzoquinoline skeleton, a metal complex having an oxazole ligand or a thiazole ligand,
2-(4-biphenylyl)-5-(4-tert-butylphenyl)-1,3,4-oxadiazole, 1,3-bis[5-(p-tert-butylphenyl)-1,3,4-oxadiazole-2-yl]]benzene, 3-(4-tert-butylphenyl)-4-phenyl-5-(4-biphenylyl)-1,2,4-triazole, 3-(4-tert-butylphenyl)-4-(4-ethylphenyl)-5-(4-biphenylyl)-1,2,4-triazole, bathophenanthroline, bathocuproin, or 2,3-bis(4-diphenylaminophenyl)quinoxaline.

21. A semiconductor device according to claim 12, wherein the first semiconductor layer is in direct contact with a top surface of the first conductive layer.

22. A semiconductor device according to claim 12, wherein the second conductive layer is in direct contact with the second semiconductor layer.

23. A semiconductor device according to claim 12, wherein the organic compound layer contains an insulator.

\* \* \* \* \*

UNITED STATES PATENT AND TRADEMARK OFFICE
CERTIFICATE OF CORRECTION

| | | |
|---|---|---|
| PATENT NO. | : 8,421,061 B2 | Page 1 of 1 |
| APPLICATION NO. | : 11/713751 | |
| DATED | : April 16, 2013 | |
| INVENTOR(S) | : Yukawa et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 846 days.

Signed and Sealed this
Second Day of December, 2014

Michelle K. Lee
*Deputy Director of the United States Patent and Trademark Office*